US011139558B2

(12) United States Patent
Cho et al.

(10) Patent No.: US 11,139,558 B2
(45) Date of Patent: Oct. 5, 2021

(54) ANTENNA MODULE AND ELECTRONIC DEVICE USING THE SAME

(71) Applicant: Samsung Electronics Co., Ltd., Gyeonggi-do (KR)

(72) Inventors: Namjun Cho, Gyeonggi-do (KR); Hyoseok Na, Gyeonggi-do (KR); Yousung Lee, Gyeonggi-do (KR)

(73) Assignee: Samsung Electronics Co., Ltd

( * ) Notice: Subject to any disclaimer, the term of this patent is extended or adjusted under 35 U.S.C. 154(b) by 0 days.

(21) Appl. No.: 17/129,186

(22) Filed: Dec. 21, 2020

(65) Prior Publication Data
US 2021/0203060 A1    Jul. 1, 2021

(30) Foreign Application Priority Data

Dec. 26, 2019  (KR) .......................... 10-2019-0175616

(51) Int. Cl.
*H01Q 1/24* (2006.01)
*H03F 3/19* (2006.01)
(Continued)

(52) U.S. Cl.
CPC ........... *H01Q 1/243* (2013.01); *H01Q 1/2283* (2013.01); *H01Q 21/065* (2013.01); *H03F 3/195* (2013.01);
(Continued)

(58) Field of Classification Search
None
See application file for complete search history.

(56) References Cited

U.S. PATENT DOCUMENTS 7,013,166 B2 * 3/2006 Clifford ............... H04B 7/0491
                                                          342/433
9,172,402 B2 * 10/2015 Gudem ............... H04B 1/0064
(Continued)

FOREIGN PATENT DOCUMENTS

CN          208353332 U  *  1/2019
KR        1020190017138        2/2019
(Continued)

OTHER PUBLICATIONS

International Search Report dated Apr. 26, 2021 issued in counterpart application No. PCT/KR2020/019085, 7 pages.
(Continued)

*Primary Examiner* — Pablo N Tran
(74) *Attorney, Agent, or Firm* — The Farrell Law Firm, P.C.

(57) ABSTRACT

A portable communication device includes a processor positioned in a first printed circuit board; a communication circuit; and an antenna module. The antenna module includes a second printed circuit board; a first antenna and a second antenna positioned in the second printed circuit board; a first transmission-reception circuit positioned in the second printed circuit board. The first transmission-reception circuit comprises a power amplifier for amplifying a signal to be transmitted through the first antenna, and a first low noise amplifier for amplifying a signal received through the first antenna. The power amplifier forms a portion of a transmission path electrically connected with the communication circuit and the first antenna. The first low noise amplifier forms a portion of a first reception path electrically connected with the communication circuit and the first antenna. The transmission path or the first reception path in the first transmission-reception circuit is selectively provided by the communication circuit. The portable communication device also includes a first reception circuit posi-
(Continued)

tioned in the second printed circuit board, wherein the first reception circuit does not comprise a power amplifier for amplifying a signal to be transmitted through the second antenna, and comprises a second low noise amplifier for amplifying a signal received through the second antenna, the second low noise amplifier forming a portion of a second reception path electrically connected with the communication circuit and the second antenna.

20 Claims, 21 Drawing Sheets

(51) Int. Cl.
| | | |
|---|---|---|
| *H04B 1/00* | (2006.01) | |
| *H04B 7/04* | (2017.01) | |
| *H04B 1/52* | (2015.01) | |
| *H04B 1/40* | (2015.01) | |
| *H01Q 1/22* | (2006.01) | |
| *H04B 1/44* | (2006.01) | |
| *H04B 1/04* | (2006.01) | |
| *H03F 3/213* | (2006.01) | |
| *H01Q 21/06* | (2006.01) | |
| *H03F 3/21* | (2006.01) | |
| *H03F 3/195* | (2006.01) | |

(52) U.S. Cl.
CPC ............. *H03F 3/211* (2013.01); *H03F 3/213* (2013.01); *H04B 1/0458* (2013.01); *H04B 1/44* (2013.01); *H03F 2200/294* (2013.01); *H03F 2200/451* (2013.01)

(56) References Cited

U.S. PATENT DOCUMENTS

| | | | |
|---|---|---|---|
| 9,344,176 B2 | 5/2016 | Barker et al. | |
| 2002/0190163 A1* | 12/2002 | Stadter | B64G 1/36 244/158.1 |
| 2004/0121753 A1* | 6/2004 | Sugar | H04B 1/006 455/333 |
| 2006/0121937 A1* | 6/2006 | Son | H04B 1/48 455/553.1 |
| 2010/0210226 A1* | 8/2010 | Matsuyama | H04W 88/02 455/101 |
| 2010/0271986 A1* | 10/2010 | Chen | H04W 88/06 370/278 |
| 2011/0003563 A1 | 1/2011 | Gorbachov | |
| 2012/0044927 A1* | 2/2012 | Pan | H03M 3/47 370/345 |
| 2012/0112970 A1 | 5/2012 | Caballero et al. | |
| 2013/0051284 A1* | 2/2013 | Khlat | H04L 5/06 370/277 |
| 2014/0334312 A1* | 11/2014 | Rivingston | H04W 74/0816 370/241 |
| 2014/0370828 A1 | 12/2014 | Seo et al. | |
| 2014/0376417 A1 | 12/2014 | Khat | |
| 2017/0040947 A1* | 2/2017 | Chang | H03F 1/0205 |
| 2017/0294947 A1 | 10/2017 | Little et al. | |
| 2018/0226719 A1* | 8/2018 | Wong | H01Q 5/321 |
| 2018/0278275 A1 | 9/2018 | Leung | |
| 2019/0123778 A1 | 4/2019 | Jeong et al. | |
| 2019/0281146 A1 | 9/2019 | Jang et al. | |
| 2019/0363453 A1 | 11/2019 | Yu et al. | |

FOREIGN PATENT DOCUMENTS

| | | |
|---|---|---|
| KR | 20190044363 | 4/2019 |
| WO | WO2016195826 | 12/2016 |

OTHER PUBLICATIONS

European Search Report dated May 21, 2021 issued in counterpart application No. 20216657.5-1216, 12 pages.
Australian Examination Report dated Jul. 27, 2021 issued in counterpart application No. 2020294188, 4 pages.
European Search Report dated Aug. 23, 2021 issued in counterpart application No. 20216657.5-1216, 11 pages.

* cited by examiner

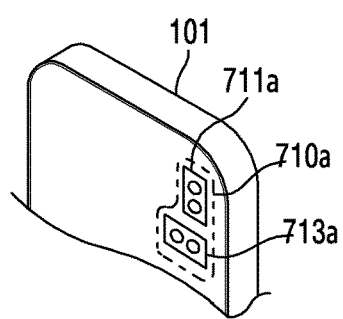 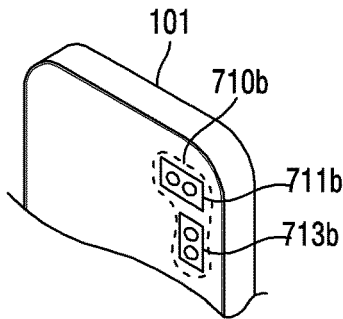 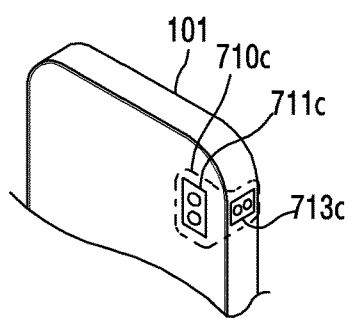
FIG.7A   FIG.7B   FIG.7C
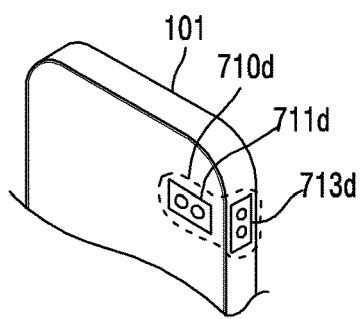 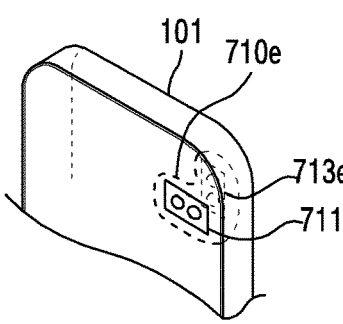 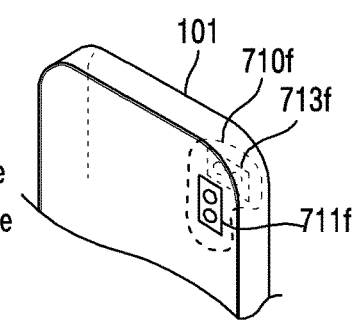
FIG.7D   FIG.7E   FIG.7F
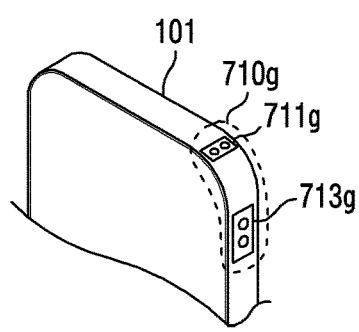 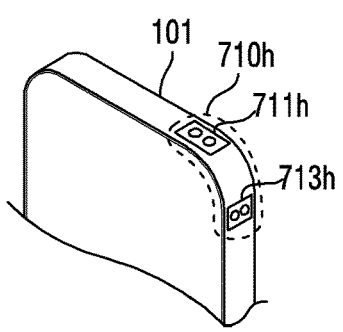 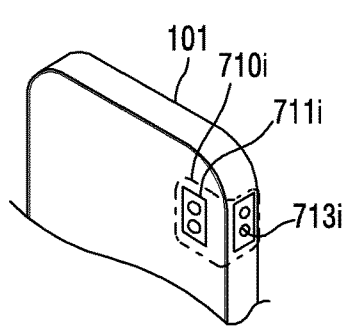
FIG.7G   FIG.7H   FIG.7I
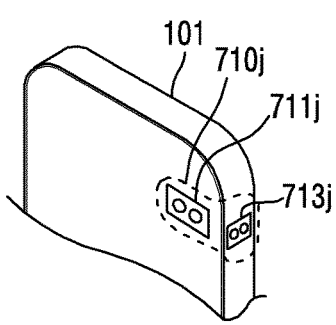 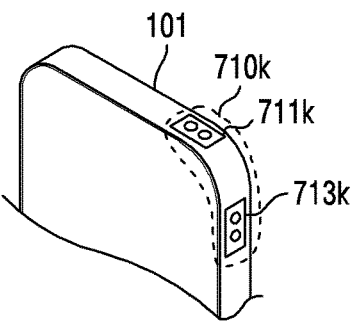 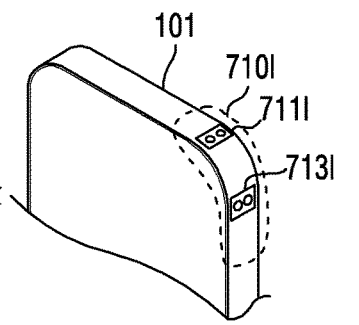
FIG.7J   FIG.7K   FIG.7L
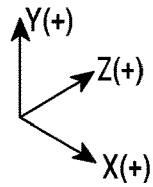

ANTENNA MODULE AND ELECTRONIC DEVICE USING THE SAME

CROSS-REFERENCE TO RELATED APPLICATION(S)

This application is based on and claims priority under 35 U.S.C. § 119 to Korean Patent Application No. 10-2019-0175616, filed on Dec. 26, 2019, in the Korean Intellectual Property Office, the disclosure of which is incorporated by reference herein in its entirety.

BACKGROUND

1. Field

The disclosure relates generally to an antenna module supporting a high frequency band and an electronic device using the same.

2. Description of Related Art

Efforts to commercialize next-generation (5th generation (5G) or pre-5G) communication systems have been ongoing in order to meet the demand for increasing wireless data traffic since 4th-generation (4G) communication systems were commercialized. For example, the 5G communication systems or pre-5G communication systems are called beyond 4G network communication systems or post long term evolution (LTE) systems.

A 5G communication system may be implemented in a high frequency band to achieve a high data transmission rate. For 5G communication systems, technologies for beamforming, massive multiple input multiple output (MIMO), full dimensional MIMO (FD-MIMO), array antenna, analog beam-forming, and large scale antenna are being discussed to mitigate a path loss of a radio wave and increase a transmission distance of a radio wave in a high frequency band.

In addition, technologies for enhanced small cells, advanced small cells, cloud radio access networks (RAN), ultra-dense networks, device to device communication (D2D), wireless backhaul, moving networks, cooperative communication, coordinated multi-points (CoMP), and interference cancellation in 5G communication systems are being developed to enhance networks.

In addition, hybrid frequency shift keying and quadrature amplitude modulation (FQAM) and sliding window superposition coding (SWSC), which are advanced coding modulation (ACM) methods, are being developed. Additionally, filter bank multi carrier (FBMC), non-orthogonal multiple access (NOMA), and sparse code multiple access (SCMA), which are enhanced accessing technologies in 5G systems, are being developed.

When a high frequency band signal (for example, 3 gigahertz (GHz) to 100 GHz) is transmitted through a free space, the high frequency band signal may be greatly attenuated, compared to a low frequency band signal, due to its characteristics of a short wavelength and strong straightness.

As the number of components included in a transmission circuit connected with an array antenna included in an antenna module, such as power amplifiers (PAs), increases, the size of the antenna module may increase. In addition, according to a process of making components included in the antenna module, power consumption may increase and too much heat may be generated.

SUMMARY

The present disclosure has been made to address the above-mentioned problems and disadvantages, and to provide at least the advantages described below.

According to an aspect of the disclosure, a portable communication device includes a processor positioned in a first printed circuit board; a communication circuit; and an antenna module. The antenna module includes a second printed circuit board; a first antenna and a second antenna which are positioned in the second printed circuit board; a transmission-reception circuit positioned in the second printed circuit board. The transmission-reception circuit includes a PA for amplifying a signal to be transmitted through the first antenna, and a first low noise amplifier for amplifying a signal received through the first antenna. The PA forms a portion of a transmission path electrically connected with the communication circuit and the first antenna. The first low noise amplifier forms a portion of a first reception path electrically connected with the communication circuit and the first antenna. The transmission path or the first reception path in the transmission-reception circuit is selectively provided by the communication circuit. The portable communication device also includes a reception circuit positioned in the second printed circuit board, wherein the reception circuit does not include a PA for amplifying a signal to be transmitted through the second antenna, and does include a second low noise amplifier for amplifying a signal received through the second antenna, the second low noise amplifier forms a portion of a second reception path electrically connected with the communication circuit and the second antenna.

According to another aspect of the disclosure, a portable communication device includes a processor positioned in a first printed circuit board; an antenna module including a second printed circuit board which has a first array antenna and a second array antenna positioned on a first surface thereof. The antenna module has a transmission-reception circuit and a reception circuit positioned on a second surface thereof, which is different from the first surface. The portable communication device includes a communication circuit configured to electrically connect the processor and the antenna module, wherein the transmission-reception circuit is positioned on a first path which electrically connects a plurality of first antenna elements forming the first array antenna. The communication circuit includes PAs configured to amplify signals to be transmitted through the plurality of first antenna elements; and first low noise amplifiers configured to amplify signals received through the plurality of first antenna elements, wherein the reception path is positioned on a second path which electrically connects a plurality of second antenna elements forming the second array antenna. The communication circuit includes second low noise amplifiers configured to amplify signals received through the plurality of second antenna elements, wherein the PAs and the first low noise amplifiers form a plurality of pairs, and the plurality of pairs are matched with the plurality of first antenna elements, and the second low noise amplifiers are matched with the plurality of second antenna elements.

According to another aspect of the disclosure, an antenna module includes a printed circuit board; a first antenna and a second antenna positioned in the printed circuit board; a transmission-reception circuit positioned in the printed circuit board, the transmission-reception circuit including a PA for amplifying a signal to be transmitted through the first antenna, and a first low noise amplifier for amplifying a signal received through the first antenna. The PA forms a portion of a transmission path electrically connected with a communication circuit and the first antenna. The first low noise amplifier forms a portion of a first reception path electrically connected with the communication circuit and the first antenna. The transmission path or the first reception path in the transmission-reception circuit is selectively provided by the communication circuit. The antenna module also includes a reception circuit positioned in the printed circuit board, the reception circuit does not include a PA for amplifying a signal to be transmitted through the second antenna, and does include a second low noise amplifier for amplifying a signal received through the second antenna. The second low noise amplifier forms a portion of a second reception path electrically connected with the communication circuit and the second antenna.

BRIEF DESCRIPTION OF THE DRAWINGS

The above and other aspects, features, and advantages of certain embodiments of the disclosure will be more apparent from the following description, taken in conjunction with the accompanying drawings, in which:

FIG. 7A is a view illustrating an example arrangement of antenna arrays in an electronic device, according to an embodiment;

FIG. 7B is a view illustrating an example arrangement of antenna arrays in the electronic device, according to an embodiment;

FIG. 7C is a view illustrating an example arrangement of antenna arrays in the electronic device, according to an embodiment;

FIG. 7D is a view illustrating an example arrangement of antenna arrays in the electronic device, according to an embodiment;

FIG. 7E is a view illustrating an example arrangement of antenna arrays in the electronic device, according to an embodiment;

FIG. 7F is a view illustrating an example arrangement of antenna arrays in the electronic device, according to an embodiment;

FIG. 7G is a view illustrating an example arrangement of antenna arrays in the electronic device, according to an embodiment;

FIG. 7H is a view illustrating an example arrangement of antenna arrays in the electronic device, according to an embodiment;

FIG. 7I is a view illustrating an example arrangement of antenna arrays in the electronic device, according to an embodiment;

FIG. 7J is a view illustrating an example arrangement of antenna arrays in the electronic device, according to an embodiment;

FIG. 7K is a view illustrating an example arrangement of antenna arrays in the electronic device, according to an embodiment;

FIG. 7L is a view illustrating an example arrangement of antenna arrays in the electronic device, according to an embodiment;

DETAILED DESCRIPTION

Figure 1:
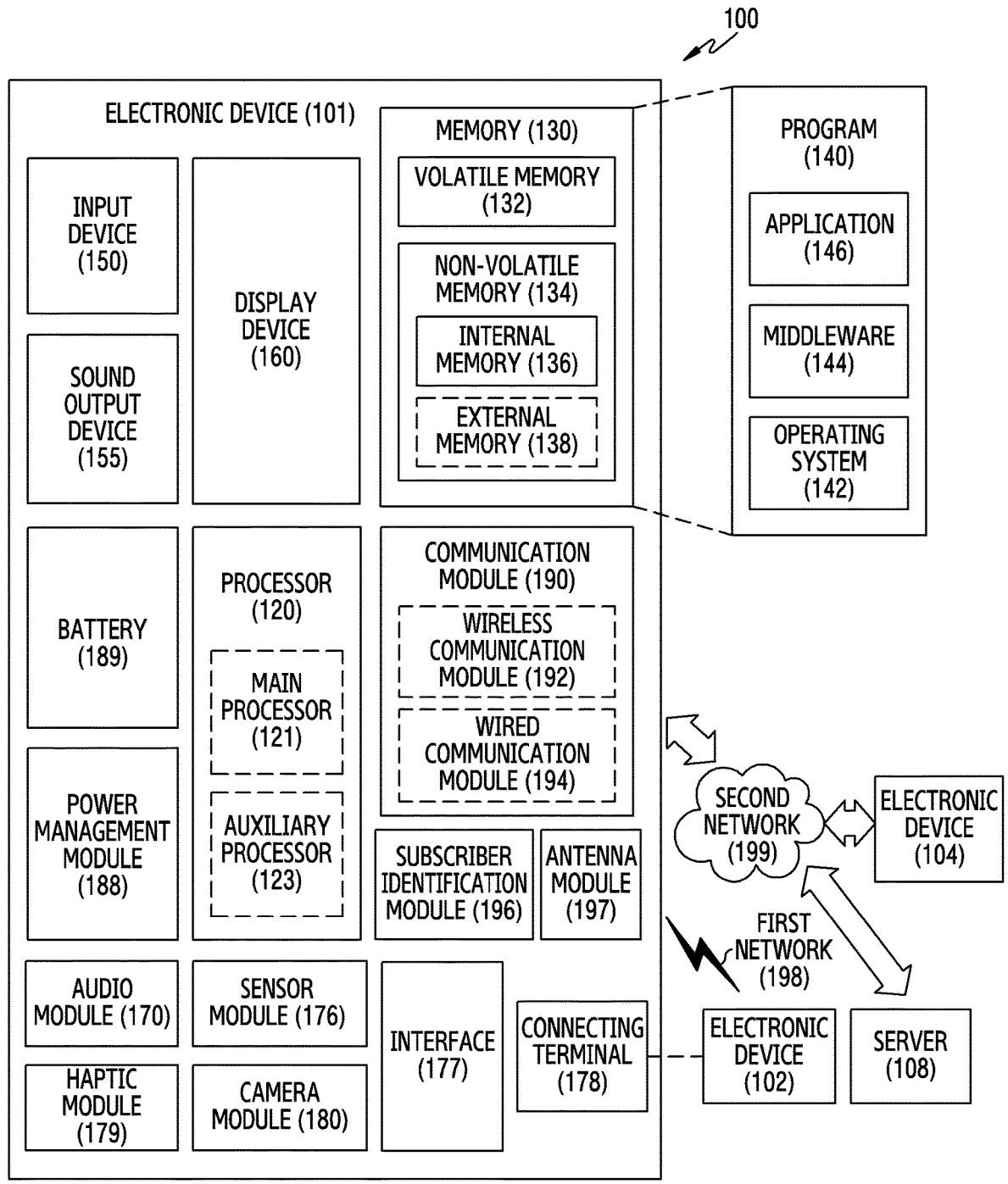
FIG. 1 is a view illustrating a block configuration of an electronic device in a network environment, according to an embodiment.

Various embodiments of the disclosure provide an antenna module which supports wireless communication in a high frequency band, has a small size, and can reduce power consumption, and an operating method therefor.

Various embodiments of the disclosure provide a front-end structure of an antenna module by reducing the number of transmission circuits in the front-end structure.

Various embodiments of the present disclosure are described with reference to the accompanying drawings. However, various embodiments of the present disclosure are not limited to particular embodiments, and it should be understood that modifications, equivalents, and/or alternatives of the embodiments described herein can be variously made. With regard to description of drawings, similar components may be marked by similar reference numerals.

FIG. 1 illustrates an electronic device in a network environment, according to an embodiment.

FIG. 1 is a block diagram illustrating an electronic device 101 in a network environment 100 according to various embodiments. Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) 196, or an antenna module 197. In some embodiments, at least one (e.g., the display device 160 or the camera module 180) of the components may be omitted from the electronic device 101, or one or more other components may be added in the electronic device 101. In some embodiments, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an ISP or a CP) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input device 150 may receive a command or data to be used by another component (e.g., the processor 120) of the electronic device 101, from the outside (e.g., a user) of the electronic device 101. The input device 150 may include, for example, a microphone, a mouse, a keyboard, or a digital pen (e.g., a stylus pen).

The sound output device 155 may output sound signals to the outside of the electronic device 101. The sound output device 155 may include, for example, a speaker or a receiver. The speaker may be used for general purposes, such as playing multimedia or playing a record, and the receiver may be used for an incoming calls. According to an embodiment, the receiver may be implemented as separate from, or as part of the speaker.

The display device 160 may visually provide information to the outside (e.g., a user) of the electronic device 101. The display device 160 may include, for example, a display, a hologram device, or a projector and control circuitry to control a corresponding one of the display, hologram device, and projector. According to an embodiment, the display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. According to an embodiment, the audio module 170 may obtain the sound via the input device 150, or output the sound via the sound output device 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, an HDMI connector, a USB connector, an SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, ISP, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more CPs that are operable independently from the processor 120 (e.g., the AP) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or Infrared Data Association (IrDA)) or the second network 199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., PCB). According to an embodiment, the antenna module 197 may include a plurality of antennas. In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 and 104 may be a device of a same type as, or a different type, from the electronic device 101. According to an embodiment, all or some of the operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

A method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

Figure 2:
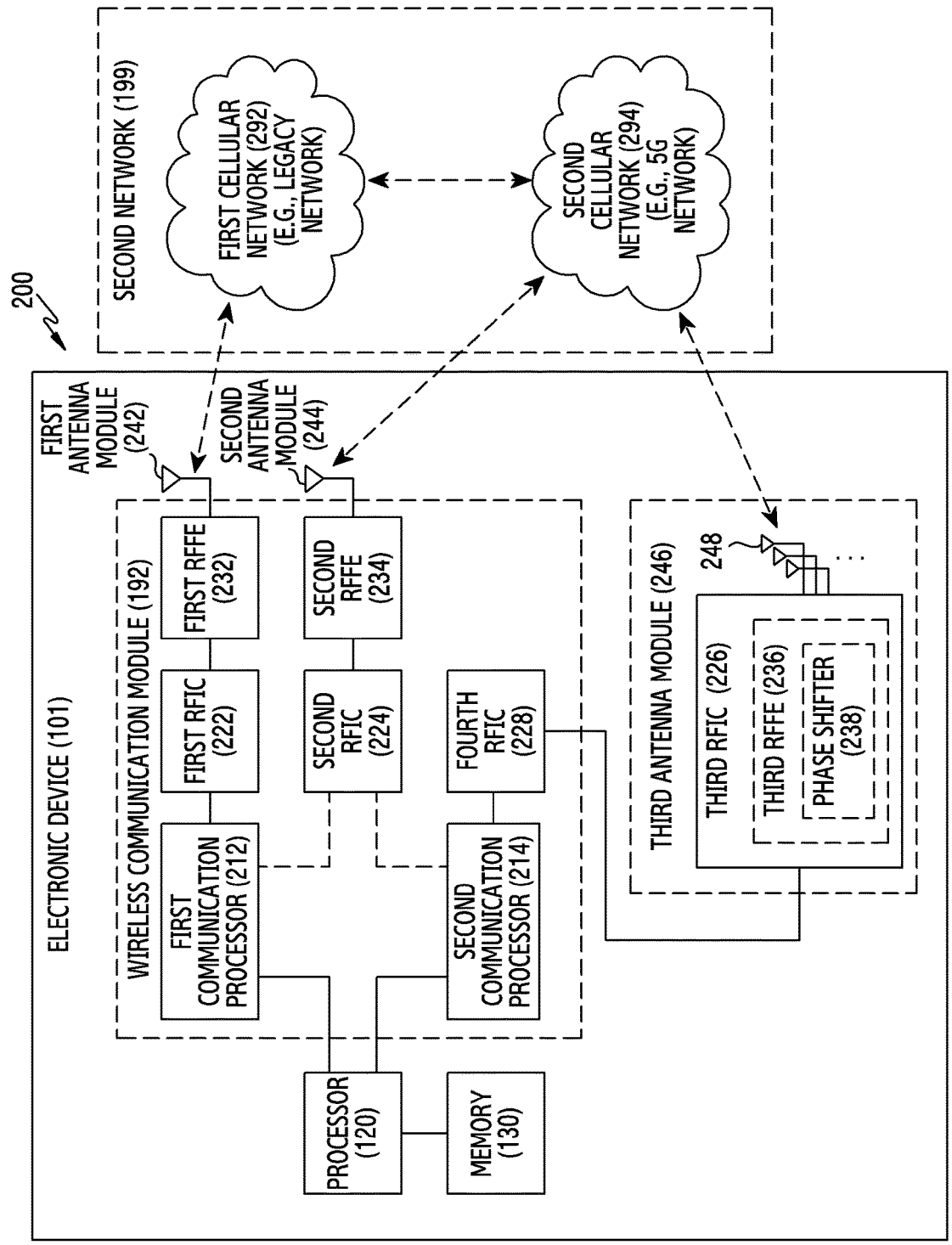
FIG. 2 is a view illustrating a block configuration of a communication module which supports communication with a plurality of wireless networks in the electronic device, according to an embodiment.

FIG. 2 illustrates an electronic device that supports multiple frequency bands, according to an embodiment.

Referring to FIG. 2, the electronic device 201 includes a first communication processor 212, a second communication processor 214, a first RFIC 222, a second RFIC 224, a third RFIC 226, a fourth RFIC 228, a first RFFE 232, a second RFFE 234, a first antenna module 242, a second antenna module 244, and an antennas 248. The electronic device 101 further includes a processor 120 and a memory 130. A second network 299 includes a first cellular network 292 and a second cellular network 294. Alternatively, the electronic device 201 may further include at least one of the components illustrated in FIG. 1, and the second network 299 may further include at least another network. The first communication processor 212, the second communication processor 214, the first RFIC 222, the second RFIC 224, the fourth RFIC 228, the first RFFE 232, and the second RFFE 234 configure at least a part of the wireless communication module 192. Alternatively, the fourth RFIC 228 may be omitted or may be included as a part of the third RFIC 226.

The first communication processor 212 may support establishment of a communication channel of a band to be used for wireless communication with the first cellular communication network 292, and legacy network communication via the established communication channel. The first cellular network 292 may be a legacy network including a second generation (2G), third generation (3G), 4G, or LTE network. The second communication processor 214 may support establishment of a communication channel corresponding to a designated band (e.g., about 6 GHz to about 60 GHz) among bands to be used for wireless communication with the second cellular network 294, and 5G network communication via the established communication channel. The second cellular network 294 may be a 5G network defined by 3rd generation partnership project (3GPP). In addition, the first communication processor 212 or the second communication processor 214 may support establishment of a communication channel corresponding to another designated band (e.g., about 6 GHz or lower) among the bands to be used for wireless communication with the second cellular network 294, and 5G network communication via the established communication channel. The first communication processor 212 and the second communication processor 214 may be implemented in a single chip or a single package. Alternatively, the first communication processor 212 or the second communication processor 214 may be configured, in a single chip or a single package, together with the processor 120, an auxiliary processor 123, or the communication module 190. The first communication processor 212 and the second communication processor 214 may be directly or indirectly connected to each other by an interface, in order to provide or receive data or a control signal in either or both directions.

The first RFIC 222 may convert, during transmission, a baseband signal generated by the first communication processor 212 into an RF signal of about 700 megahertz (MHz) to about 3 GHz used for the first cellular network 292 (e.g., a legacy network). During reception, the RF signal may be acquired from the first cellular network 292 via the first antenna module 242 and may be preprocessed via the first RFFE 232. The first RFIC 222 may convert the preprocessed RF signal into a baseband signal to be processed by the first communication processor 212.

The second RFIC 224 may convert, during transmission, a baseband signal generated by the first communication processor 212 or the second communication processor 214 into an RF signal (e.g., a 5G Sub6 RF signal) of a Sub6 band (e.g., about 6 GHz or lower) used for the second cellular network 294 (e.g., 5G network). During reception, the 5G Sub6 RF signal may be acquired from the second cellular network 294 via the second antenna module 244 and may be preprocessed via the second RFFE 234. The second RFIC 224 may convert the preprocessed 5G Sub6 RF signal into a baseband signal to be processed by the first communication processor 212 or the second communication processor 214.

The third RFIC 226 may convert a baseband signal generated by the second communication processor 214 into an RF signal (e.g., a 5G Above6 RF signal) of a 5G Above6 band (e.g., about 6 GHz to about 60 GHz) to be used for the second cellular network 294. During reception, the 5G Above6 RF signal may be acquired from the second cellular network 294 via the antenna 248 and may be preprocessed via the third RFFE 236. The third RFIC 226 may convert the preprocessed 5G Above6 RF signal into a baseband signal to be processed by the second communication processor 214. The third RFFE 236 may be configured as a part of the third RFIC 226.

The electronic device 201 may include the fourth RFIC 228 separately from or as at least a part of the third RFIC 226. In this case, the fourth RFIC 228 may convert a baseband signal generated by the second communication processor 214 into an RF signal (e.g., an intermediate frequency (IF) signal) of an IF band (e.g., about 9 GHz to about 11 GHz), and then may transfer the IF signal to the third RFIC 226. The third RFIC 226 may convert the IF signal into a 5G Above6 RF signal. During reception, the 5G Above6 RF signal may be received from the second cellular network 294 via the antenna 248 and may be converted to an IF signal by the third RFIC 226. The fourth RFIC 228 may convert the IF signal into a baseband signal to be processed by the second communication processor 214.

The first RFIC 222 and the second RFIC 224 may be implemented as a single chip or at least part of a single package. The first RFFE 232 and the second RFFE 234 may be implemented as a single chip or at least part of a single package. Alternatively, at least one of the first antenna module 242 or the second antenna module 244 may be omitted, or may be combined with another antenna module in order to process RF signals in a plurality of corresponding bands.

The third RFIC 226 and the antenna 248 may be disposed on the same substrate in order to configure a third antenna module 246. For example, the wireless communication module 192 or the processor 120 may be disposed on a first substrate (e.g., a main PCB). In this case, the third RFIC 226 may be disposed in a partial area (e.g., a bottom surface) of a second substrate (e.g., a sub-PCB) separate from the first substrate, and the antenna 248 may be disposed in another area partial area (e.g., a top surface), thereby configuring the third antenna module 246. By placing the third RFIC 226 and the antenna 248 on the same substrate, it is possible to reduce the length of a transmission line therebetween. This configuration may reduce the loss (e.g., attenuation) of a signal, which is caused due to a transmission line, in a high frequency band (e.g., about 6 GHz to about 60 GHz) used for 5G network communication. Accordingly, the electronic device 201 may improve the quality or speed of communication with the second cellular network 294.

The antennas 248 may be configured by an antenna array including a plurality of antenna elements for beamforming. In this case, the third RFIC 226 may include a plurality of phase shifters 238 corresponding to the plurality of antenna elements, as a part of the third RFFE 236. During transmission, each of the plurality of phase shifters 238 may convert the phase of a 5G Above6 RF signal to be transmitted to the outside (e.g., to a base station of the 5G network) of the electronic device 201 via a corresponding antenna element. During reception, each of the plurality of phase shifters 238 may convert the phase of the 5G Above6 RF signal received from the outside via the corresponding antenna element, into the same or substantially the same phase. Accordingly, transmission or reception may be performed via beamforming between the electronic device 201 and the outside.

Each of or at least one of the first to third RFFEs 232, 234, and 236 may include a protection device and/or a method for preventing an internal PA from burning out due to frequency unlocking of a local oscillation signal generated by a local oscillator for supplying overcurrent or frequency mixing. The protection device may recognize that the frequency of the local oscillation signal is unlocked by sensing that the frequency of the local oscillation signal is out of a frequency band designated for transmission of a transmission signal.

Although FIG. 2 illustrates an example in which the electronic device 201 includes three RFFEs 232, 234, and 236, the protection device and/or the method therefore may be applied regardless of the number of RFFEs included in the electronic device 201.

The second cellular network 294 may be operated independently of (e.g., stand-alone (SA) or in connection with (e.g., non-stand-alone (NSA)) the first cellular network 292. For example, the 5G network may have only an access network (e.g., 5G RAN or next generation RAN (NG RAN)) and may not have a core network (e.g., next generation core (NGC)). In this case, the electronic device 201 may access the access network of the 5G network, and then may access an external network (e.g., the Internet) under the control of a core network (e.g., evolved packed core (EPC)) of the legacy network. Protocol information (e.g., LTE protocol information) for communication with the legacy network or protocol information (e.g., new radio (NR) protocol information) for communication with the 5G network may be stored in the memory 130, and may be accessed by other components (e.g., the processor 120, the first communication processor 212, or the second communication processor 214).

The processor 120 of the electronic device 201 may execute one or more instructions stored in the memory 130. The processor 120 may include a circuit for data processing, for example, at least one of an IC, an arithmetic logic unit (ALU), a field programmable gate array (FPGA), and large-scale integration (LSI). The memory 130 may store data related to the electronic device 201. The memory 130 may include a volatile memory, such as a random access memory (RAM) including a static random access memory (SRAM), and a dynamic RAM (DRAM), or may include a non-volatile memory, such as a flash memory, an embedded multimedia card (eMMC), and a solid state drive (SSD), as well as a read only memory (ROM), a magneto-resistive RAM (MRAM), a spin-transfer torque MRAM (STT-MRAM), a phase-change RAM (PRAM), a resistive RAM (RRAM), and a ferroelectric RAM (FeRAM).

The memory 130 may store instructions related to an application and instructions related to an OS. The OS is system software executed by the processor 120. The processor 120 may manage hardware components included in the electronic device 201 by executing the operating system. The operating system may provide an application programming interface (API) to applications that are software other than the system software.

One or more applications, which are a set of multiple instructions, may be installed in the memory 130. Installation of an application in the memory 130 may indicate that the application is stored in a format executable by the processor 120 connected to the memory 130.

Figure 3:
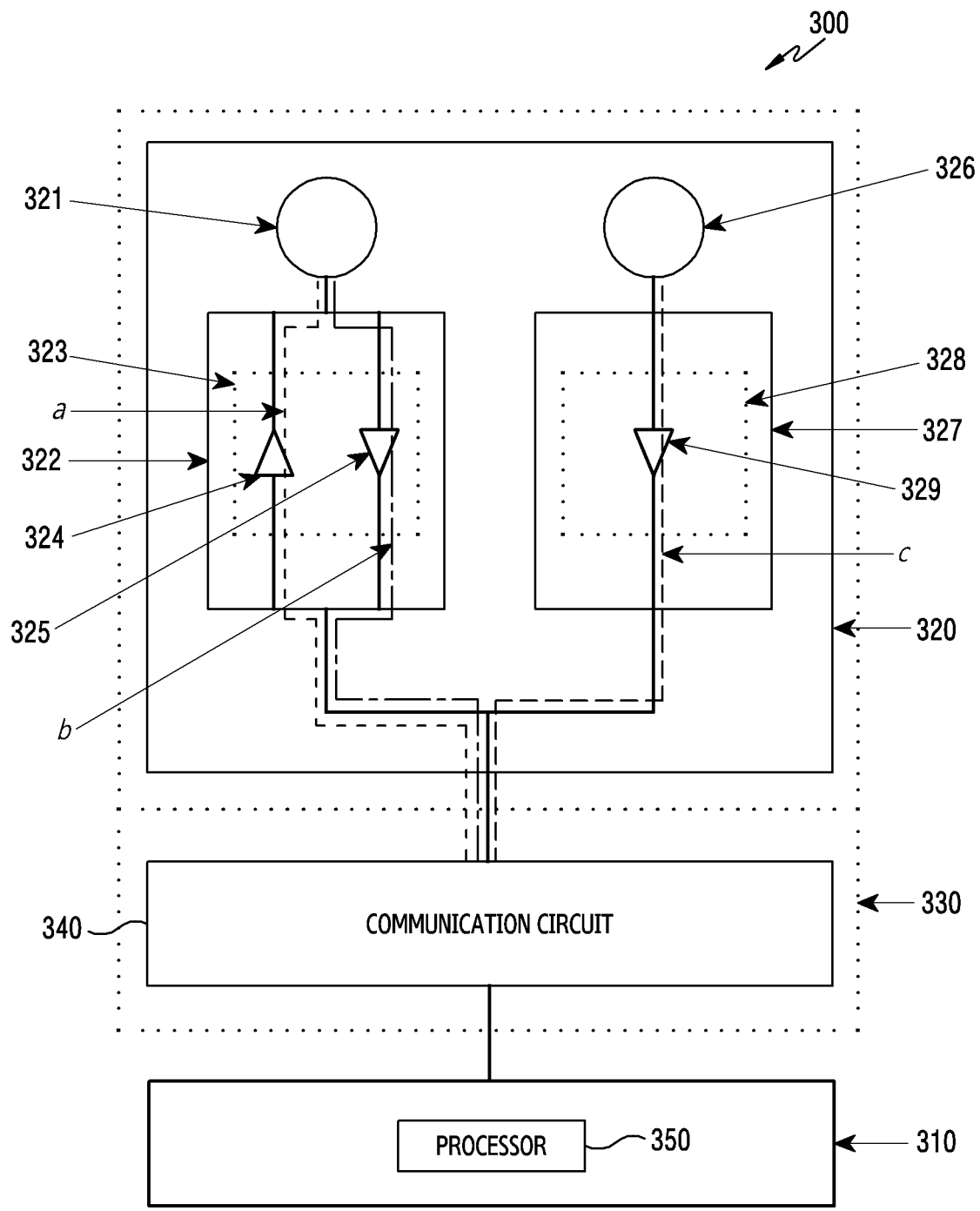
FIG. 3 is a view illustrating an example of a block configuration of a wireless communication module in the electronic device, according to an embodiment.

FIG. 3 is a view illustrating an example of a wireless communication device 300 in an electronic device 101 (for example, a portable communication device), according to an embodiment.

Referring to FIG. 3, the wireless communication device 300 includes a first PCB 310 and a second PCB 320. A processor 350 may be positioned in the first PCB 310. All components or at least some components of an antenna module 330 may be positioned in the second PCB 320. The antenna module 330 may include the second PCB 320. The antenna module 330 may include or may not include a communication circuit 340. Even when the antenna module 330 includes the communication circuit 340, the communication circuit 340 may not be positioned in the second PCB 320.

The communication circuit 340 may be electrically connected between the processor 350 (for example, an AP or a CP) and a transmission-reception circuit 323 (or a reception circuit 328) to transmit and receive wireless signals. The communication circuit 340 may be positioned inside one single chip package or may be positioned over a plurality of chip packages. At least a portion of the communication circuit 340 may be positioned in the second PCB 320 included in the antenna module 330, or may be positioned in the first PCB 310 in which the processor 350 is positioned. The communication circuit 340 may include at least one of an RFIC (for example, the first, second, third, and fourth RFICs 222, 224, 226, 228 of FIG. 2), an intermediate frequency integrated circuit (IFIC), a coupler, a distributor, a phase shifter, a phase-locked loop (PLL), or a mixer.

The second PCB 320 included in the antenna module 330 may include a first antenna 321, a second antenna 326, a first front end chip 322, or a second front end chip 327. The first front end chip 322 may include the transmission-reception circuit 323. The second front end chip 327 may include the reception circuit 328.

The first front end chip 322 and the second front end chip 327 may be formed as one chip. The communication circuit 340 may include the first front end chip 322 and the second front end chip 327. In another example, the communication circuit 340 may include the second front end chip 327.

The first antenna 321 in the second PCB 320 may be positioned to face a first surface of the electronic device 101, and the second antenna 326 in the second PCB 320 may be positioned to face a second surface of the electronic device 101 which is different from the first surface. The transmission-reception circuit 323 in the second PCB 320 may be positioned to face a third surface of the electronic device 101 which faces in the opposite direction of the first surface. The reception circuit 328 in the second PCB 320 may be positioned to face a fourth surface which faces in the opposite direction of the second surface.

The first antenna 321 and the second antenna 326 may be set to operate as an antenna array with respect to wireless signals which are received by the communication circuit 340.

The transmission-reception circuit 323 may include a first semiconductor formed with a first material, and the reception circuit 328 may include a second semiconductor formed with a second material which is different from the first material.

The transmission-reception circuit 323 may include a PA 324 and a first low noise amplifier 325. The PA 324 may amplify a signal to be transmitted through the first antenna 321. In an embodiment, the PA 324 may form a portion of a transmission path a electrically connecting the communication circuit 340 and the first antenna 321. The first low noise amplifier 325 may amplify a signal received through the first antenna 321. The first low noise amplifier 325 may form a portion of a first reception path b electrically connecting the first antenna 321 and the communication circuit 340. The transmission path a or the first reception path b may be selectively provided. For example, the transmission-reception circuit 323 may include a switch to electrically connect the transmission path a and the first reception path b with the communication circuit 340 selectively.

The reception circuit 328 may include a second low noise amplifier 329. The reception circuit 328 may not include a PA for amplifying a signal to be transmitted through the second antenna 326. The second low noise amplifier 329 may amplify a signal received through the second antenna 326. The second low noise amplifier 329 may form a portion of a second reception path c electrically connecting the second antenna 326 and the communication circuit 340.

In the wireless communication device 300, wireless signals may be transmitted or received through at least three signal paths a, b, c. The transmission path a and the first reception path b out of the at least three signal paths a, b, c may be selectively provided in the transmission-reception circuit 323. The second reception path c may be a reception dedicated path which exists in the reception circuit 328. A plurality of transmission-reception circuits 323 providing the transmission path a and the first reception path b may be included in the first front end chip 322 or the second PCB 320. A plurality of reception circuits 328 providing the second reception path c may be included in the second front end chip 327 or the second PCB 320. It is assumed that one transmission-reception circuit 323 is included in the first front end chip 322 or the second PCB 320, and one reception circuit 328 is included in the second front end chip 327 or the second PCB 320. However, descriptions of various embodiments, which will be described below, are not limited to exemplified cases.

The communication circuit 340 may up-convert a BB signal provided from the processor 350 included in the first PCB 310 into a radio frequency (RF) signal, and may deliver the up-converted RF signal to the transmission-reception circuit 323 included in the second PCB 320. The communication circuit 340 may down-convert an RF signal transmitted from the transmission-reception circuit 323 and the reception circuit 328, which are included in the second PCB 320, into a BB signal, and may deliver the down-converted BB signal to the processor 350 included in the first PCB 310.

The transmission-reception circuit 323 may include at least one transmission path a and at least one first reception path b therein. Since the transmission path a and the first reception path b are selectively provided in the transmission-reception circuit 323, the transmission path a and the first reception path b may be referred to as a transmission reception selection path.

The transmission path a may include the PA 324 to amplify an RF signal to be transmitted through the first antenna 321. The first reception path b may include the first low noise amplifier 325 to amplify an RF signal received through the first antenna 321. The second reception path c may include the second low noise amplifier 329 to amplify an RF signal received through the second antenna 326. The reception circuit 328 may not include a PA for amplifying an RF signal in order to transmit the RF signal through the second antenna 326.

The transmission-reception circuit 323 may selectively provide one operation state out of two operation states. The two operation states may include a first operation state in which the transmission path a amplifying an RF signal to be transmitted through the first antenna 321 by the PA 324 is enabled, and a second operation state in which the first reception path b amplifying an RF signal received through the first antenna 321 by the first low noise amplifier 325 and then delivering the RF signal to the communication circuit 340 is enabled. In the second operation state, the second reception path c amplifies an RF signal received through the second antenna 326 by the second low noise amplifier 329 and then delivers the RF signal to the communication circuit 340.

In the second operation state, the communication circuit 340 may couple RF signals which are received through the first reception path b included in the transmission-reception circuit 323 and the second reception path c included in the reception circuit 328, and may output a BB signal, which is a result of down-converting the coupled RF signal.

The antenna module 330 may further include a coupler to couple RF signals received through the first reception path b included in the transmission-reception circuit 323 and the second reception path c included in the reception circuit 328, and to output one received RF signal. The one transmission-reception circuit 323, the one reception circuit 328, and the coupler may be positioned in the second PCB 320 or the communication circuit 340 included in the antenna module 330.

FIG. 3 depicts that the antenna module 330 includes one transmission-reception circuit 323 and one reception circuit 328. However, the antenna module 330 may include a plurality of transmission-reception circuits including one first transmission-reception circuit 323 and at least one other second transmission-reception circuit, and/or a plurality of reception circuits including one first reception circuit 328 and at least one other second reception circuit.

When the antenna module 330 includes the plurality of transmission-reception circuits, the antenna module 330 may further include a first coupler electrically connected with the one first transmission-reception circuit 323 and the at least one other second transmission-reception circuit. The one first transmission-reception circuit 323, the at least one other second transmission-reception circuit, and the first coupler may be positioned in the first front end chip 322. The first coupler may be positioned in the communication circuit 340 rather than the first front end chip 322. All of the one first transmission-reception circuit 323, the at least one other second transmission-reception circuit, and the first coupler may be positioned in the communication circuit 340.

When the antenna module 330 includes the plurality of reception circuits, the antenna module 330 may further include a second coupler electrically connected with the first reception circuit 328 and the at least one other second reception circuit. The first reception circuit 328, the at least one other second reception circuit, and the second coupler may be positioned in the second front end chip 327 or the communication circuit 340. The second coupler may be positioned in the communication circuit 340 rather than the second front end chip 327. The first reception circuit 328, the at least one other second reception circuit, and the second coupler may be positioned in the communication circuit 340.

When the antenna module 330 includes one or a plurality of transmission-reception circuits and one or a plurality of reception circuits, the antenna module 330 may include at least one coupler. In this case, the at least one coupler may couple at least one reception signal outputted through the one or plurality of transmission-reception circuits, and at least one reception signal outputted through the one or plurality of reception circuits, and may output the coupled signals as one reception signal. The coupler may be positioned in, for example, the second PCB 320 or the communication circuit 340 included in the antenna module 330.

When the antenna module 330 includes the plurality of transmission-reception circuits, the antenna module 330 may further include a distributor electrically connected with the one first transmission-reception circuit 323 and the at least one other second transmission-reception circuit. The first transmission-reception circuit 323, the at least one other second transmission-reception circuit, and the distributor may be positioned in the first front end chip 322. The distributor may be positioned in the second PCB 320 or the communication circuit 340, rather than the first front end chip 322. The first transmission-reception circuit 323, the at least one other second transmission-reception circuit, and the distributor may be positioned in the communication circuit 340.

The second PCB 320 may further include a third antenna and a fourth antenna. The third antenna may be electrically connected with another transmission-reception circuit, and the fourth antenna may be electrically connected with another reception circuit. In this case, the first antenna 321 and the third antenna may be set to operate as a first antenna array, and the second antenna 326 and the fourth antenna may be set to operate as a second antenna array.

The processor 350 positioned in the first PCB 310 may form at least a portion of a CP. The processor 350 may be set to form a first beam by using the transmission-reception circuit 323, the at least one other transmission-reception circuit, and the first antenna array. The processor 350 may be set to form a second beam by using the reception circuit 328, the at least one other reception circuit, and the second antenna array. The processor 350 may be set to perform an operation of forming the first beam and an operation of forming the second beam, such that the first beam and the second beam have the same frequency. A direction in which the first beam faces may be different from a direction in which the second beam faces. A plurality of antennas (for example, three or more antennas) may be positioned in the second PCB 320. The second PCB 320 may have a first number of transmission paths electrically connected with the plurality of antennas. The transmission paths may include PAs to amplify signals to be transmitted through the plurality of antennas. The second PCB 320 may have a second number of reception paths electrically connected with the plurality of antennas. The reception paths may include low noise amplifiers to amplify signals received through the plurality of antennas. The second number of the reception paths may be larger than the first number of the transmission paths.

Figure 4:
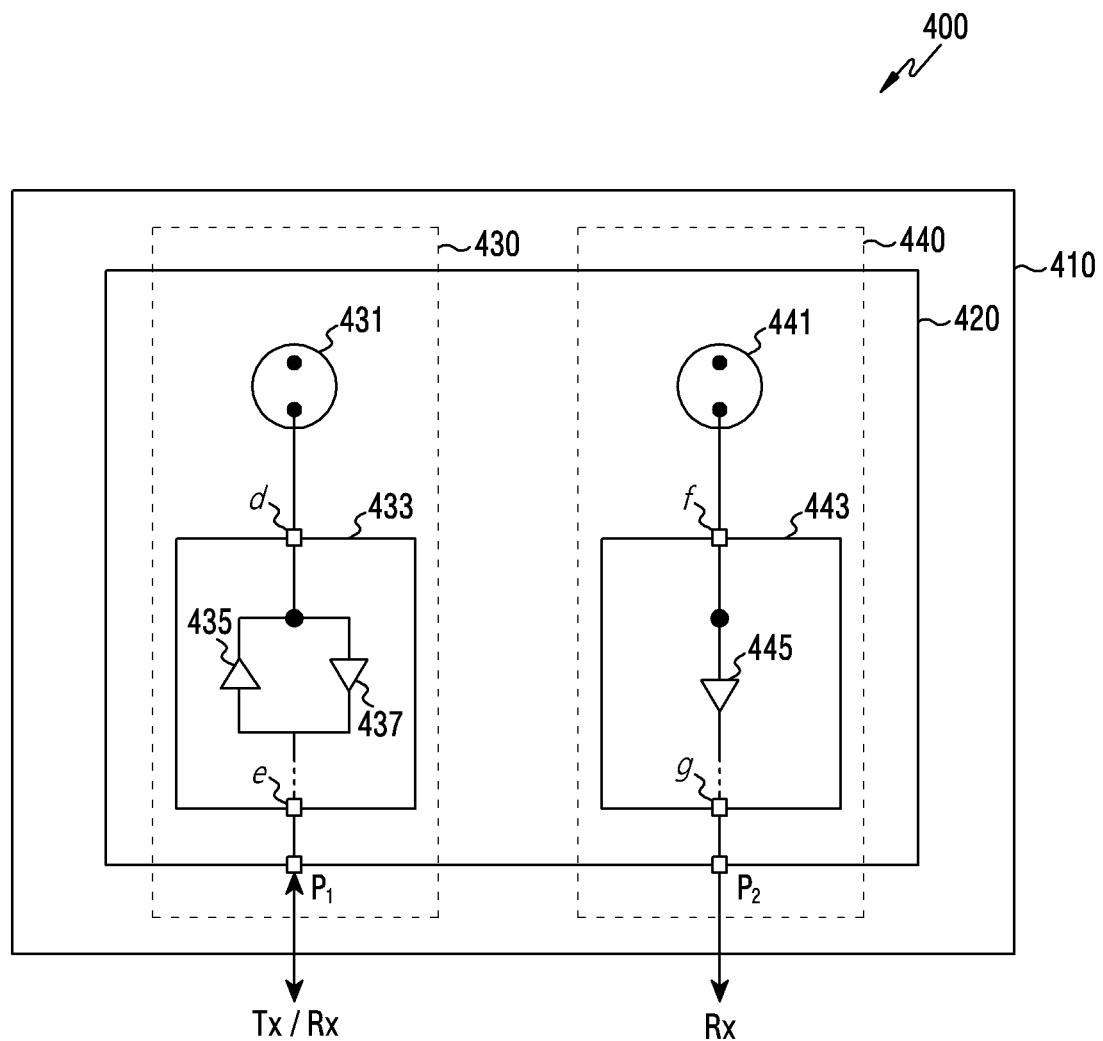
FIG. 4 is a view illustrating a structure of an antenna module included in an electronic device, according to an embodiment.

FIG. 4 is a view 400 illustrating a structure of an antenna module 410 included in an electronic device 101 (for example, a portable communication device), according to an embodiment. In FIG. 4, it is assumed that the antenna module 410 does not include a communication circuit 340.

Referring to FIG. 4, the antenna module 410 includes a second PCB 420. The second PCB 420 may include components such as a passive element, an active element, or a chip, and a plurality of ports to connect the components.

A first antenna 431, a second antenna 441, a first front end chip 433 or a second front end chip 443 may be positioned in the second PCB 420. The first front end chip 433 may include a transmission-reception circuit 323, and the second front end chip 443 may include a reception circuit 328. The transmission-reception circuit may include a PA 435 to amplify a signal to be transmitted through the first antenna 431, and a first low noise amplifier 437 to amplify a signal received through the first antenna 431. The reception circuit may not include a PA for amplifying a signal to be transmitted through the second antenna 441, and may include a second low noise amplifier 445 to amplify a signal received through the second antenna 441.

The PA 435 may form a portion of a transmission path electrically connecting a communication circuit 340 with the first antenna 431. The first low noise signal amplifier 437 may form a portion of a first reception path electrically connecting the first antenna 431 with the communication circuit 340. The first front end chip 433 including the transmission-reception circuit may selectively connect the communication circuit and the transmission path or the first reception path. The second low noise amplifier 445 may form a portion of a second reception path electrically connecting the second antenna 441 with the communication circuit 340.

The first port $P_1$ may be a port for outputting an RF reception signal low noise-amplified by the first front end chip 433 positioned in the second PCB 420 to the outside (for example, to the communication circuit 340 of FIG. 3), or for receiving an RF transmission signal to be transmitted from the outside (for example, from the communication circuit 340 of FIG. 3) by the first front end chip 433. The second port $P_2$ may be a port for outputting an RF reception signal low noise-amplified by the second front end chip 443 positioned in the second PCB 420 to the outside (for example, to the communication circuit 340 of FIG. 3).

The first front end chip 433 may be positioned on a path between the first antenna 431 and the first port $P_1$ in the second PCB 420. The first front end chip 433 may include the PA 435 or the first low noise amplifier 437.

The first front end chip 433 may form at least a portion of a transmission reception selection path 430 between the first antenna 431 and the first port $P_1$. The transmission reception selection path 430 may include a transmission path or a first reception path. The transmission path included in the transmission reception selection path 430 may be formed by electrically connecting the first port $P_1$ to the first antenna 431 through the PA 435 included in the first front end chip 433. The first reception path included in the transmission reception selection path 430 may be formed by electrically connecting the first antenna 431 to the first port $P_1$ through the first low noise amplifier 437 included in the first front end chip 433.

The second front end chip 443 may be positioned between the second antenna 441 and the second port $P_2$ in the second PCB 420. The second front end chip 443 may include the second low noise amplifier 445.

The second front end chip 443 may form at least a portion of a second reception path 440 between the second antenna 441 and the second port $P_2$. The second reception path 440 may be formed by electrically connecting the second antenna 441 to the second port $P_2$ through the second low noise amplifier 445 included in the second front end chip 443. For example, the second reception path 440 may be a reception dedicated path.

The PA 435 which forms the transmission path included in the transmission reception selection path 430, and the first low noise amplifier 437 which forms the first reception path may be included in one chip 433. The second low noise amplifier 445 which forms the second reception path 440 may be included in one chip 443. The first front end chip 433 or the second front end chip 443 may be a semiconductor including a first material (for example, Silicon Germanium (SiGe), Gallium arsenide (GaAS) or Silicon on insulator (SOI)). The communication circuit 340 may be formed with a semiconductor including a second material (for example, a complementary metal-oxide semiconductor (CMOS)) which is different from the first material.

The first front end chip 433 may include at least two terminals e and d. The second front end chip 443 may include at least two terminals g and f.

When the first front end chip 433 is positioned on a front surface or a rear surface of the second PCB 420, and the first antenna 431 is disposed on the opposite surface of the surface where the first front end chip 433 is disposed, the terminal d of the first front end chip 433 may be connected with the first antenna 431 through a via hole penetrating through the second PCB 420.

When the second front end chip 443 is disposed on the front surface or the rear surface of the second PCB 420, and the second antenna 441 is disposed on the opposite surface of the surface where the second front end chip 443 is disposed, the terminal f of the second front end chip 443 may be connected with the second antenna 441 through a via hole penetrating through the second PCB 420.

A wire may be printed on the second PCB 420 to connect the terminal e of the first front end chip 433 to the first port $P_1$, and a wire may be printed on the second PCB 420 to connect the terminal g of the second front end chip 443 to the second port $P_2$.

The first front end chip 433 may further include an electric passive element (for example, a switch) to deliver a wireless transmission signal outputted from the PA 435 to the terminal d, or to deliver a wireless reception signal inputted to the terminal d to the first low noise amplifier 437. A method of separating the wireless transmission signal and the wireless reception signal may be applied in consideration of a communication method supported by the electronic device 101. For example, when the electronic device 101 supports a time division duplex (TDD) communication method, the electronic device 101 may select the transmission path in a set transmission time period or may select the first reception path in a set reception time period. Additionally or alternatively, when the electronic device 101 supports a frequency division duplex (FDD) communication method, the electronic device 101 may separate a transmission-reception frequency by using a duplexer. For example, the duplexer may be positioned between the terminal d of the first front end chip 433 and an output of the PA 435 (or an input of the first low noise amplifier 437). The duplexer may deliver an output signal of the PA 435 to the first antenna 431 through the terminal d, and may separate a reception frequency provided from the first antenna 431 through the terminal d and may deliver the reception frequency as an input signal of the first low noise amplifier 437.

Since the second front end chip 443 supports only the second reception path, the second front end chip 443 may not include an additional element to separate the transmission path and the reception path.

FIG. 4 illustrates an example in which two front end chips 433, 443 are disposed in the second PCB 420. The second PCB 420 in the corresponding embodiment may be implemented by using a double side PCB or a multi-layer board (MLB) PCB an exterior of which is formed with a rigid material. However, more than two front end chips may be disposed in the second PCB 420, and it is obvious to those skilled in the art that embodiments suggested based on this are equally applied. Additionally or alternatively, a plurality of transmission reception selection paths and/or a plurality of reception dedicated paths may be disposed in the second PCB 420, such that RF signals are transmitted and received.

Figure 5:
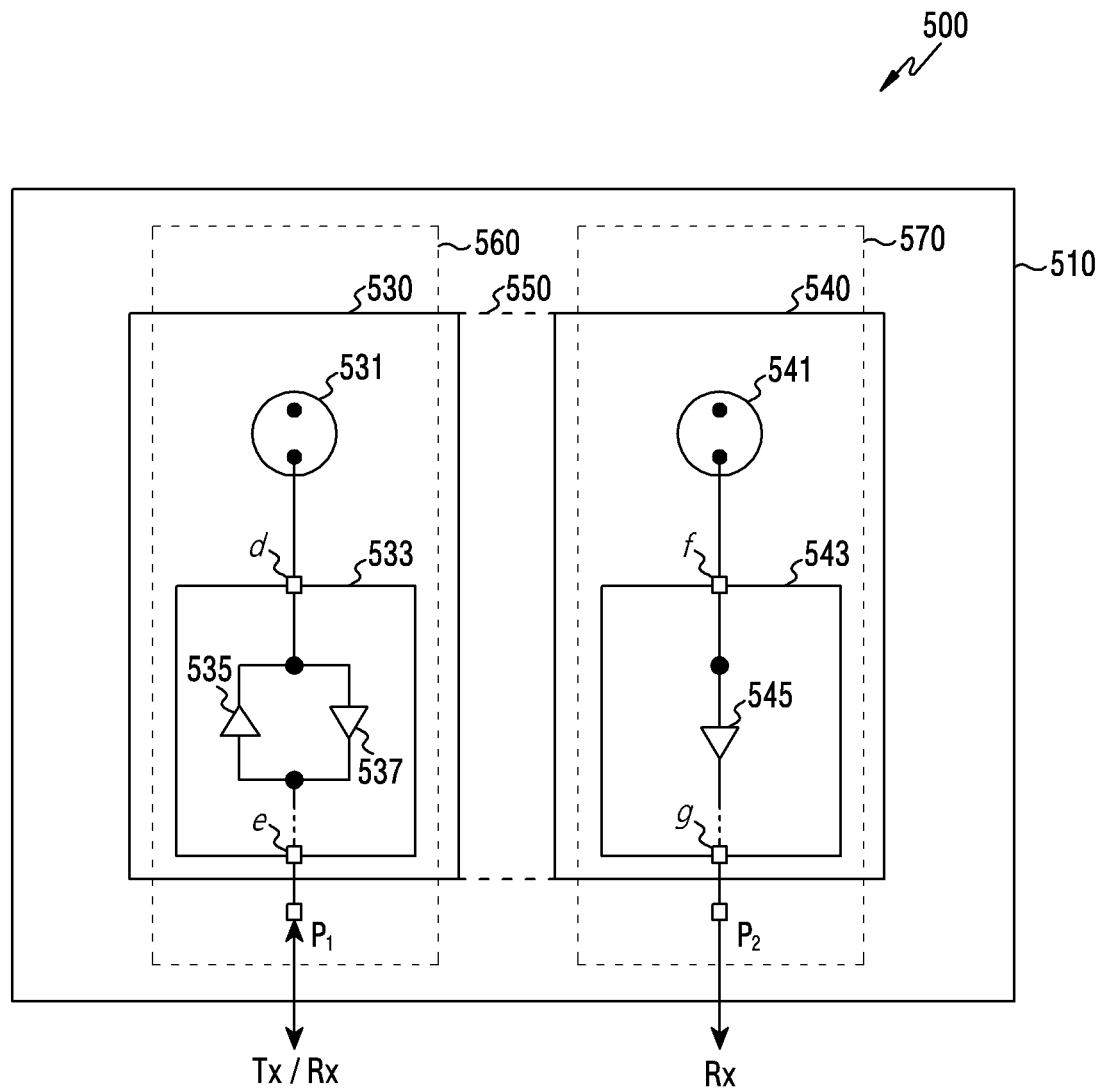
FIG. 5 is a view 500 illustrating a structure of an antenna module included in an electronic device, according to an embodiment.

FIG. 5 is a view 500 illustrating a structure of an antenna module 510 included in an electronic device 101 (for example, a portable communication device), according to an embodiment. In FIG. 5, it is assumed that the antenna module 510 does not include a communication circuit 340.

Referring to FIG. 5, the antenna module 510 may include a PCB in which a plurality of boards are complexly integrated (for example, a double side PCB or a multi-layer PCB, an exterior of which is formed with a flexible/rigid material). Components may be mounted only on some boards of the plurality of boards included in the PCB.

A first antenna 531 and a first front end chip 533 may be positioned in a first PCB 530, and a second antenna 541 and a second front end chip 543 may be positioned in a second PCB 540.

A third PCB 550 may connect the first PCB 530 and the second PCB 540. The third PCB 550 may be bendable to enable the first PCB 530 and the second PCB 540 to be disposed distantly in the electronic device 101 (for example, the portable communication device). The first PCB 530 and the second PCB 540 may be disposed in consideration of radiation characteristics of the first antenna 531 or the second antenna 541. One of the first PCB 530 and the second PCB 540 may be disposed adjacent to a rear surface of the electronic device 101, and the other one may be disposed adjacent to a side surface or a front surface of the electronic device 101. Additionally or alternatively, one of the first PCB 530 and the second PCB 540 may be disposed adjacent to one of four side surfaces of the electronic device 101, and the other one may be disposed adjacent to another one of the four side surfaces of the electronic device 101. When the first PCB 530, the second PCB 540 and the third PCB 550 are regarded as one PCB, the first PCB 530 and the second PCB 540 may be a rigid circuit board portion, and the third PCB 550 may be a flexible circuit board portion.

Even when more than two front end chips are disposed in one PCB 420, the suggested embodiments can be applied simply by changing a design. For example, a plurality of transmission reception selection paths may be disposed in the first PCB 530 to transmit and receive RF signals. A plurality of reception dedicated paths may be disposed in the second PCB 540 to receive RF signals.

The first front end chip 533 positioned in the first PCB 530 may include a transmission-reception circuit 323, and the second front end chip 543 positioned in the second PCB 540 may include a reception circuit 328. The transmission-reception circuit 323 may include a PA 535 to amplify a signal to be transmitted through the first antenna 531, and a first low noise amplifier 537 to amplify a signal received through the first antenna 531. The reception circuit 328 may not include a PA for amplifying a signal to be transmitted through the second antenna 541, and may include a second low noise amplifier 545 to amplify a signal received through the second antenna 541.

The PA 535 may form a portion of a transmission path electrically connecting a communication circuit 340 with the first antenna 531. The first low noise amplifier 537 may form a portion of a first reception path electrically connecting the first antenna 531 with the communication circuit 340. The second low noise amplifier 545 may form a portion of a second reception path electrically connecting the second antenna 541 with the communication circuit 340. The first front end chip 533 including the transmission-reception circuit may selectively connect the communication circuit 340 and the transmission path or the first reception path.

The other structures and operations are similar to those described above with reference to FIG. 4, and thus an additional explanation thereof is omitted.

FIGS. 4 and 5 illustrate an example in which two front end chips are mounted (or disposed) in one PCB. In addition, a transmission reception selection path may be formed by a first front end chip, which is one of the two front end chips disposed in the PCB. A reception dedicated path may be formed by a second front end chip which is the other one of the two front end chips.

The first front end chip forming the transmission reception selection path may include, for example, a PA positioned on a transmission path a, and a first low noise amplifier positioned on a reception path b. The second front end chip forming the reception dedicated path may include a low noise amplifier positioned on a reception path c.

A transmission reception selection path may be formed by a first front end chip which is one of two front end chips disposed in one PCB, and a reception dedicated path may be formed by a second front end chip which is the other one of the two front end chips.

The first front end chip may include a first PA positioned on a transmission path, and a first low noise amplifier positioned on a first reception path. The second front end chip may include a second PA positioned on a transmission path, and a second low noise amplifier positioned on a second reception path. The first PA and the first low noise amplifier may be set to operate in a frequency band which is used in a legacy network, and the second PA and the second low noise amplifier may be set to operate in a frequency band which is used in a 5G network.

Figure 6A:
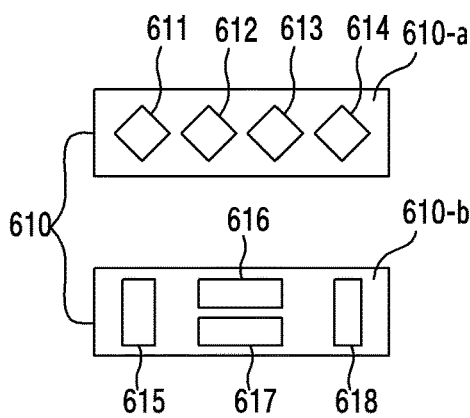
FIG. 6A is a view illustrating an implementation example of a printed circuit board (PCB) included in an antenna module in an electronic device, according to an embodiment.
Figure 6B:
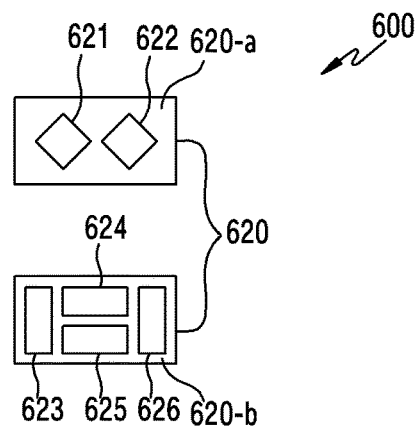
FIG. 6B is a view illustrating an implementation example of a PCB included in the antenna module in the electronic device, according to an embodiment.
Figure 6C:
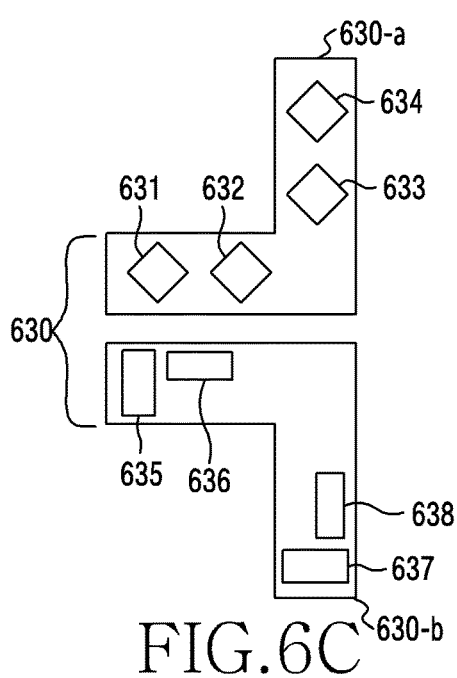
FIG. 6C is a view illustrating an implementation example of a PCB included in the antenna module in the electronic device, according to an embodiment.
Figure 6D:
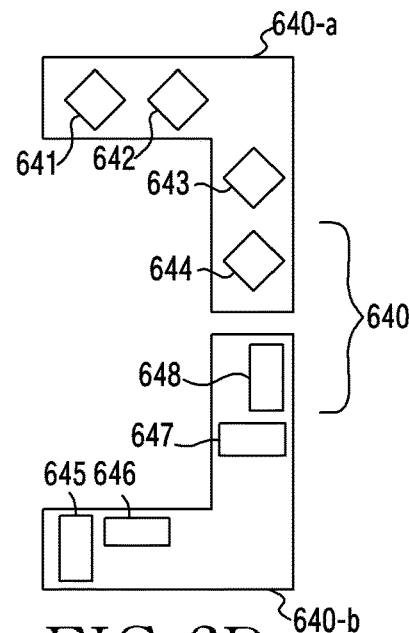
FIG. 6D is a view illustrating an implementation example of a PCB included in the antenna module in the electronic device, according to an embodiment.
Figure 6E:
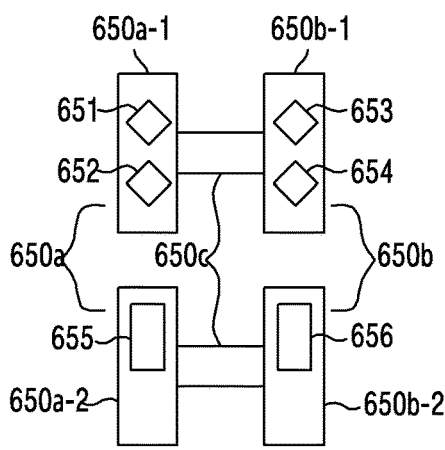
FIG. 6E is a view illustrating an implementation example of a PCB included in the antenna module in the electronic device, according to an embodiment.
Figure 6F:
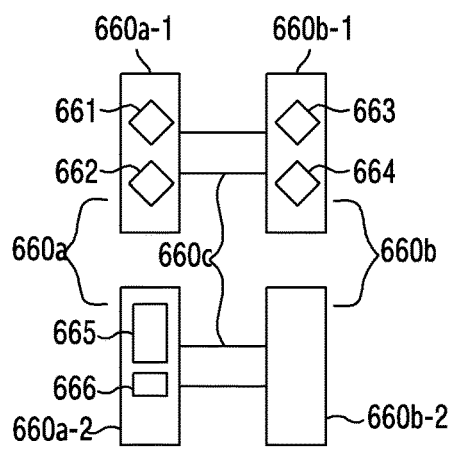
FIG. 6F is a view illustrating an implementation example of a PCB included in the antenna module in the electronic device, according to an embodiment.

FIG. 6A is a view 600 illustrating an implementation example of an antenna module 330 in an electronic device 101, according to an embodiment. FIG. 6B is a view 600 illustrating an implementation example of the antenna module 330 in the electronic device 101, according to according to an embodiment. FIG. 6C is a view 600 illustrating an implementation example of the antenna module 330 in the electronic device 101, according to an embodiment. FIG. 6D is a view 600 illustrating an implementation example of the antenna module 330 in the electronic device 101, according to according to an embodiment. FIG. 6E is a view 600 illustrating an implementation example of the antenna module 330 in the electronic device 101, according to according to an embodiment. FIG. 6F is a view 600 illustrating an implementation example of the antenna module 330 in the electronic device 101, according to according to an embodiment.

Referring to FIGS. 6A, 6B, 6C, and 6D, the antenna module 330 according includes at least one PCB 610, 620, 630, 640 including a plurality of antennas and at least one front end chip.

FIG. 6A illustrates an example in which the antenna module including the PCB 610 includes four antenna elements (a first antenna 611, a second antenna 612, a third antenna 613, and a fourth antenna 614), according to an embodiment.

Referring to FIG. 6A, the PCB 610 includes two surfaces (for example, a front surface and a back surface). In FIG. 6A, the first antenna 611, the second antenna 612, the third antenna 613, and the fourth antenna 614 are positioned on one side surface 610-a (for example, the front surface) of the PCB 610, and first front end chips 616 or second front end chips 617 may be positioned on the other surface 610-b (for example, the opposite surface of the one side surface 610-a) (for example, the back surface) of the PCB 610. In FIG. 6A, an RFIC 615 and a power management integrated circuit (PMIC) 618 are positioned on the other surface 610-b of the PCB 610.

With reference to FIG. 6A, at least one antenna element among the first antenna 611, the second antenna 612, the third antenna 613, and the fourth antenna 614 may be used to transmit and receive a wireless signal, and at least one of the other antenna elements may be used to receive a wireless signal.

With reference to FIG. 6A, the first front end chip 616 may be electrically connected to the first antenna element 611 and the second antenna element 612, and the second front end chip 617 may be electrically connected to the third antenna element 613 and the fourth antenna element 614. The first antenna element 611 and the second antenna element 612, and the first front end chip 616 may be electrically connected with each other through a via hole. Additionally or alternatively, the third antenna element 613 and the fourth antenna element 614, and the second front end chip 617 may be electrically connected with each other through a via hole.

FIG. 6B illustrates an example in which the antenna module including the PCB 620 includes two antenna elements (a first antenna element 621 and a second antenna element 622).

Referring to FIG. 6B, the PCB 620 includes two surfaces (for example, a front surface and a back surface). In FIG. 6B, the first antenna element 621 and the second antenna element 622 are positioned on one side surface 620-a (for example, the front surface) of the PCB 620, and a first front end chip 624 or a second front end chip 625 are positioned on the other surface 620-b (the opposite surface of the one side surface 610-a) (for example, the back surface) of the PCB 620. In FIG. 6B, an RFIC 623 and a PMIC 626 are positioned on the other surface 620-b of the PCB 620.

With reference to FIG. 6B, the first antenna 621 may be used to transmit and receive a wireless signal, and the second antenna 622 may be used to receive a wireless signal.

In the case of FIG. 6B, the first front end chip 624 may be electrically connected to the first antenna element 621, and the second front end chip 625 may be electrically connected to the second antenna element 622. The first antenna element 621 and the first front end chip 624 may be electrically connected with each other through a via hole. Additionally or alternatively, the second antenna element 622 and the second front end chip 625 may be electrically connected with each other through a via hole.

When the PCB has a multi-layer structure in FIGS. 6A and 6B, at least two antenna elements may be positioned on a top surface of an upper layer of the multi-layer PCB, and at least two front end chips may be positioned a top surface of a lower plate of the multi-layer PCB.

FIG. 6C illustrates an example in which the antenna module including the PCB 630 includes four antenna elements (a first antenna 631, a second antenna 632, a third antenna 633, and a fourth antenna 634).

Referring to FIG. 6C, the PCB 630 includes two surfaces (for example, a front surface and a back surface). In FIG. 6C, the first antenna 631, the second antenna 632, the third antenna 633, and the fourth antenna 634 are positioned on one side surface 630-a (for example, the front surface) of the PCB 630, and a first front end chip 636 or a second front end chip 637 may be positioned on the other surface 630-b (the opposite surface of the one side surface 630-a) (for example, the back surface) of the PCB 630. In FIG. 6C, an RFIC 635 and a PMIC 638 may further be positioned on the other surface 630-b of the PCB 630.

With reference to FIG. 6C, the first antenna 631 and the second antenna element 632, which are positioned on a lower portion in a breadth axis (x axis) direction (horizontal direction) among the first antenna 631, a second antenna 632, a third antenna 633, and a fourth antenna 634 may be used to transmit and receive wireless signals, and the third antenna 633 and the fourth antenna 634, which are disposed on the right side in a height axis (y axis) direction (vertical direction) may be used to receive wireless signals. Additionally or alternatively, the third antenna 633 and the fourth antenna 634 may be disposed on the right side in the height axis (y axis) direction (vertical direction) and may be used to transmit and receive wireless signals, and the first antenna element 631 and the second antenna element 632 may be disposed on the lower portion in the breadth axis (x axis) direction (horizontal direction) and may be used to receive wireless signals.

With reference to FIG. 6C, the first front end chip 636 may be electrically connected to the first antenna 631 and the second antenna 632, and the second front end chip 637 may be electrically connected to the third antenna 633 and the fourth antenna 634. For example, the first antenna 631, the second antenna 632 and the first front end chip 636 may be electrically connected with each other through a via hole. Additionally or alternatively, the third antenna 633, the fourth antenna 634 and the second front end chip 637 may be electrically connected with each other through a via hole.

With reference to FIG. 6C, the RFIC 635 and the first front end chip 636 are disposed on an upper portion in the breadth axis (x axis) direction (horizontal direction), and the second front end chip 637 and the PMIC 638 are disposed on the right side in the height axis (y axis) direction (vertical direction).

FIG. 6D illustrates another example in which the antenna module including the PCB 640 includes four antenna elements (a first antenna 641, a second antenna 642, a third antenna 643, and a fourth antenna 644).

Referring to FIG. 6D, the PCB 640 includes two surfaces (for example, a front surface and a back surface). In FIG. 6D, the first antenna 641, the second antenna 642, the third antenna 643, and the fourth antenna 644 are positioned on one side surface 640-*a* (for example, the front surface) of the PCB 640, and a first front end chip 646 or a second front end chip 647 may be positioned on the other surface 640-*b* (the opposite surface of the one side surface 640-*a*) (for example, the back surface) of the PCB 640. In FIG. 6D, an RFIC 645 and a PMIC 648 may further be positioned on the other surface 640-*b* of the PCB 640.

With reference to FIG. 6D, the first antenna 641 and the second antenna 642 are disposed on an upper portion in the breadth axis (x axis) direction (horizontal direction) among the first antenna 641, the second antenna 642, the third antenna 643, and the fourth antenna 644 and may be used to transmit and receive wireless signals, and the third antenna 643 and the fourth antenna 644 are disposed on the right side in the height axis (y axis) direction (vertical direction) and may be used to receive wireless signals. Additionally or alternatively, the third antenna 643 and the fourth antenna 644 are disposed on the right side in the height axis (y axis) direction (vertical direction) and may be used to transmit and receive wireless signals, and the first antenna 641 and the second antenna 642 are disposed on the upper portion in the breadth axis (x axis) direction (horizontal direction) and may be used to receive wireless signals.

With reference to the FIG. 6D the first front end chip 646 may be electrically connected to the first antenna 641 and the second antenna 642, and the second front end chip 647 may be electrically connected to the third antenna 643 and the fourth antenna 644. The first antenna 641, the second antenna 642 and the first front end chip 646 may be electrically connected with each other through a via hole. Additionally or alternatively, the third antenna 643, the fourth antenna 644 and the second front end chip 647 may be electrically connected with each other through a via hole.

With reference to FIG. 6D, the RFIC 645 and the first front end chip 646 are disposed on a lower portion in the breadth axis (x axis) direction (horizontal direction), and the second front end chip 647 and the PMIC 648 are disposed on the right side in the height axis (y axis) direction (vertical direction).

When the PCB has a multi-layer structure in FIGS. 6C and 6D, at least two antenna elements may be positioned on a top surface of an upper plate of the multi-layer PCB, and at least two front end chips may be positioned on a top surface of a lower plate of the multi-layer PCB.

FIG. 6E illustrates an example in which an antenna module including three PCBs 650*a*, 650*b*, 650*c* includes four antenna elements (a first antenna 651, a second antenna 652, a third antenna 653, and a fourth antenna 654), according to an embodiment.

Referring to FIG. 6E, the antenna module 310 includes a plurality of PCBs 650*a*, 650*b*, 650*c* including a plurality of antennas and one or a plurality of front end chips. Each of the plurality of PCBs 650*a*, 650*b*, 650*c* may include two surfaces (for example, a front surface and a back surface). In FIG. 6E, the first PCB 650*a* and the second PCB 650*b* may be connected with each other by the third PCB 650*c*. The third PCB 650*c* may be a flexible PCB (FPCB).

In FIG. 6E, the first antenna 651 and the second antenna 652 are positioned on a first surface 650*a*-1 (for example, the front surface) corresponding to one side surface of the first PCB 650*a*, and a first front end chip 655 are positioned on a second surface 650*a*-2 (the opposite surface of the one side surface 650*a*-1) (for example, the back surface) corresponding to the other surface of the first PCB 650*a*. The first antenna 651 and the second antenna 652 may be connected to the first front end chip 655. An RFIC and a PMIC are positioned on the second surface 650*a*-2 of the first PCB 650*a*. Additionally or alternatively, a connection member (a connector) is positioned on the second surface 650*a*-2 of the first PCB 650*a* to connect a main PCB.

The third antenna 653 and the fourth antenna 654 are positioned on a first surface 650*b*-1 (for example, the front surface) corresponding to one side surface of the second PCB 650*b*, and a second front end chip 656 are positioned on a second surface 650*b*-2 (the opposite surface of the one side surface 650*b*-1) (for example, the back surface) corresponding to the other surface of the second PCB 650*b*. The third antenna 653 and the fourth antenna 654 are connected to the second front end chip 656. An RFIC and a PMIC are positioned on the second surface 650*b*-2 of the second PCB 650*b*. A connection member (connector) is positioned on the second surface 650*b*-2 of the second PCB 650*b* to connect the main PCB (for example, the first PCB 310 of FIG. 3).

FIG. 6F illustrates another example in which an antenna module including three PCBs 660*a*, 660*b*, 660*c* includes four antenna elements (a first antenna 661, a second antenna 662, a third antenna 663, and a fourth antenna 664).

Referring to FIG. 6F, the antenna module 330 includes the plurality of PCBs 660*a*, 660*b*, 660*c* including a plurality of antennas and one or a plurality of front end chips. Each of the plurality of PCBs 660*a*, 660*b*, 660*c* may include two surfaces (for example, a front surface and a back surface). In FIG. 6F, the first PCB 660*a* and the second PCB 660*b* are connected with each other by the third PCB 660*c*. The third PCB 660*c* may be a FPCB.

In FIG. 6F, the first antenna 661 and the second antenna 662 are positioned on a first surface 660*a*-1 (for example, the front surface) corresponding to one side surface of the first PCB 660*a*, and, in FIG. 6F, the third antenna 663 and the fourth antenna 664 (for example, antennas for receiving) are positioned on a first surface 660*b*-1 (for example, the front surface) corresponding to one side surface of the second PCB 660*b*. A first front end chip 665 and a second front end chip 666 are positioned on a second surface 660*a*-2 (the opposite surface of the one side surface 660*a*-1) (for example, the back surface) corresponding to the other surface of the first PCB 660*a*. The first antenna 661 and the second antenna 662 are connected to the first front end chip 665. The third antenna 663 and the fourth antenna 664 are connected to the second front end chip 666.

In FIG. 6F, an RFIC and a PMIC are positioned on the second surface 660*a*-2 of the first PCB 660*a*. Additionally or alternatively, a connection member (a connector) is positioned on the second surface 660*a*-2 of the first PCB 660*a* to connect a main PCB. Additionally or alternatively, in FIG. 6F, a connection member for connecting the RFIC, the PMIC, and the main PCB is positioned on the second surface 660*b*-2 of the second PCB 660*b*.

FIG. 7A is a view illustrating an example arrangement of antenna arrays included in an antenna module in an electronic device 101, according to an embodiment. FIG. 7B is a view illustrating an example arrangement of antenna arrays included in the antenna module in the electronic device 101, according to an embodiment. FIG. 7C is a view illustrating an example arrangement of antenna arrays included in the antenna module in the electronic device 101, according to an embodiment. FIG. 7D is a view illustrating an example arrangement of antenna arrays included in the antenna module in the electronic device 101, according to an embodiment. FIG. 7E is a view illustrating an example arrangement of antenna arrays included in the antenna module in the electronic device 101, according to an embodiment. FIG. 7F is a view illustrating an example arrangement of antenna arrays included in the antenna module in the electronic device 101, according to an embodiment. FIG. 7G is a view illustrating an example arrangement of antenna arrays included in the antenna module in the electronic device 101, according to an embodiment. FIG. 7H is a view illustrating an example arrangement of antenna arrays included in the antenna module in the electronic device 101, according to an embodiment. FIG. 7I is a view illustrating an example arrangement of antenna arrays included in the antenna module in the electronic device 101, according to an embodiment. FIG. 7J is a view illustrating an example arrangement of antenna arrays included in the antenna module in the electronic device 101, according to an embodiment. FIG. 7K is a view illustrating an example arrangement of antenna arrays included in the antenna module in the electronic device 101, according to an embodiment. FIG. 7L is a view illustrating an example arrangement of antenna arrays included in the antenna module in the electronic device 101, according to an embodiment.

A first antenna array and a second antenna array may be positioned on one surface of one or a plurality of PCBs included in the antenna module 330. The first antenna array may include a plurality of antenna elements. The second antenna array may include a plurality of antenna elements. In FIGS. 7A, 7B, 7C, 7D, 7E, 7F, 7G, 7H, 7I, 7J, 7K, and 7L, it is assumed that the first antenna array includes two antenna elements, and the second antenna array also includes two antenna elements.

In FIGS. 7A, 7B, 7C, 7D, 7E, 7F, 7G, 7H, 7I, 7J, 7K, and 7L, various embodiments regarding positions of one or a plurality of PCBs disposed in the antenna module in the electronic device 101, and positions of the first array antenna and the second array antenna in the one or plurality of PCBs are illustrated. In the drawings, the arrangements of the one or plurality of PCBs disposed in the electronic device are displayed by dashed lines, and the first array antenna and the second array antenna positioned in the one or plurality of PCBs are displayed on corresponding PCBs by solid lines. Shapes of the one or plurality of PCBs displayed by the dashed lines may not completely be the same as really implemented shapes, but the plurality of PCBs may have curved shapes according to positions of the first array antenna and the second array antenna. In addition, FIGS. 7A, 7B, 7C, 7D, 7E, 7F, 7G, 7H, 7I, 7J, 7K, and 7L illustrate various examples of different positions of two antenna elements disposed in the first and second array antennas positioned on the PCB.

An orthogonal coordinate system may be used in explaining the arrangements of the plurality of array antennas disposed in the electronic device 101, which will be described below. For example, a direction in which an X axis faces on the orthogonal coordinate system indicates a breadth direction of the electronic device 101, a direction in which a Y axis faces indicates a height direction of the electronic device 101, and a direction in which a Z axis faces indicates a thickness direction. The X axis and the Z axis may be a horizontal direction, and the Y axis may be a vertical direction.

The electronic device 101 may include a front surface (first plate) (for example, the display device 160 of FIG. 1) which faces in the Z (+) axis direction, a rear surface (second plate) (for example, a back cover) which faces in the Z (−) axis direction, and a plurality of side surfaces (for example, side surface members) which surround between the front surface and the rear surface, and face in the X axis direction and the Y axis direction. The plurality of side surfaces may include an upper side surface facing in the Y (+) axis direction, a lower side surface facing in the Y (−) axis direction, a right side surface facing in the X (+) axis direction, and a left side surface facing in the X (−) axis direction.

Referring to FIG. 7A, in the electronic device 101, one side surface (for example, a front surface or a back surface) of a PCB 710*a* on which first and second array antennas 711*a*, 713*a* are positioned is disposed to face in the Z (−) axis direction (for example, the rear surface) of the electronic device 101. The first and second array antennas 711*a*, 713*a* are disposed on one corner region of the electronic device 101, adjacent to each other.

Two antenna elements included in the first array antenna 711*a* positioned in the PCB 710*a* are disposed in the up-down vertical direction (Y axis direction), and two antenna elements included in the second array antenna 713*a* positioned in the PCB 710*a* are disposed in the left-right horizontal direction (X axis direction). The direction in which the two antenna elements included in the first array antenna 711*a* are disposed, and the direction in which the two antenna elements included in the second array antenna 713*a* are disposed may be perpendicular to each other.

Referring to FIG. 7B, in the electronic device 101, one side surface (for example, a front surface or a back surface) of a PCB 710*b* on which first and second array antennas 711*b*, 713*b* are positioned are disposed to face in the Z (−) axis direction (for example, the rear surface) of the electronic device 101. The first and second array antennas 711*b*, 713*b* are disposed on one corner region of the electronic device 101, adjacent to each other.

Two antenna elements included in the first array antenna 711*b* positioned in the PCB 710*b* are disposed in the left-right horizontal direction (X axis direction), and two antenna elements included in the second array antenna 713*b* positioned in the PCB 710*b* are disposed in the up-down vertical direction (Y axis direction). The direction in which the two antenna elements included in the first array antenna 711*b* are disposed, and the direction in which the two antenna elements included in the second array antenna 713*b* are disposed may be perpendicular to each other.

Referring to FIG. 7C, in the electronic device 101, one side surface (for example, a front surface or a back surface) of a first portion (for example, the first PCB 530 of FIG. 5) of a PCB 710*c* on which a first array antenna 711*c* is positioned is disposed to face in the Z (−) axis direction (for example, the rear surface) of the electronic device 101, and one side surface (for example, a front surface or a back surface) of a second portion (for example, the second PCB 540 of FIG. 5) of the PCB 710*c* on which a second array antenna 713*c* is positioned is disposed to face in the X (+) axis direction (for example, a right side surface) of the electronic device 101. The first and second array antennas 711*c*, 713*c* are disposed on one corner region of the electronic device 101, adjacent to each other. The first portion and the second portion of the PCB 710*c* may be connected with each other by a third portion (for example, the third PCB 550 of FIG. 5).

Two antenna elements included in the first array antenna 711c positioned in the first portion of the PCB 710c are disposed in the up-down vertical direction (Y axis direction), and two antenna elements included in the second array antenna 713c positioned in the second portion of the PCB 710c are disposed in front-back horizontal direction (Z axis direction). The direction in which the two antenna elements included in the first array antenna 711c are disposed, and the direction in which the two antenna elements included in the second array antenna 713c are disposed may be perpendicular to each other.

Referring to FIG. 7D, in the electronic device 101, one side surface (for example, a front surface or a back surface) of a first portion (for example, the first PCB 530 of FIG. 5) of a PCB 710d on which a first array antenna 711d is positioned is disposed to face in the Z (−) axis direction (for example, the rear surface) of the electronic device 101, and one side surface (for example, a front surface or a back surface) of a second portion (for example, the second PCB 540) of the PCB 710d on which a second array antenna 713d is positioned is disposed to face in the X (+) direction (for example, a right side surface) of the electronic device 101. The first and second array antennas 711d, 713d are disposed on one corner region of the electronic device 101, adjacent to each other. The first portion and the second portion of the PCB 710d may be connected with each other by a third portion (for example, the third PCB 550 of FIG. 5).

Two antenna elements included in the first array antenna 711d positioned in the first portion of the PCB 710d are disposed in the left-right horizontal direction (X axis direction), and two antenna elements included in the second array antenna 713d positioned in the second portion of the PCB 710d are disposed in the up-down vertical direction (Y axis direction). The direction in which the two antenna elements included in the first array antenna 711d are disposed, and the direction in which the two antenna elements included in the second array antenna 713d are disposed may be perpendicular to each other.

Referring to FIG. 7E, in the electronic device 101, one side surface (for example, a front surface or a back surface) of a first portion (for example, the first PCB 530 of FIG. 5) of a PCB 710e on which a first array antenna 711e is positioned is disposed to face in the Z (−) axis direction (for example, the rear surface) of the electronic device 101, and one side surface (for example, a front surface or a back surface) of a second portion (for example, the second PCB 540 of FIG. 5) of the PCB 710e on which a second array antenna 713e is positioned is disposed to face in the Z (+) axis direction (for example, the front surface) of the electronic device 101. The first and second array antennas 711e, 713e are disposed on one corner region of the electronic device 101 to face in the opposite directions. The first portion and the second portion of the PCB 710e may be connected with each other by a third portion (for example, the third PCB 550 of FIG. 5).

Two antenna elements included in the first array antenna 711e positioned in the first portion of the PCB 710e are disposed in the left-right horizontal direction (X axis direction), and two antenna elements included in the second array antenna 713e positioned in the second portion of the PCB 710e are disposed in the up-down vertical direction (Y axis direction). The direction in which the two antenna elements included in the first array antenna 711e are disposed, and the direction in which the two antenna elements included in the second array antenna 713e are disposed may be perpendicular to each other.

Referring to FIG. 7F, in the electronic device 101, one side surface (for example, a front surface or a back surface) of a first portion (for example, the first PCB 530 of FIG. 5) of a PCB 710f on which a first array antenna 711f is positioned is disposed to face in the Z (−) axis direction (for example, the rear surface) of the electronic device 101, and one side surface (for example, a front surface or a back surface) of a second portion (for example, the second PCB 540 of FIG. 5) of the PCB 710f on which a second array antenna 713f is positioned is disposed to face in the Z (+) axis direction (for example, the front surface) of the electronic device 101. The first and second array antennas 711f, 713f are disposed on one corner region of the electronic device 101 to face in the opposite directions. The first portion and the second portion of the PCB 710f may be connected with each other by a third portion (for example, the third PCB 550 of FIG. 5).

Two antenna elements included in the first array antenna 711f positioned in the first portion of the PCB 710f are disposed in the up-down vertical direction (Y axis direction), and two antenna elements included in the second array antenna 713f positioned in the second portion of the PCB 710f are disposed in the left-right horizontal direction (X axis direction). The direction in which the two antenna elements included in the first array antenna 711f are disposed, and the direction in which the two antenna elements included in the second array antenna 713f are disposed may be perpendicular to each other.

Referring to FIG. 7G, in the electronic device 101, one side surface (for example, a front surface or a back surface) of a first portion (for example, the first PCB 530 of FIG. 5) of a PCB 710g on which a first array antenna 711g is positioned is disposed to face in the Y (+) axis direction (for example, an upper side surface) of the electronic device 101, and one side surface (for example, a front surface or a back surface) of a second portion (for example, the second PCB 540 of FIG. 5) on which a second array antenna 713g is positioned is disposed to face in the X (+) axis direction (for example, a right side surface) of the electronic device 101. The first and second array antennas 711g, 713g are disposed on one corner region of the electronic device 101, adjacent to each other. The first portion and the second portion of the PCB 710g may be connected with each other by a third portion (for example, the third PCB 550 of FIG. 5).

Two antenna elements included in the first array antenna 711g positioned in the first portion of the PCB 710g are disposed in the front-back horizontal direction (Z axis direction), and two antenna elements included in the second array antenna 713g positioned in the second portion of the PCB 710g are positioned in the up-down vertical direction (Y axis direction). The direction in which the two antenna elements included in the first array antenna 711g are disposed, and the direction in which the two antenna elements included in the second array antenna 713g are disposed may be perpendicular to each other.

Referring to FIG. 7H, in the electronic device 101, one side surface (for example, a front surface or a back surface) of a first portion (for example, the first PCB 530 of FIG. 5) of a PCB 710h on which a first array antenna 711h is positioned is disposed to face in the Y (+) axis direction (for example, an upper side surface) of the electronic device 101, and one side surface (for example, a front surface or a back surface) of a second portion (for example, the second PCB 540 of FIG. 5) on which a second array antenna 713h is positioned is disposed to face in the X (+) axis direction (for example, a right side surface) of the electronic device 101. The first and second array antennas 711h, 713h are disposed on one corner region of the electronic device 101, adjacent to each other. The first portion and the second portion of the PCB 710*h* may be connected with each other by a third portion (for example, the third PCB 550 of FIG. 5).

Two antenna elements included in the first array antenna 711*h* positioned in the first portion of the PCB 710*h* are positioned in the left-right horizontal direction (X axis direction), and two antenna elements included in the second array antenna 713*h* positioned in the second portion of the PCB 710*h* are positioned in the front-back horizontal direction (Z axis direction). The direction in which the two antenna elements included in the first array antenna 711*h* are disposed, and the direction in which the two antenna elements included in the second array antenna 713*h* are disposed may be perpendicular to each other.

Referring to FIG. 7I, in the electronic device 101, one side surface (for example, a front surface or a back surface) of a first portion (for example, the first PCB 530 of FIG. 5) of a PCB 710*i* on which a first array antenna 711*i* is positioned is disposed to face in the Z (−) axis direction (for example, the rear surface) of the electronic device 101, and one side surface (for example, a front surface or a back surface) of a second portion (for example, the second PCB 540 of FIG. 5) of the PCB 710*i* on which a second array antenna 713*i* is positioned is disposed to face in the X (+) axis direction (for example, a right side surface) of the electronic device 101. The first and second array antennas 711*i*, 713*i* are disposed on one corner region of the electronic device 101, adjacent to each other. The first portion and the second portion of the PCB 710*i* may be connected with each other by a third portion (for example, the third PCB 550 of FIG. 5).

Two antenna elements included in the first array antenna 711*i* positioned in the first portion of the PCB 710*i* are disposed in the up-down vertical direction (Y axis direction), and two antenna elements included in the second array antenna 713*i* positioned in the second portion of the PCB 710*i* are disposed in the up-down vertical direction (Y axis direction). The direction in which the two antenna elements included in the first array antenna 711*i* are disposed, and the direction in which the two antenna elements included in the second array antenna 713*i* are disposed may be parallel to each other.

Referring to FIG. 7J, in the electronic device 101, one side surface (for example, a front surface or a back surface) of a first portion (for example, the first PCB 530 of FIG. 5) of a PCB 710*j* on which a first array antenna 711*j* is positioned is disposed to face in the Z (−) axis direction (for example, the rear surface) of the electronic device 101, and one side surface (for example, a front surface or a back surface) of a second portion (for example, the second PCB 540 of FIG. 5) of the PCB 710*j* on which a second array antenna 713*j* is positioned is disposed to face in the X (+) axis direction (for example, a right side surface) of the electronic device 101. The first and second array antennas 711*j*, 713*j* are disposed on one corner region of the electronic device 101, adjacent to each other. The first portion and the second portion of the PCB 710*j* may be connected with each other by a third portion (for example, the third PCB 550 of FIG. 5).

Two antenna elements included in the first array antenna 711*j* positioned in the first portion of the PCB 710*j* are disposed in the left-right horizontal direction (X axis direction), and two antenna elements included in the second array antenna 713*j* positioned in the second portion of the PCB 710*j* are disposed in the front-back horizontal direction (Z axis direction).

Referring to FIG. 7K, in the electronic device 101, one side surface (for example, a front surface or a back surface) of a first portion (for example, the first PCB 530 of FIG. 5) of a PCB 710*k* on which a first array antenna 711*k* is positioned is disposed to face in the Y (+) axis direction (for example, an upper side surface) of the electronic device 101, and one side surface (for example, a front surface or a back surface) of a second portion (for example, the second PCB 540 of FIG. 5) of the PCB 710*k* on which a second array antenna 713*k* is positioned is disposed to face in the X (+) axis direction (for example, a right side surface) of the electronic device 101. The first and second array antennas 711*k*, 713*k* are disposed on one corner region of the electronic device 101, adjacent to each other. The first portion and the second portion of the PCB 710*k* may be connected with each other by a third portion (for example, the third PCB 550 of FIG. 5).

Two antenna elements included in the first array antenna 711*k* positioned in the first portion of the PCB 710*k* are disposed in the left-right horizontal direction (X axis direction), and two antenna elements included in the second array antenna 713*k* positioned in the second portion of the PCB 710*k* are disposed in the up-down vertical direction (Y axis direction).

Referring to FIG. 7L, in the electronic device 101, one side surface (for example, a front surface or a back surface) of a first portion (for example, the first PCB 530 of FIG. 5) of a PCB 710*l* on which a first array antenna 711*l* is positioned is disposed to face in the Y (+) axis direction (for example, an upper side surface) of the electronic device 101, and one side surface (for example, a front surface or a back surface) of a second portion (for example, the second PCB 540 of FIG. 5) of the PCB 710*l* on which a second array antenna 713*l* is positioned is disposed to face in the X (+) axis direction (for example, a right side surface) of the electronic device 101. The first and second array antennas 711*l*, 713*l* are disposed on one corner region of the electronic device 101, adjacent to each other. The first portion and the second portion of the PCB 710*l* may be connected with each other by a third portion (for example, the third PCB 550 of FIG. 5).

Two antenna elements included in the first array antenna 711*l* positioned in the first portion of the PCB 710*l* are disposed in the front-back horizontal direction (Z axis direction), and two antenna elements included in the second array antenna 713*l* positioned in the second portion of the PCB 710*l* are disposed in the front-back horizontal direction (Z axis direction). The direction in which the two antenna elements included in the first array antenna 711*l* are disposed, and the direction in which the two antenna elements included in the second array antenna 713*l* are disposed may be parallel to each other.

In various embodiments of FIGS. 7A, 7B, 7C, 7D, 7E, 7F, 7G, 7H, 7I, 7J, 7K, and 7L, the antenna modules of the same shape are used, but in other various embodiments, array antenna structures of various shapes may be formed by using antenna modules of different shapes.

FIGS. 7A, 7B, 7C, 7D, 7E, 7F, 7G, 7H, 7I, 7J, 7K, and 7L illustrate examples in which the antenna array is implemented by complexly using a 1×2 array antenna and/or a 2×1 array antenna. In another example, the antenna array may be implemented by placing two antenna modules utilizing array antennas of different sizes in the electronic device 101.

Figure 8:
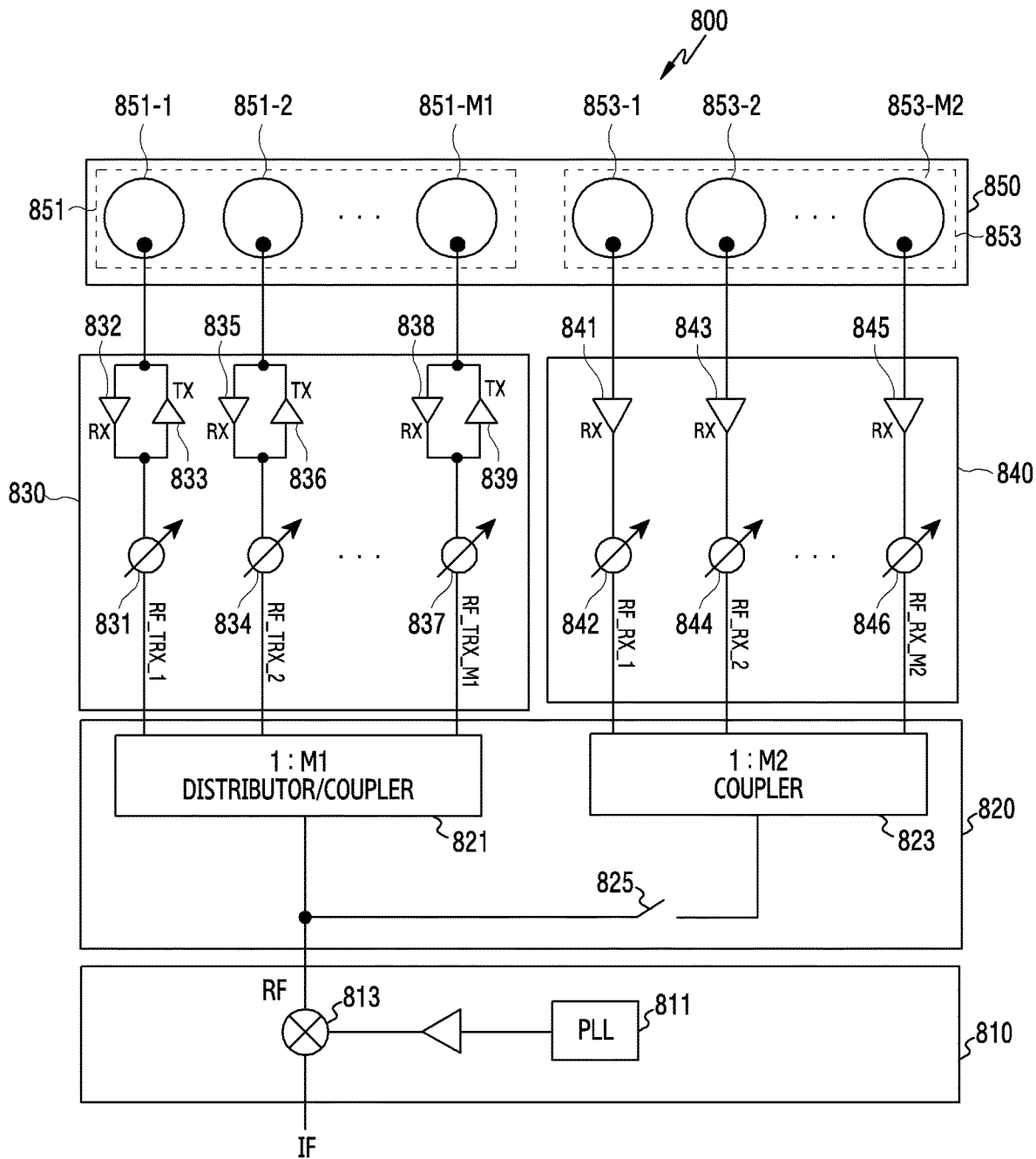
FIG. 8 is a view illustrating a structure of an antenna module which constitutes a communication module of an electronic device, according to an embodiment.

FIG. 8 is a view 800 illustrating a structure of an antenna module included in an electronic device 101, according to an embodiment. The antenna module may include a plurality of antenna elements 851-1, 851-2, . . . , and 851-M1, and 853-1, 853-2, . . . , and 853-M2, PAs 833, 836, 839 to amplify transmission signals, low noise amplifiers 832, 835, 838, 841, 843, and 845, or phase shifters 831, 834, 837, 842, 844, and 846.

Referring to FIG. 8, the electronic device 101 includes an RFIC 810, a distribution-coupling circuit 820, a first front end chip 830, a second front end chip 840, and/or an antenna structure 850 to transmit and receive signals of a high frequency band (for example, about 15 GHz to 100 GHz). The first front end chip 830 may include a transmission-reception circuit 323, and the second front end chip 840 may include a reception circuit 328. Although it is illustrated that the distribution-coupling circuit 820 is an independent configuration, a distributor/coupler 821 included in the distribution-coupling circuit 820 may be included in the first front end chip 830, and a coupler 823 included in the distribution-coupling circuit 820 may be included in the second front end chip 840.

The antenna structure 850 includes a first antenna array 851 or a second antenna array 853. The antenna structure 850 includes at least one PCB. The first antenna array 851 may include a number M1 of first antenna elements 851-1, 851-2, . . . , and 851-M1. The second antenna array 853 may include a number M2 of second antenna elements 853-1, 853-2, . . . , and 853-M2. The antenna structure 850 may include a first antenna and a second antenna. The first antenna may include at least one of the first antenna elements 851-1, 851-2, . . . , and 851-M1. The second antenna may include at least one of the second antenna elements 853-1, 853-2, . . . , and 853-M2.

The RFIC 810 includes a phase locked loop (PLL) 811 or a mixer 813. The PLL 811 may generate a reference signal for up-converting/down converting. The mixer 813 may mix an IF signal to be transmitted with the reference signal, and may output an up-converted RF signal. The mixer 813 may mix a received RF signal with the reference signal, and may output a down-converted IF signal.

The distribution-coupling circuit 820 includes a 1:M1 distributor/coupler 821 (hereinafter, referred to as a "distributor/coupler" 821), a 1:M2 coupler 823 (hereinafter, referred to as a "coupler" 823), or a switch 825. The distributor/coupler 821 may divide one RF transmission signal into M1 RF transmission signals, and may couple M1 RF reception signals to one RF reception signal. The coupler 823 may couple M2 RF reception signals to one RF reception signal. The switch 825 may cause one RF reception signal outputted from the coupler 823 to be delivered to the RFIC 810, or not to be delivered to the RFIC 810.

The first front end chip 830 includes a plurality of transmission-reception circuits. All or some of the plurality of transmission-reception circuits may include, for example, the PAs 833, 836, and 839, the low noise amplifiers 832, 835, and 838, and/or the phase shifters 831, 834, and 837.

The phase shifters 831, 834, and 837 may shift a phase of one corresponding transmission RF signal among M1 transmission RF signals outputted from the distributor/coupler 821, and may apply the transmission RF signal to one corresponding PA among the PAs 833, 836, and 839. The first phase shifter 831 may shift a phase of a first transmission RF signal outputted from the distributor/coupler 821, and may apply the first transmission RF signal to the first PA 833. Additionally or alternatively, the M1-th phase shifter 837 may shift a phase of an M1-th transmission RF signal outputted from the distributor/coupler 821, and may apply the M1-th transmission RF signal to the M1-th PA 839.

The PAs 833, 836, and 839 may amplify a power of a transmission RF signal provided from at least one corresponding phase shifter among the phase shifters 831, 834, and 837, and may output the transmission RF signal. The first PA 833 may amplify a power of the first transmission RF signal provided from the first phase shifter 831, and may output the first transmission RF signal. Additionally or alternatively, the M1-th PA 839 may amplify a power of the M1-th transmission RF signal provided from the M1-th phase shifter 837, and may output the M1-th transmission RF signal.

The transmission RF signal outputted by at least one of the PAs 833, 836, and 839 may be applied to at least one antenna element among the M1 antenna elements 851-1, 851-2, . . . , and 851-M1 included in the first antenna array 851 of the antenna structure 850.

At least one of the low noise amplifiers 832, 835, and 838 may low-noise amplify a reception RF signal provided from at least one antenna element among the M1 antenna elements 851-1, 851-2, . . . , and 851-M1 included in the first antenna array 851 of the antenna structure 850, and may output the reception RF signal. The reception RF signal outputted by at least one of the low noise amplifiers 832, 835, and 838 may be applied to at least one phase shifter of the phase shifters 831, 834, and 837.

At least one of the phase shifters 831, 834, and 837 may shift a phase of one reception RF signal outputted from at least one low noise amplifiers among the low noise amplifiers 832, 835, and 838, and may apply the reception RF signal to the distributor/coupler 821.

The second front end chip 840 may include the low noise amplifiers 841, 843, and 845 and/or the phase shifters 842, 844, and 846.

At least one of the low noise amplifiers 841, 843, and 845 may low-noise amplify a reception RF signal provided from at least one antenna element among the M2 antenna elements 853-1, 853-2, and 853-M2 included in the second antenna array 853 of the antenna structure 850, and may output the reception RF signal. The reception RF signal outputted by at least one of the low noise amplifiers 841, 843, and 845 may be applied to at least one phase shifter among the phase shifters 842, 844, and 846.

At least one of the phase shifters 842, 844, and 846 may shift a phase of the reception RF signal outputted from at least one low noise amplifier among the low noise amplifiers 841, 843, and 845, and may apply the reception RF signal to the coupler 823.

The antenna structure 850 includes the first antenna array 851 including the M1 first antenna elements 851-1, 852-2, . . . , and 851-M1, and the second antenna array 853 including the M2 second antenna elements 853-1, 853-2, . . . , and 853-M2. The first antenna elements 851-1, 851-2, . . . , and 851-M1 may be antenna elements that can both transmit and receive signals, and the second antenna elements 853-1, 853-2, . . . , and 853-M2 may be antenna elements that can only receive signals.

The first antenna elements 851-1, 851-2, . . . , and 851-M1 of the first antenna array 851 are coupled with transmission-reception circuits of the first front end chip 830, and the second antenna elements 853-1, 853-2, . . . , and 853-M2 of the second antenna array 853 are coupled with at least one reception circuit 328 of the second front end chip 840. The first antenna elements 851-1, 851-2, . . . , and 851-M1 are coupled with the at least one transmission-reception circuit 328 of the first front end chip 830 one to one or one to many. The second antenna elements 853-1, 853-2, . . . , and 853-M2 are also coupled with the reception circuits of the second front end chip 840 one to one or one to many. M1 may be greater than or equal to 2, and M2 may be greater than or equal to 1.

The first front end chip 830 and the second front end chip 840 are included in an RFFE 236. The electronic device may further include an IFIC or a CP. For example, the RFIC, the IFIC, and the CP may generate an RF signal of a high frequency band in cooperation with one another, and may deliver the RF signal to the first antenna array 851 of the antenna structure 850, or may receive an RF signal from the first antenna array 851 or the second antenna array 853 of the antenna structure 850 and process the RF signal.

Since a signal of a high frequency band of about 15 GHz to 100 GHz may be greatly attenuated even if the signal is propagated through a PCB wire, as well as through a free space, the RFIC 810 may receive a signal from the CP or may transmit a signal to the CP through a relatively low intermediate frequency (IF) band. The IF band may be, for example, about 7 to 13 GHz (for example, 11 GHz). The electronic device may convert the IF band signal into an RF signal of about 15 GHz to 100 GHz by using the PLL 811 and the mixer 813, or may convert an RF signal of about 15 GHz to 100 GHz into an IF signal.

The distributor/coupler 821 of the distribution-coupling circuit 820 may divide an RF signal generated in the RFIC 810, and may deliver the RF signal to the first front end chip 830. When there are M1 transmission-reception circuits, the distribution-coupling circuit 820 may divide the RF signal received from the RFIC 810 into M1 RF signals, and may deliver the RF signals to the M1 transmission-reception circuits of the first front end chip 830.

The distribution-coupling circuit 820 may couple an RF signal received by the distributor/coupler 821 through the first front end chip 830, and/or an RF signal received by the coupler 823 through the second front end chip 840, and may transmit the coupled RF signal to the RFIC 810. The number of RF signals delivered to the coupler 823 through the second front end chip 840 may be variable. When the second front end chip 840 includes M2 reception circuits, the distribution-coupling circuit 820 may combine M1 to M1+M2 RF signals, and may transmit the coupled RF signals to the RFIC 810.

The distribution-coupling circuit 820 includes the distributor/coupler 821 connected with the first front end chip 830, the coupler 823 connected with the second front end chip 840, and/or the switch 825 to connect the coupler 823 and the distributor/coupler 821. When transmitting an RF signal, the distribution-coupling circuit 820 may turn off the switch 825 to input the RF signal only to the distributor/coupler 821, and may distribute the RF signal for the plurality of transmission-reception circuits of the first front end chip 830. When receiving an RF signal, the distribution-coupling circuit 820 may turn on the switch 825 to couple a first RF signal in which RF signals received through the first front end chip 830 are combined in the distributor/coupler 821, and a second RF signal in which RF signals received through the second front end chip 840 are coupled in the coupler 823, and to input the coupled RF signals to the RFIC 810.

The first front end chip 830 includes a plurality of transmission-reception circuits. The plurality of transmission-reception circuits includes a first transmission-reception circuit RF_TRX_1, a second transmission-reception circuit RF_TRX_2 and up to an M1-th transmission-reception circuit RF_TRX_M1. The first transmission-reception circuit RF_TRX_1 may include the first PA 833, the first low noise amplifier 832, and/or the first phase shifter 831. The second transmission-reception circuit RF_TRX_2 may include the second PA 836, the second low noise amplifier 835, and/or the second phase shifter 834. The M1-th transmission-reception circuit RF_TRX_M1 may include the M1-th PA 839, the M1-th low noise amplifier 838, and/or the M1-th phase shifter 837.

The second front end chip 840 includes at least one reception circuit. The at least one reception circuit includes a first reception circuit RF_RX_1, a second reception circuit RF_RX_2, and up to an M2-th reception circuit RF_RX_M2. The first reception circuit RF_RX_1 may include the first low noise amplifier 841 and/or the first phase shifter 842. The second reception circuit RF_RX_2 may include the second low noise amplifier 843 and/or the second phase shifter 844. The M2-th reception circuit RF_RX_M2 may include the M2-th low noise amplifier 845 and/or the M2-th phase shifter 846.

The first transmission-reception circuit RF_TRX_1 may be connected with the first antenna element 851-1 included in the first antenna array 851 of the antenna structure to deliver an RF signal to the first antenna element 851-1 or to receive an RF signal from the first antenna element 851-1. The first reception circuit RF_RX_1 may be connected with the second antenna element 8531—included in the second antenna array 853 of the antenna structure 850 to receive an RF signal from the second antenna element 853-1.

The antenna structure 850 includes a plurality of antenna elements. As shown in FIG. 8, the antenna structure 850 includes M1+M2 antenna elements. The antenna element may be connected with a transmission-reception circuit of the first front end chip 830 or a reception circuit of the second front end chip 840. The first antenna elements 851-1, 851-2, ..., and 851-M1 which are connected with the first front end chip 830 from among the plurality of antenna elements included in the antenna structure 850 may form the first antenna array 851. The first antenna elements 851-1, 851-2, ..., and 851-M1 and the second antenna elements 853-1, 853-2, ..., and 853-M2, which are included in the antenna structure 850, may operate as one antenna array when receiving a second RF signal. The first antenna array 851 and the second antenna array 853 may form one array. Additionally or alternatively, when the second RF signal is received, the first antenna elements 851-1, 851-2, ..., and 851-M1 which are connected with the first front end chip 830 from among the plurality of antenna elements included in the antenna structure 850 may operate as one antenna array, and the second antenna elements 853-1, 853-2, ..., and 853-M2 connected with the second front end chip 840 may not operate as one antenna array and may operate as independent antennas, respectively. Additionally or alternatively, when the second RF signal is received, the first antenna elements 851-1, 851-2, ..., and 851-M1 which are connected with the first front end chip 830 from among the plurality of antenna elements included in the antenna structure 850 may operate as the first antenna array 851, and the second antenna elements 853-1, 853-2, ..., and 853-M2 connected with the second front end chip 840 may operate as the second antenna array 853 different from the first antenna array 851. Additionally or alternatively, when the second RF signal is received, the first antenna elements 851-1, 851-2, ..., and 851-M1 which are connected with the first front end chip 830 from among the plurality of antenna elements included in the antenna structure 850 may operate as one array antenna, along with some of the second antenna elements 853-1, 853-2, ..., and 853-M2 connected with the second front end chip 840, and the other antenna elements of the second antenna elements 853-1, 853-2, ..., and 853-M2 may not operate, may operate as independent antennas, or may operate as another antenna array.

The number of antenna elements and transmission circuits for transmitting RF signals when RF signals are transmitted, and the number of antenna elements and reception circuits for receiving RF signals when RF signals are received can vary, and accordingly, a size of the antenna module can be reduced by reducing the number of PAs included in transmission-reception circuits for transmitting and receiving RF signals.

The distribution-coupling circuit 820, the first front end chip 830, and the second front end chip 840 may be formed separately from the RFIC 810. The distribution-coupling circuit 820, the first front end chip 830, and the second front end chip 840 may be included in an RFFE. Additionally or alternatively, the distribution-coupling circuit 820, the first front end chip 830, and the second front end chip 840 may be included in the RFIC 810. Additionally or alternatively, the first front end chip 830 and the second front end chip 840 may be included in the RFFE, and the distribution-coupling circuit 820 may be included in the RFIC 810. Additionally or alternatively, the second front end chip 840 and the distribution-coupling circuit 820 may be included in the RFIC 810.

Figure 9:
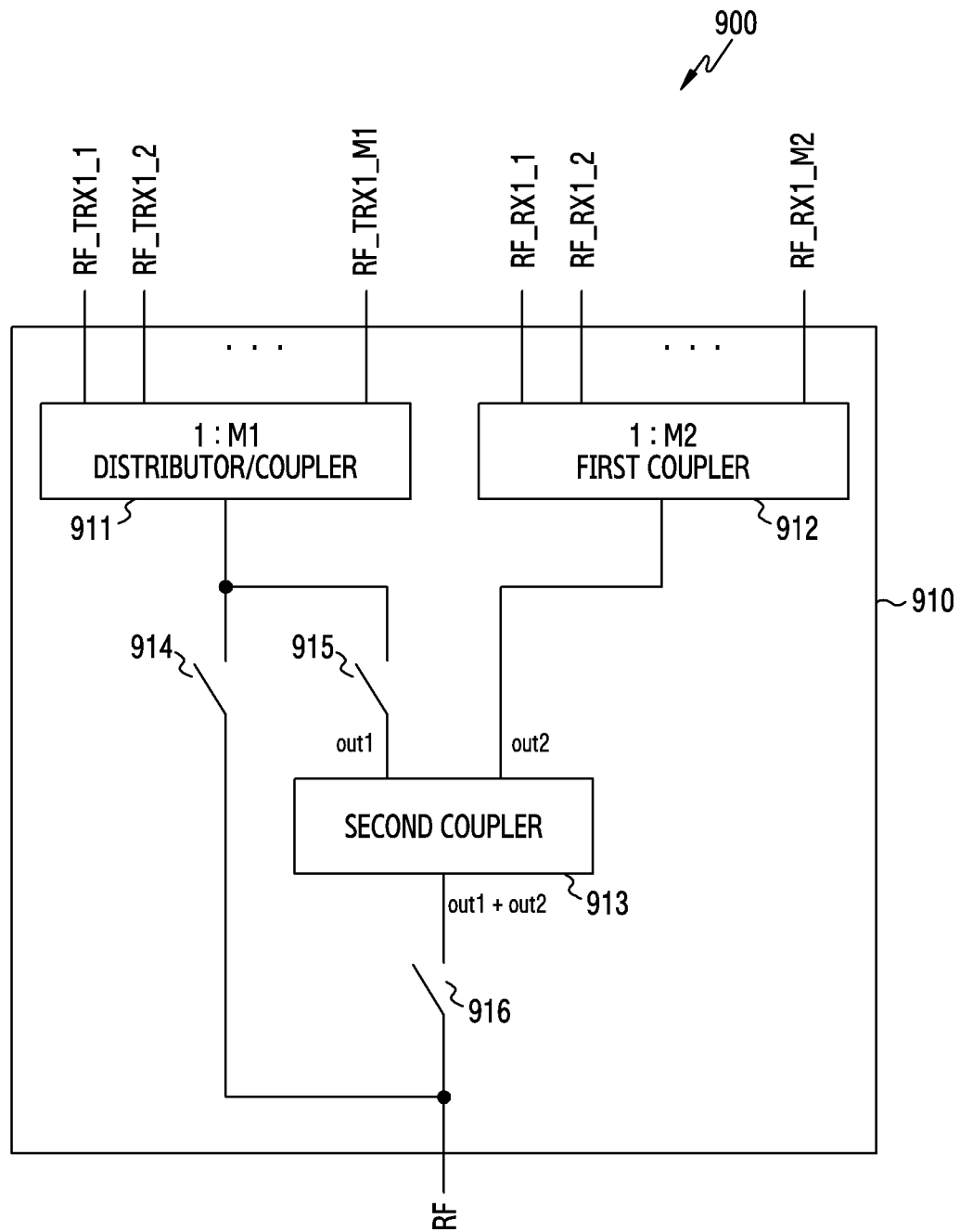
FIG. 9 is a view illustrating an example of a distribution-coupling circuit, according to an embodiment.

FIG. 9 is a view 900 illustrating an example of the distribution-coupling circuit 820, according to an embodiment.

Referring to FIG. 9, the distribution-coupling circuit 820 includes a distributor/coupler 911, a first coupler 912, a second coupler 913, and/or switches 914, 915, and 916. The components (the second coupler 913 and the switches 914, 915, and 916) other than the distributor/coupler 911 and the first coupler 912 included in the distribution-coupling circuit 820 may form an RF signal delivery circuit to deliver an RF signal (an RF signal to be transmitted and a received RF signal) between the distributor/coupler 911 and/or the first coupler 912 and the RFIC 810.

The distributor/coupler 911 may be connected with the first front end chip 830 in FIG. 8, and the first coupler 912 may be connected with the second front end chip 840 in FIG. 8. The second coupler 913 may receive, as an input, a first reception signal which is an output out1 of the distributor/coupler 911, and a second reception signal which is an output out2 of the first coupler 912, and may output a reception signal which is a combination (out1+out2) of the first reception signal and the second reception signal to the RFIC 810 in FIG. 8.

The first switch 914 may deliver a transmission signal inputted from the RFIC 810 of FIG. 8 to the distributor/coupler 911. The second switch 915 may deliver the first reception signal which is the output of the distributor/coupler 911 to the second coupler 913. The third switch 916 may deliver the output of the second coupler 913 to the RFIC 810 of FIG. 8. When an RF signal is received, the first switch 914 may be turned off and the second switch 915 and the third switch 916 may be turned on. When an RF signal is transmitted, the first switch 914 may be turned on and the second switch 915 and the third switch 916 may be turned off.

When an RF signal is transmitted, the first switch 914 may be turned on and the second switch 915 and the third switch 916 may be turned off, such that an RF transmission signal inputted from the RFIC 810 of FIG. 8 is connected to the distributor/coupler 911 through the first switch 914. The RF transmission signal transmitted to the distributor/coupler 911 may be divided into RF transmission signals the power of which has a value of 1/M1, and then may be outputted to the first transmission-reception circuit RF_TRX1_1 to M1-th transmission-reception circuit RF_TRX1_M1.

When an RF signal is received, the first switch 914 may be turned off and the second switch 915 and the third switch 916 may be turned on, such that M1 RF reception signals inputted from the first transmission-reception circuit RF_TRX1_1 to the M1-th transmission-reception circuit RF_TRX1_M1 becomes one input for the second coupler 913 through the distributor/coupler 911, and M2 RF reception signals inputted from the first reception circuit RF_RX1_1 to the M2-th reception circuit RF_RX1_M2 in FIG. 9 becomes another input for the second coupler 913 through the first coupler 912. One RF reception signal out1+out2 in which the output out1 of the distributor/coupler 911 and the output out2 of the first coupler 912 are coupled with each other by the second coupler 913 may be outputted to the RFIC 810 of FIG. 8.

Hereinafter, performance between a structure including a number N (N=M1+M2) of transmission-reception circuits, and a structure including M1 number of transmission-reception circuits and M2 number of reception circuits will be compared.

An effective isotropic radiated power (EIRP) when an RF signal is transmitted may be calculated as shown in Equation (1) presented below:

$$\text{EIRP} = P_{out} + 20 \log(N) + \text{ANT}_{Gain} \tag{1}$$

where $P_{out}$ is a power value of an RF transmission signal outputted from PAs 833, 836, and 839 of the first front end chip 830, and has substantially the same value with respect to all PAs used for transmission, N is the number of antenna elements used for the RF transmission signal, and $\text{ATN}_{Gain}$ is a gain of an antenna element.

When the number of antenna elements used for transmission in the structure is M1, when a power value of an RF signal outputted from the PAs 833, 836, and 839 is $P_{out}$, when the number of antenna elements in the comparison structure having only the transmission-reception circuits with a reception circuit is N (=M1+M2), and when a power value of an RF signal outputted from a PA is P, an EIRP ($\text{EIRP}_{old}$) in the comparison structure and an EIRP ($\text{EIRP}_{new}$) in the structure may be calculated as shown in Equations (2) and (3) presented below:

$$\text{EIRP}_{old} = P + 20 \log(N) + \text{ANT}_{Gain} \tag{2}$$

$$\text{EIRP}_{new} = P_{out} + 20 \log(M1) + \text{ANT}_{Gain} \tag{3}$$

In order to make the EIRP of the structure equal to the EIRP of the comparison structure, an RF transmission signal having a power as shown in Equation (4) presented below should be outputted from the PAs 833, 836, and 839 of the first front end chip 830:

$$P_{out} = P + 20 \log(N/M1) \tag{4}$$

If the number of transmission-reception circuits is reduced by half, compared to the comparison structure, the power of the RF transmission signal outputted from the PAs 833, 836, and 839 of the first front end chip 830 should increase by a predetermined value (for example, 5-7 dB, or about 6 dB), compared to the comparison structure, in order to maintain substantially the same EIRP.

An effective isotropic sensitivity (EIS) when an RF signal is received may be calculated as shown in Equation (5) presented below:

$$\text{EIS} = S/CH + 10 \log(N) + \text{ANT}_{Gain} \tag{5}$$

where S/CH is a sensitivity per channel, N is the number of antenna elements, and $\text{ATN}_{Gain}$ is a gain of an antenna element.

When an RF signal is received, the comparison structure and the structure may maintain substantially the same value since the structures have the same number of antenna elements.

It can be seen that, if a power of an RF signal outputted from a PA when an RF signal is transmitted is higher than that of the comparison structure by a predetermined value (for example, 5-7 dB, or about 6 dB), substantially the same performance is maintained from the EIRP/EIS aspect, based on the result of the above-described equations.

Figures 10A, 10B, 10C:
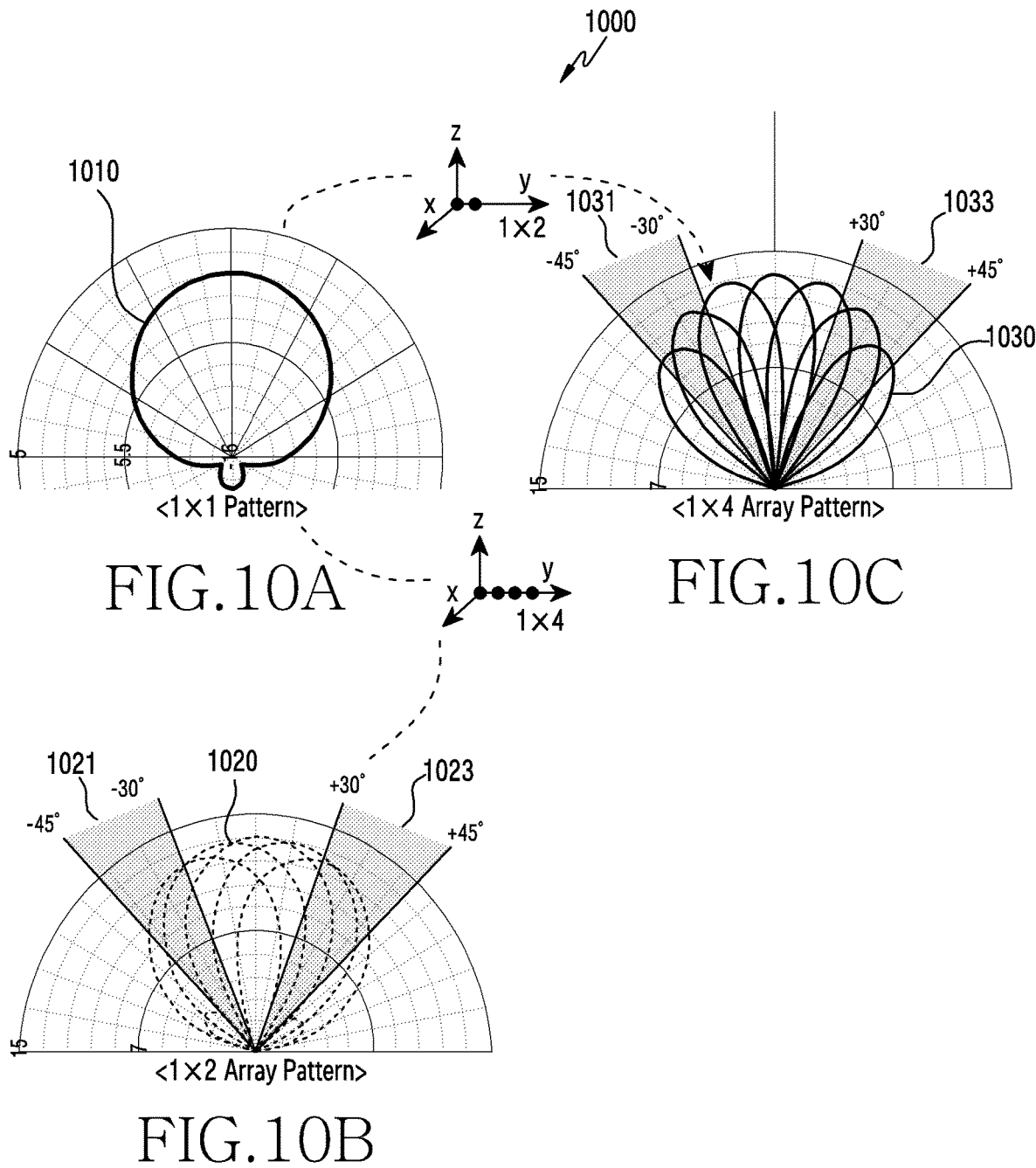
FIG. 10A is a view illustrating a beam pattern when the same coverage is serviced by one or more array antennas, according to an embodiment.
FIG. 10B is a view illustrating a beam pattern when the same coverage is serviced by one or more array antennas, according to an embodiment.
FIG. 10C is a view illustrating a beam pattern when the same coverage is serviced by one or more array antennas, according to an embodiment.

FIG. 10A is a view 1000 illustrating a beam pattern when the electronic device 101 operates with the same coverage by one or more array antennas according to an embodiment. FIG. 10B is a view 1000 illustrating a beam pattern when the electronic device 101 operates with the same coverage by one or more array antennas, according to an embodiment. FIG. 10C is a view 1000 illustrating a beam pattern when the electronic device 101 operates with the same coverage by one or more array antennas, according to an embodiment. FIG. 10A is a view illustrating a beam pattern generated by one antenna (1×1), FIG. 10B is a view illustrating a beam pattern generated by 1×2 array antennas, and FIG. 10C is a view illustrating a beam pattern generated by 1×4 array antennas.

Referring to FIGS. 10A, 10B, and 10C, when a single antenna is used (as in the case of FIG. 10A, where only one beam exists), a coverage 1010 generated by one beam may be wider than a coverage 1020 and 1030 generated by one beam when an array antenna including two or more antennas is used (as in the case of FIGS. 10B and 10C). The coverage 1020 generated by one beam when two antennas (1×2 array antennas) are used (as in the case of FIG. 10B) may be wider than the coverage 1030 generated by one beam when four antennas (1×4 array antennas) are used (as in the case of FIG. 10C).

The coverage 1020 of one beam generated by the 1×2 array antennas may be wider than the coverage 1030 of one beam generated by the 1×4 array antennas, but may have an adjustable angle reduced to about −30 degrees to about +30 degrees. Additionally or alternatively, the coverage 1030 of one beam generated by the 1×4 array antennas may be narrower than the coverage 1020 of one beam generated by the 1×2 array antennas, but may have an adjustable angle increase to about −45 degrees to about +45 degrees. Accordingly, the whole coverage region of the 1×2 array antennas may be substantially different from the whole coverage region of the 1×4 array antennas.

An angle range within which beam-steering is possible by the 1×2 array antennas, as shown in FIG. 10B, and an angle range within which beam steering is possible by the 1×4 array antennas, as shown in FIG. 10C may be compared.

Referring to FIGS. 10B and 10C, regions 1023 and 1033, in which the beam steering angle is from about +30 degrees to about +45 degrees, and regions 1021 and 1031, in which the beam steering angle is from about −30 degrees to about −45 degrees are shading angles that cannot be reached by the 1×2 array antennas, but may be angles that can be steered by the 1×4 array antennas. Accordingly, if the structure of the antenna module of FIG. 8 is used, there may be a difference between a beam book that is used for the 1×2 array configuration at a time of transmitting, and a beam book that is used for the 1×4 array configuration at a time of receiving, and accordingly, in order to implement optimized beam steering, separate beam books which are applied differently when an RF signal is transmitted and when an RF signal is received may be made as shown in Tables 1 and 2 presented below.

TABLE 1

| Transmission beam steering angle (Degrees) | Phase shifting according to antenna elements (Degrees) | |
|---|---|---|
| | Antenna element 1 | Antenna element 2 |
| 0 | 0 | 0 |
| 5 | 15.7 | 31.4 |
| 10 | 31.3 | 62.5 |
| 15 | 46.6 | 93.2 |
| 20 | 61.6 | 123.1 |
| 25 | 76.1 | 152.1 |
| 30 | 90.0 | 180.0 |
| 35 | 90.0 | 180.0 |
| 40 | 90.0 | 180.0 |
| 45 | 90.0 | 180.0 |

TABLE 2

| Reception beam steering angle (Degrees) | Phase shifting according to antenna elements (Degrees) | | | |
|---|---|---|---|---|
| | Antenna element 1 | Antenna element 2 | Antenna element 3 | Antenna element 4 |
| 0 | 0 | 0 | 0 | 0 |
| 5 | 15.7 | 31.4 | 47.1 | 62.8 |
| 10 | 31.3 | 62.5 | 93.8 | 125.0 |
| 15 | 46.6 | 93.2 | 139.8 | 186.3 |
| 20 | 61.6 | 123.1 | 184.7 | 246.3 |
| 25 | 76.1 | 152.1 | 228.2 | 304.3 |
| 30 | 90.0 | 180.0 | 270.0 | 360.0 |
| 35 | 103.2 | 206.5 | 309.7 | 413.0 |
| 40 | 115.7 | 231.4 | 347.1 | 462.8 |
| 45 | 127.3 | 254.6 | 381.8 | 509.1 |

Figure 11:
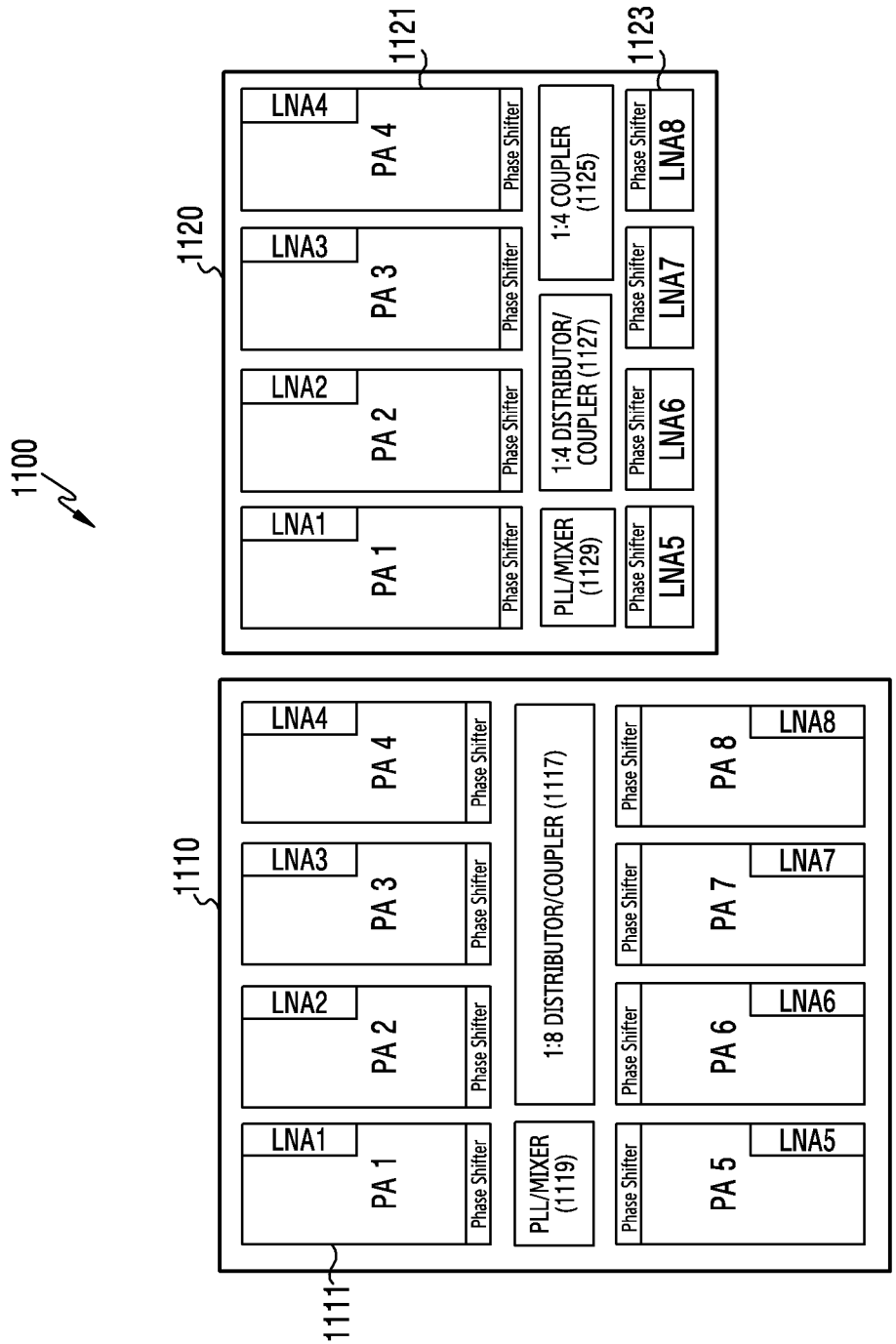
FIG. 11 is a view illustrating a comparison of physical regions of a first radio frequency front end (RFFE) module in which a PCB includes only a transmission-reception circuit, and a second RFFE module 1120 in which a PCB includes a transmission-reception circuit and a reception circuit, according to an embodiment.

FIG. 11 is a view 1100 illustrating comparison of physical regions of a first RFFE module 1110 including only transmission-reception circuits, and a second RFFE module 1120 including transmission-reception circuits and reception circuits, according to an embodiment.

Referring to FIG. 11, the first RFFE module 1110 includes eight (8) transmission-reception circuits 1111 including PAs, low noise amplifiers, and phase shifters, a PLL/mixer 1119 configured to convert an IF signal into an RF signal, and/or a1:8 distributor/coupler 1117 configured to distribute/couple the RF signal.

The second RFFE module 1120 includes four (4) transmission-reception circuits 1121 including PAs, low noise amplifiers, and phase shifters. In addition, the second RFFE module 1120 includes four (4) reception circuits 1123 including low noise amplifiers and phase shifters, a PLL/mixer 1129 configured to convert an IF signal into an RF signal, a1:4 distributor/coupler 1127 configured to distribute/couple the RF signal, and/or a1:4 coupler 1125 configured to couple a reception signal.

As shown in FIG. 11, it can be seen that the PAs occupy most of the space of the IC. It can be seen that the low noise amplifiers occupy relatively small spaces compared to the PAs. Accordingly, an area of the second RFFE module 1120 in which the number of PAs is reduced in comparison to the first RFFE module 1110, and the number of LNAs is maintained may be smaller than an area of the first RFFE module 1110. For example, the area of the second RFFE module 1120 may be reduced by about 30% to 50%, compared to the area of the first RFFE module 1110.

As shown in FIG. 11, a gain of the area may be obtained by reducing the number of transmission-reception circuits, but consequently, an EIRP may be degraded. To overcome this, an output power of a PA corresponding to each antenna element may increase by $(N/M1)^2$ times as indicated by Equation 4. The total power consumed by the PA included in the antenna module may increase by N/M1. In order to compensate for increase of power consumption, a front end structure using a compound semiconductor may be applied.

Figure 12:
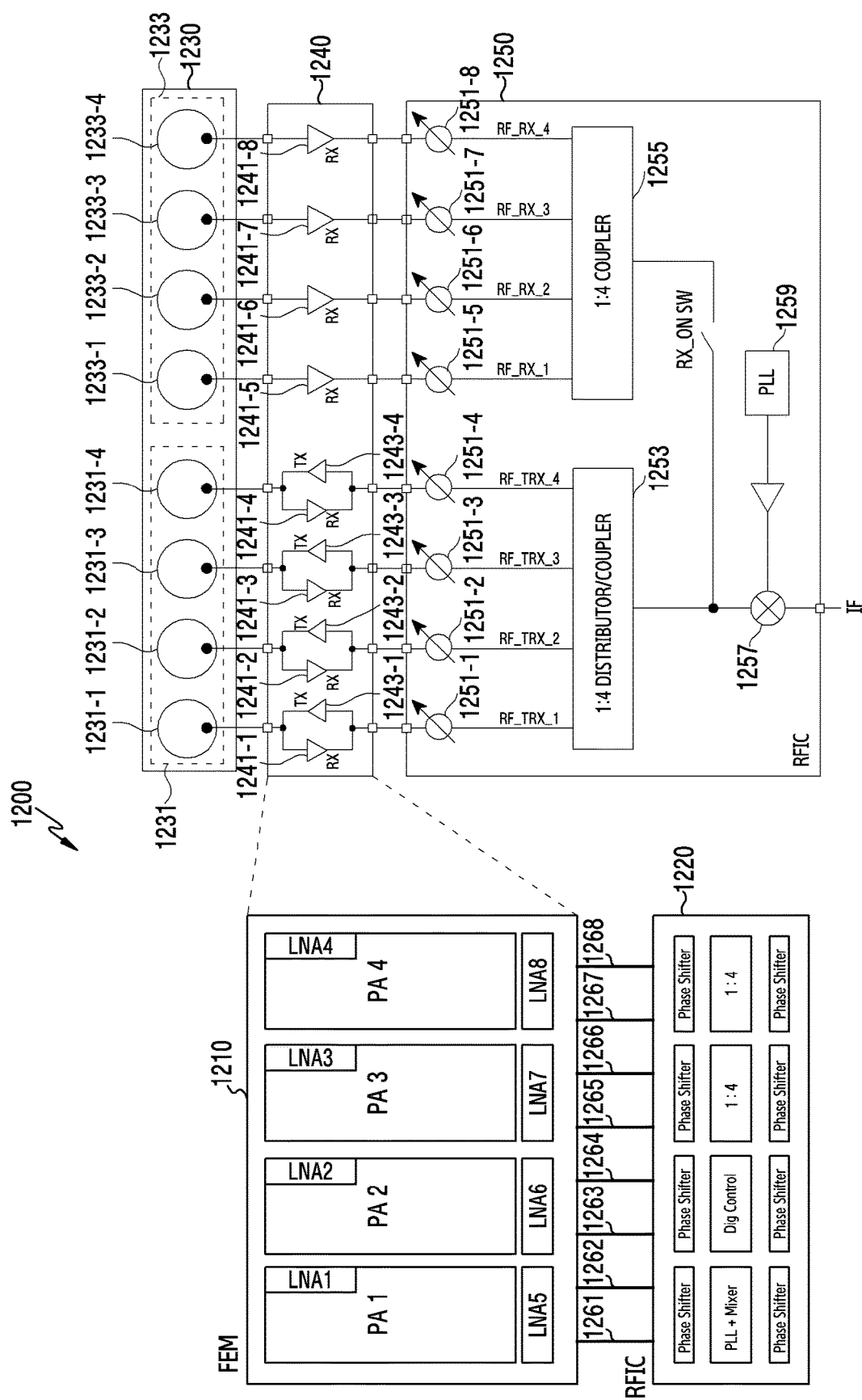
FIG. 12 is a view illustrating an implementation example of an antenna module, according to an embodiment.
Figure 13:
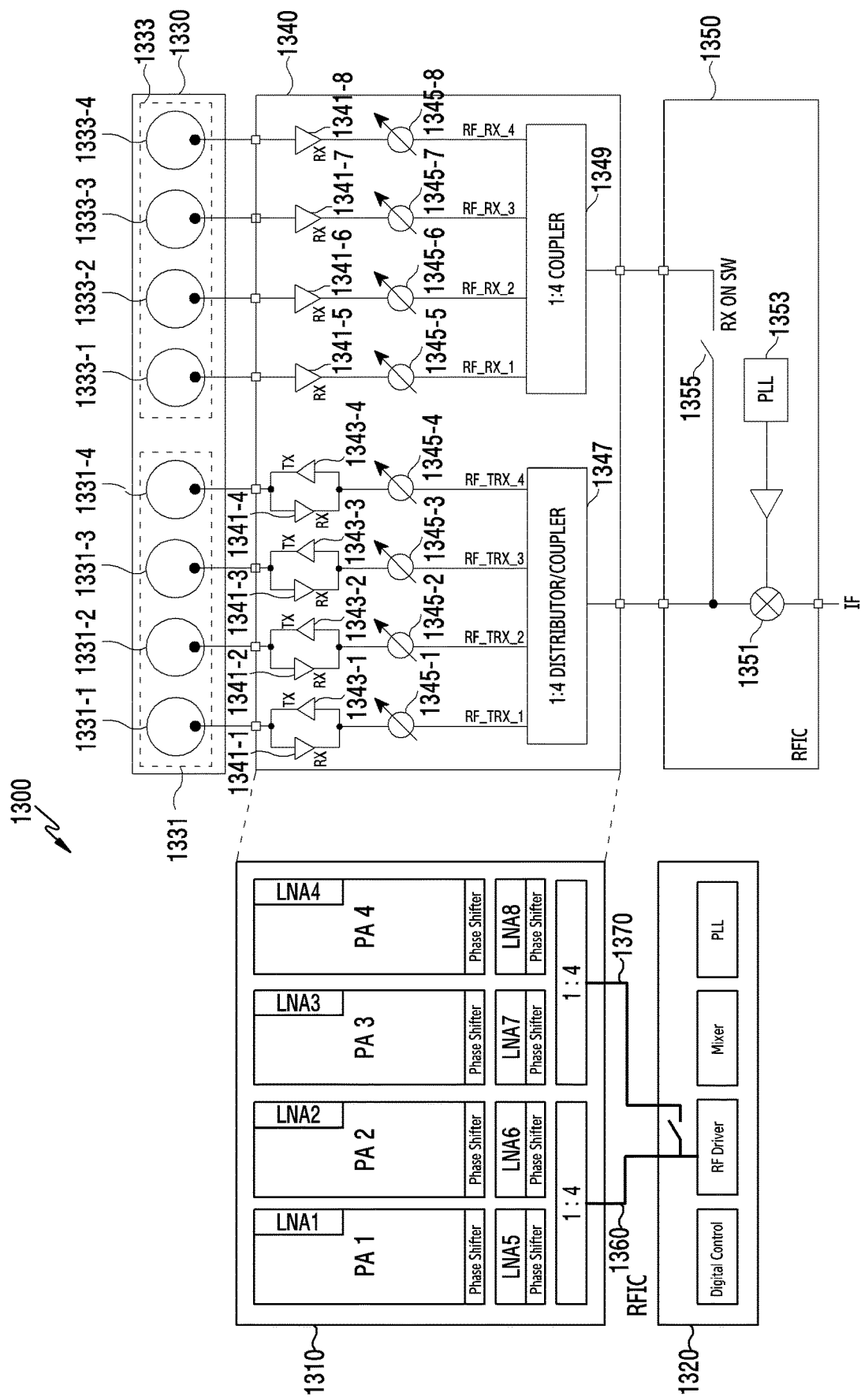
FIG. 13 is a view illustrating an implementation example of an antenna module, according to an embodiment.
Figure 14:
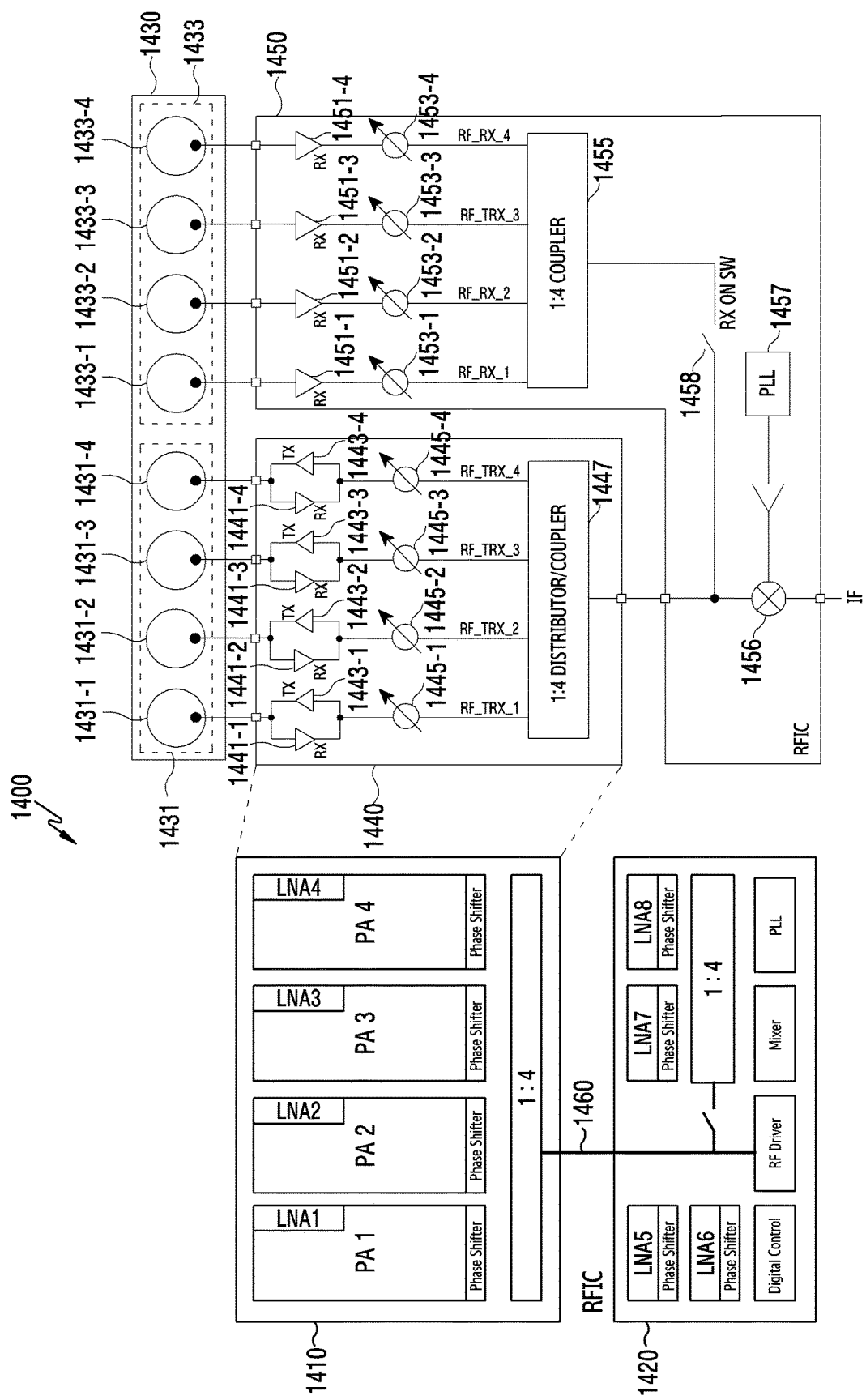
FIG. 14 is a view illustrating an implementation example of an antenna module, according to an embodiment.

FIG. 12 is a view 1200 illustrating an implementation example of an antenna module, according to an embodiment. FIG. 13 is a view 1300 illustrating an implementation example of an antenna module, according to an embodiment. FIG. 14 is a view 1400 illustrating an implementation example of an antenna module, according to an embodiment. The antenna module may include a front end IC 1210, or an RFIC 1220.

The front end IC 1210 may be produced as a compound (SiGe, GaAs or silicon-on-insulator (SOI)) semiconductor by a finite element method. The RFIC 1220 may be produced by a complementary metal-oxide semiconductor (CMOS) process. Since the RFIC 1220 is produced by the CMOS process, an RFFE may be made as a separate IC, for example, the front end IC 1210, if a PA is made by an organic compound process.

In FIGS. 12, 13, and 14, some components included in the antenna module may be included in the front end IC, and the other components included in the antenna module may be included in the RFIC 1220. In FIGS. 12, 13, and 14, it is assumed that eight (8) circuits are applied, but embodiments may be equally applied even when different numbers of circuits are applied. The front end IC may be a front end chip.

FIG. 12 illustrates an example in which the front end IC 1210 is formed to include some components 1240 of the components of the antenna module, and the RFIC 1220 is formed to include the other components 1250 of the antenna module.

Referring to FIG. 12, the antenna module includes an antenna structure 1230, a plurality of PAs 1243-1, 1243-2, 1243-3, and 1243-4, a plurality of low noise amplifiers 1241-1, 1241-2, 1241-3, 1241-4, 1241-4, 1241-5, 1241-6, 1241-7, and 1241-8, a plurality of phase shifters 1251-1, 1251-2, 1251-3, 1251-4, 1251-5, 1251-6, 1251-7, and 1251-8, a distributor/coupler 1253, a coupler 1255, a mixer 1257, a PLL 1259, or a switch RX ON SW. The antenna structure 1230 includes a first antenna array 1231 including a plurality of first antenna elements 1231-1, 1231-2, 1231-3, and 1231-4, and a second antenna array 1233 including a plurality of second antenna elements 1233-1, 1233-2, 1233-3, and 1233-4. The antenna module includes one or more second antenna elements 1233-1, 1233-2, 1233-3, and 1233-4. Although FIGS. 12, 13, and 14 illustrate four (4) first antenna elements and four (4) second antenna elements included in the antenna module, this should not be considered as limiting. For example, the antenna module may include at least one first antenna element and/or at least one second antenna element.

Some components 1240 included in the front end IC 1210 includes the plurality of low noise amplifiers 1241-1, 1241-2, 1241-3, 1241-4, 1241-5, 1241-6, 1241-7, and 1241-8, or the plurality of PAs 1243-1, 1243-2, 1243-3, and 1243-4.

The other components 1250 included in the RFIC 1220 may include the plurality of phase shifters 1251-1, 1251-2, 1251-3, 1251-4, 1251-5, 1251-6, 1251-7, and 1251-8, the distributor/coupler 1253, the coupler 1255, the mixer 1257, the PLL 1259, or the switch RX ON SW.

The front end IC 1210 and the RFIC 1220 may be connected with each other by conducting wires 1261, 1262, 1263, 1264, 1265, 1266, 1267, and 1268 for transmitting signals. For example, each of the conducting wires 1261, 1262, 1263, 1264, 1265, 1266, 1267, and 1268 may connect one of the PAs 1243-1, 1243-2, 1243-3, and 1243-4 and the low noise amplifiers 1241-1, 1241-2, 1241-3, and 1241-4 or the low noise amplifiers 1241-5, 1241-6, 1241-7, and 1241-8 included in the front end IC 1210 to one of the phase shifters 1251-1 to 1251-8 included in the RFIC 1220.

FIG. 13 illustrates an example in which a front end IC 1310 is formed to include a first set of components 1340 of the antenna module, and an RFIC 1320 is formed to include a second set of components 1350 of the antenna module.

Referring to FIG. 13, the components of the antenna module include an antenna structure 1330, a plurality of PAs 1343-1, 1343-2, 1343-3, and 1343-4, a plurality of low noise amplifiers 1341-1, 1341-2, 1341-3, 1341-4, 1341-5, 1341-6, 1341-7, and 1341-8, a plurality of phase shifters 1345-1, 1345-2, 1345-3, 1345-4, 1345-5, 1345-6, 1345-7, and 1345-8, a distributor/coupler 1347, a coupler 1349, a mixer 1351, a PLL 1353, or a switch 1355. The antenna structure 1330 includes a first antenna array 1331 including a plurality of first antenna elements 1331-1, 1331-2, 1331-3, and 1331-4, and a second antenna array 1333 including a plurality of second antenna elements 1333-1, 1333-2, 1333-3, and 1333-4.

The first set of components 1340 included in the front end IC 1310 includes the plurality of PAs 1343-1, 1343-2, 1343-3, and 1343-4, the plurality of low noise amplifiers 1341-1, 1341-2, 1341-3, 1341-4, 1341-5, 1341-6, 1341-7, and 1341-8, the plurality of phase shifters 1345-1, 1345-2, 1345-3, 1345-4, 1345-5, 1345-6, 1345-7, and 1345-8, the distributor/coupler 1347, and the coupler 1349.

The second set of components 1350 included in the RFIC 1320 includes the mixer 1351, the PLL 1353, or the switch 1355.

The front end IC 1310 and the RFIC 1320 may be connected with each other by conducting wires 1360 and 1370 for transmitting signals. The distributor/coupler 1347 and the coupler 1349 included in the front end IC 1310 may be connected with the mixer 1351 included in the RFIC 1320 by the conducting wire 1360. In this case, an RF transmission signal generated by the mixer 1351 included in the RFIC 1320 may be delivered to the distributor/coupler 1347 included in the front end IC 1310 through the first conducting wire 1360, and RF reception signals outputted by the distributor/coupler 1347 and the coupler 1349 of the front end IC 1310, respectively, may be inputted to the mixer 1351 included in the RFIC 1320 through the first conducting wire 1360 and the second conducting wire 1370.

FIG. 14 illustrates an example in which a front end IC 1410 is formed to include some components 1440 of the components of the antenna module, and an RFIC 1420 is formed to include the other components 1450 of the antenna module.

Referring to FIG. 14, the components of the antenna module include an antenna structure 1430, a plurality of PAs 1443-1, 1443-2, 1443-3, and 1443-4, a plurality of low noise amplifiers 1441-1, 1441-2, 1441-3, 1441-4, 1441-5, 1441-6, 1441-7, and 1441-8, a plurality of phase shifters 1445-1, 1445-2, 1445-3, 1445-4, 1445-5, 1445-6, 1445-7, and 1445-8, a distributor/coupler 1447, a coupler 1455, a mixer 1456, a PLL 1457, or a switch 1458. The antenna structure 1430 may include a first antenna array 1431 including a plurality of first antenna elements 1431-1, 1431-2, 1431-3, and 1431-4, and a second antenna array 1433 including a plurality of second antenna elements 1433-1, 1433-2, 1433-3, and 1433-4.

A first set of components 1440 included in the front end IC 1410 includes the plurality of PAs 1443-1, 1443-2, 1443-3, and 1443-4, the plurality of low noise amplifiers 1441-1, 1441-2, 1441-3, and 1441-4, the plurality of phase shifters 1445-1, 1445-2, 1445-3, and 1445-4, or the distributor/coupler 1447. The first set of components 1440 included in the front end IC 1410 include the plurality of PAs 1443-1, 1443-2, 1443-3, 1443-4, the plurality of low noise amplifiers 1441-1, 1441-2, 1441-3, and 1441-4, or the plurality of phase shifters 1445-1, 1445-2, 1445-3, and 1445-4, and the distributor/coupler 1447, which may be included in the RFIC 1420.

The second set of components 1450 included in the RFIC 1420 includes the plurality of low noise amplifiers 1451-1, 1451-2, 1451-3, and 1451-4, the plurality of phase shifters 1453-1, 1453-2, 1453-3, and 1453-4, the coupler 1455, the mixer 1456, the PLL 1457, or the switch 1458.

The front end IC 1410 and the RFIC 1420 may be connected with each other by a conducting wire 1460 for transmitting signals. For example, the distributor/coupler 1447 included in the front end IC 1410 may be connected with the mixer 1456 included in the RFIC 1420 by the conducting wire 1460. In this case, an RF transmission signal generated by the mixer 1456 included in the RFIC 1420 may be delivered to the distributor/coupler 1447 included in the front end IC 1410 through the conducting wire 1460. An RF reception signal outputted by the distributor/coupler 1447 included in the front end IC 1410 may be inputted to the mixer 1456 included in the RFIC 1420 through the conducting wire 1460.

Since there are differences among the respective embodiments of FIGS. 12, 13, and 14 due to differences in the interface for connecting signals between the front end IC and the RFIC, a power consumption reduction effect, or a region reduction effect, an appropriate embodiment may be selected and used according to a condition of a system. In addition, the structure of dividing the front end into two ICs, the front end IC and the RFIC, is not limited to the embodiments illustrated in FIGS. 12, 13, and 14, and it is well known in the related art that other cases are possible.

A PA using a compound semiconductor as in the implementation examples of FIGS. 12, 13, and 14 can increase a maximum output power and can also increase power efficiency, compared to a PA using a CMOS process. Therefore, an increase of an output power of the PA required can be achieved by using a compound semiconductor process, while reducing the number of PAs. For example, when the PA is implemented by using a compound semiconductor, a maximum output power can increase by a predetermined value (for example, 5-7 dB or about 6 dB) and power efficiency can increase about 2-3 (for example, 2.8) times, compared to a PA produced by a CMOS process.

When a necessary space is reduced by reducing the number of transmission circuits, and output efficiency of the PA is enhanced as in the embodiments of FIGS. 12, 13, and 14, an effect of reducing power consumption can be achieved in comparison to a structure including only transmission-reception circuits. For example, when a necessary space is reduced by reducing the number of transmission circuits and output efficiency of the PA is enhanced, the whole power consumption can be reduced by about 20-40% (for example, 29%) in comparison to the structure including only the transmission-reception circuits.

By using the above-mentioned structure, power consumption can be reduced not only during transmission but also during reception. Power consumption can be adaptively changed by selectively enabling only some of the reception circuits (for example, the first reception circuit RF_RX1_1 of FIG. 8) according to an electric field condition (for example, an SNR).

Figure 15:
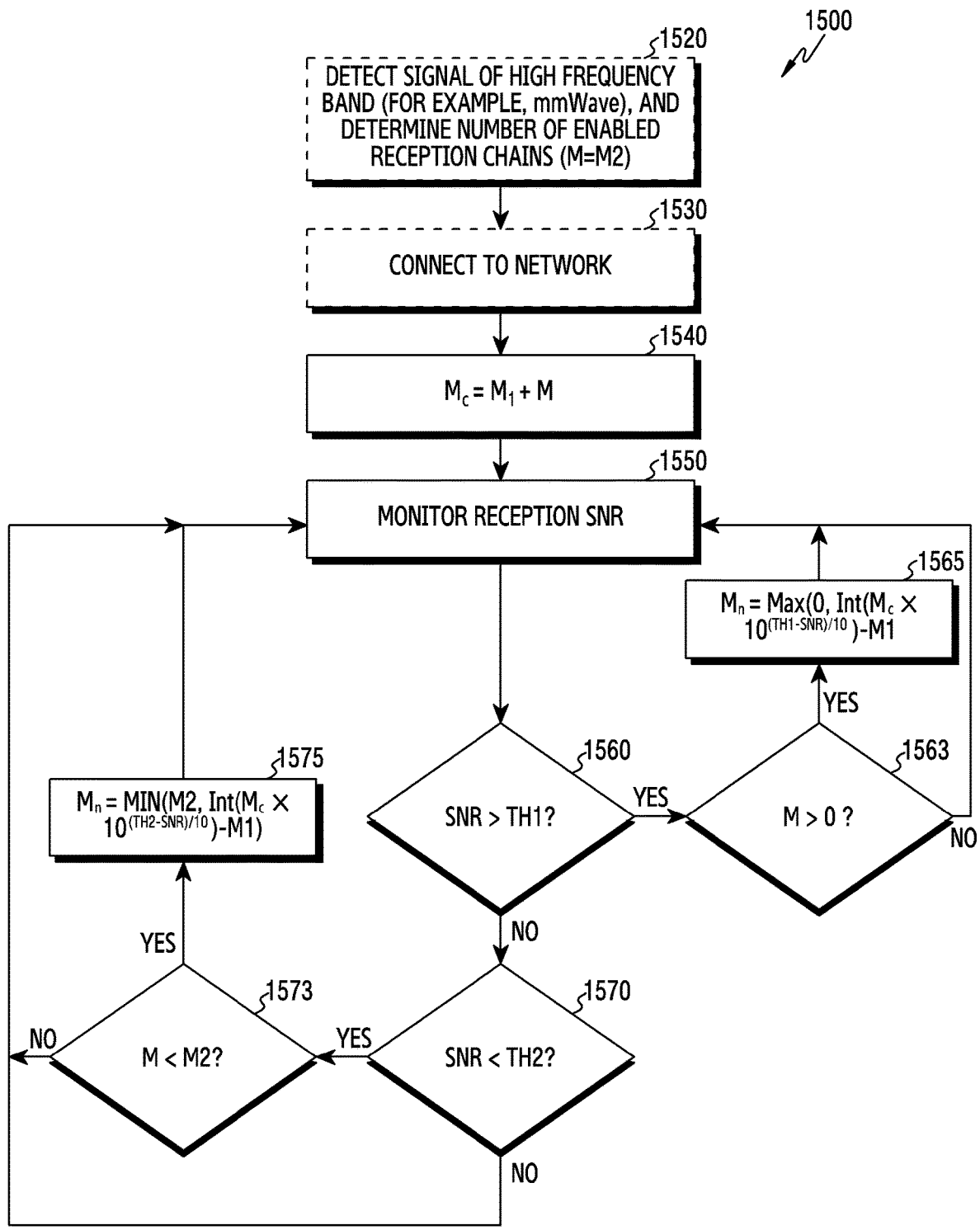
FIG. 15 is a flowchart illustrating an operation of determining, by the electronic device, the number of enabled circuits among reception circuits according to a reception signal-to-noise ratio (SNR), according to an embodiment.

FIG. 15 is a flowchart 1500 illustrating an operation of determining the number of enabled circuits from among reception circuits according to a reception SNR in an electronic device 101, according to an embodiment. An operating entity of the flowchart illustrated in FIG. 15 may be understood as an electronic device 101 or a processor of the electronic device.

In step 1520, the electronic device 101 sets the number of enabled reception circuits M (for example the first reception circuit RF_RX1_1 of FIG. 8) to the number of reception circuits M2 included in a front end IC. In a process in which the electronic device 101 detects a downlink (DL) signal radiated from a base station, which uses a high frequency band (for example, mmWave), after power of the electronic device 101 is turned on, and registers at the base station, it is important to reduce time. Therefore, in this process, it may not be appropriate to selectively apply the number of reception circuits. For example, the electronic device 101 may operate to connect to the base station rapidly by utilizing a maximum number of reception circuits supported by the electronic device 101.

In step 1530, the electronic device 101 connects to a network by establishing an RRC connection and completing registration. In step 1540, the electronic device 101 acquires the number of currently enabled reception circuits $M_c$ by adding the number of transmission-reception circuits $M_1$ and the number of enabled reception circuits M (for example, the first reception circuit RF_RX1_1 of FIG. 8) ($M_c = M_1 + M$).

In step 1550, the electronic device 101 monitors an SNR of a reception signal to select the number of enabled reception circuits based on an SNR value of the reception signal. For example, in a communication system using a high frequency band (for example, a mmWave band), applying the number of reception circuits according to the quality of a downlink reception signal may be effective.

The electronic device 101 may adjust the number of enabled reception circuits, such that an SNR of a signal received through the M number of enabled reception circuits in an RRC connection state, in which an RRC connection is established, falls between a first threshold value TH1 and a second threshold value TH2. To achieve this, the electronic device 101 determines whether the measured SNR is higher than the first threshold value in step 1560.

When the measured SNR is higher than the first threshold value (Yes in step 1560), the electronic device 101 determines that the number of enabled reception circuits can be reduced within a limit without influencing communication performance. In step 1563, the electronic device 101 determines whether there is an enabled reception circuit. For example, it may be determined whether the number of enabled reception circuits M is larger than 0. When there is no enabled reception circuit (No in step 1563) as a result of the determination in step 1563, the electronic device 101 resumes step 1550 to monitor the SNR of the reception signal again. When there is an enabled reception circuit as a result of the determination in step 1563 (Yes in step 1563), the electronic device 101 determines to reduce the number of enabled reception circuits in step 1565. The electronic device 101 may determine to reduce the number of enabled reception circuits, based on Equation (6) presented below:

$$M_n = \text{Max}(0, \text{Int}(M_c \times 10^{(TH1-SNR)/10}) - M1) \quad (6)$$

where TH1 is the first threshold value, SNR is a measured SNR value, $M_c$ is the number of currently enabled reception circuits, and $M_n$ is the number of enabled reception circuits that is newly determined. The electronic device 101 may disable as many reception circuits as $M_c$–$M_n$ through control. The reception circuit may be turned on/off (enabled/disabled).

When the measured SNR is lower than the first threshold value in step 1560 (No at step 1560), the electronic device 101 determines whether the measured SNR is lower than the second threshold value in step 1570.

When the measured SNR is higher than the second threshold value as a result of the determination in step 1570 (No in step 1570), the electronic device 101 resumes step 1550 to monitor the reception SNR again.

When the measured SNR is lower than the second threshold value as a result of determination in step 1570 (Yes in step 1570), the electronic device 101 determines whether the number of enabled reception circuits M is smaller than the maximum number of reception circuits M2 owned by the electronic device 101 in step 1573.

When the number of enabled reception circuits is greater than or equal to the maximum number of reception circuits owned by the electronic device 101 as a result of the determination in step 1573 (No in step 1573), there is no reception circuit to be enabled and thus the electronic device 101 proceeds to step 1550 to monitor the reception SNR again.

When the number of enabled reception circuits is smaller than the maximum number of reception circuits owned by the electronic device 101 as a result of the determination in step 1573 (Yes in step 1573), the electronic device 101 determines the number of reception circuits to be enabled in step 1575. The electronic device 101 may determine the number of reception circuits to be enabled, based on Equation (7) presented below:

$$M_n = \mathrm{MIN}(M2, \mathrm{Int}(M_c \times 10^{(TH2-SNR)/10}) - M1) \qquad (7)$$

where TH2 is the second threshold value, SNR is a measured SNR value, $M_c$ is the number of currently enabled reception circuits, $M_n$ is the number of enabled reception circuit that is newly determined, and M2 is the maximum number of reception circuits. Referring to Equation 7, an upper limit value of the number of enabled reception circuits may be the total number of reception circuits included in the electronic device 101. The electronic device 101 may enable as many reception circuits as $M_n$–$M_c$.

The first threshold value and the second threshold value which are criteria for determining whether the number of enabled reception circuits is changed in the flowchart illustrated in FIG. 15 may vary according to a communication condition (for example, a modulation and coding scheme (MCS), a modulation waveform (for example, CP-OFDM or DFT-S-OFDM), or a bandwidth).

As described above, the structure according to an embodiment can reduce the size of the antenna module by reducing the number of PAs for transmission RF signals.

Step 1550 of monitoring the reception SNR is performed after step 1520 of setting the number of enabled reception circuits and a step 1530 of connecting to a network, but step 1550 may be performed regardless of whether or when steps 1520 and 1530 are performed.

Figure 16:
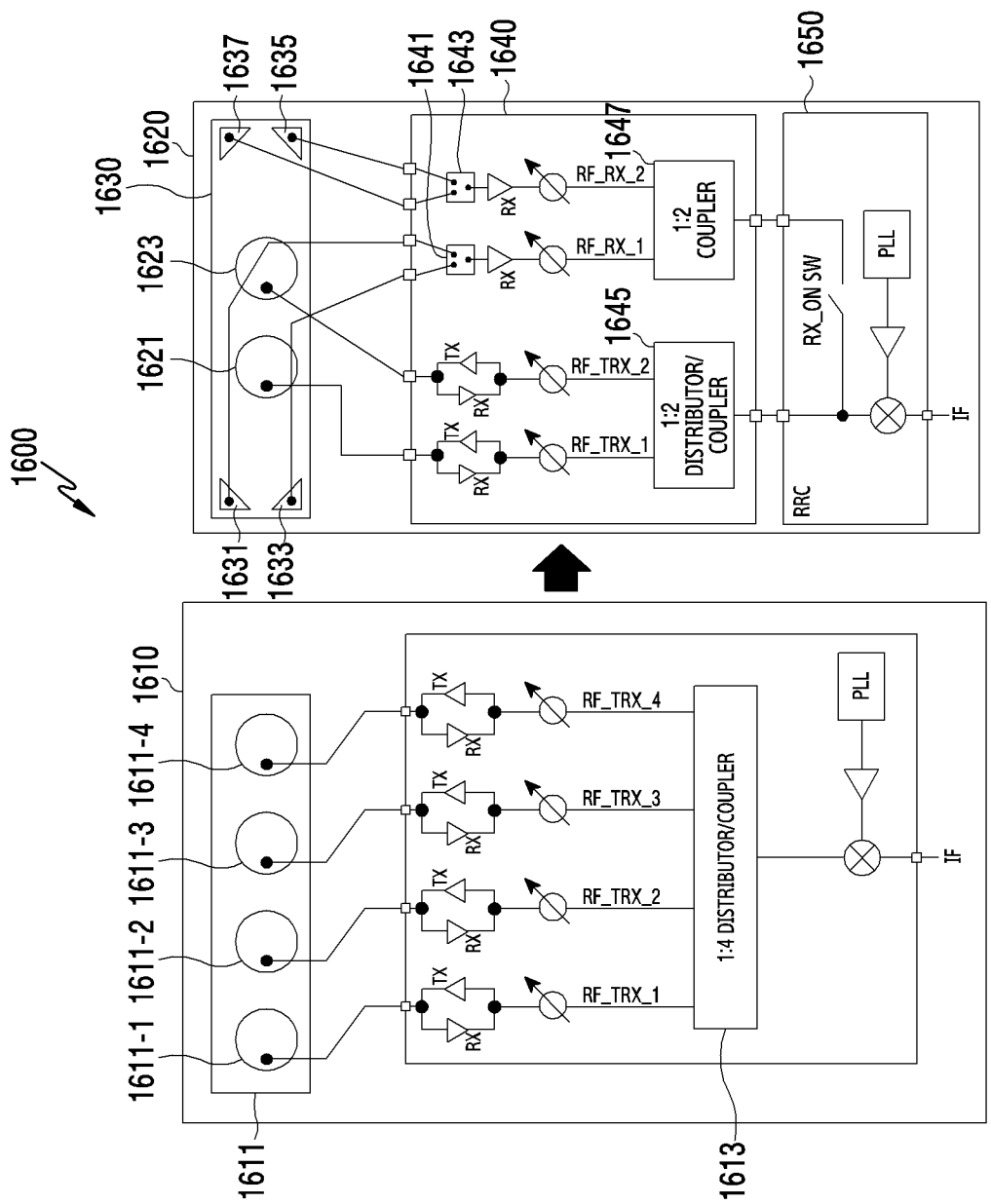
FIG. 16 is a view illustrating an example of an antenna array structure, according to an embodiment.

FIG. 16 is a view 1600 illustrating an example of an antenna array structure, according to an embodiment.

Antenna modules 1610 and 1620 may have antenna elements of array antennas arranged on one surface (for example, a front surface) of a PCB at regular intervals. The antenna modules 1610 and 1620 may have other components including PAs arranged on the other surface (for example, a back surface) of the PCB. Even when a space occupied by the PAs is reduced by reducing the number of the PAs, it may not be easy to reduce the size of the antenna modules if a space occupied by the antenna elements of the array antennas is not reduced.

Referring to FIG. 16, the antenna module 1610 including only transmission-reception circuits, illustrated on the left, has four (4) antenna elements 1611-1, 1611-2, 1611-3, and 1611-4 arranged on one surface of a PCB 1611 at regular intervals in order to implement 1×4 array antennas. When the four (4) antenna elements 1611-1, 1611-2, 1611-3, and 1611-4 are used as described above, a size of a front end chip 1210 or an RFIC 1220 can be reduced by reducing the number of PAs from 4 to 2.

In a PCB 1630 included in the antenna module 1620 illustrated on the right of FIG. 16, two (2) antenna elements 1621 and 1623 forming a 1×2 antenna array for transmitting and receiving, and four (4) auxiliary antenna elements 1631, 1633, 1635, and 1637 only for receiving are arranged. The two (2) antenna elements 1621 and 1623 are positioned on the center of the PCB 1630. The four (4) auxiliary antenna elements 1631, 1633, 1635, and 1637 are positioned on four corners of the PCB 1630. The four (4) auxiliary antenna elements 1631, 1633, 1635, and 1637 are positioned on four corners of the PCB 1630 having a rectangular shape. Since the auxiliary antenna elements 1631, 1633, 1635, and 1637 may have a relatively small size, compared to the antenna elements 1621 and 1623, the size of the antenna module, for example, the size of the PCB, may not be increased even if the number of antenna elements is reduced from 4 to 2 and the four (4) auxiliary antenna elements are added.

The antenna module 1620 shown on the right includes switches 1641 and 1643 to connect the four (4) auxiliary antenna elements 1631, 1633, 1635, and 1637 to a first reception circuit RF_RX_1 or a second reception circuit RF_RX_2. The antenna module 1620 may include N (for example, 2 or 4) number of auxiliary antenna elements and N number of reception circuits connected with the N number of auxiliary antenna elements, and may not include a switch (for example, the switches 1641 or 1643).

Referring to FIG. 16, the antenna module 1620 can maintain substantially the same EIRP performance as the antenna module 1610 of the 1×4 array antenna structure, by reducing the configuration of the array antenna, which is a main factor for guaranteeing performance, to 1×2, and increasing an output of the PA (for example, 5-7 dB or about 6 dB). When the number of antenna elements included in the array antenna is reduced by half as described above, the EIS performance may be degraded by a predetermined numerical value (for example, about 3 dB or 2-4 dB). However, the antenna module 1620 can compensate for degradation of the EIS performance by placing the auxiliary antenna elements 1631, 1633, 1635, and 1637 for compensating for degradation of reception performance in empty spaces around the antenna elements 1621 and 1623.

Figure 17:
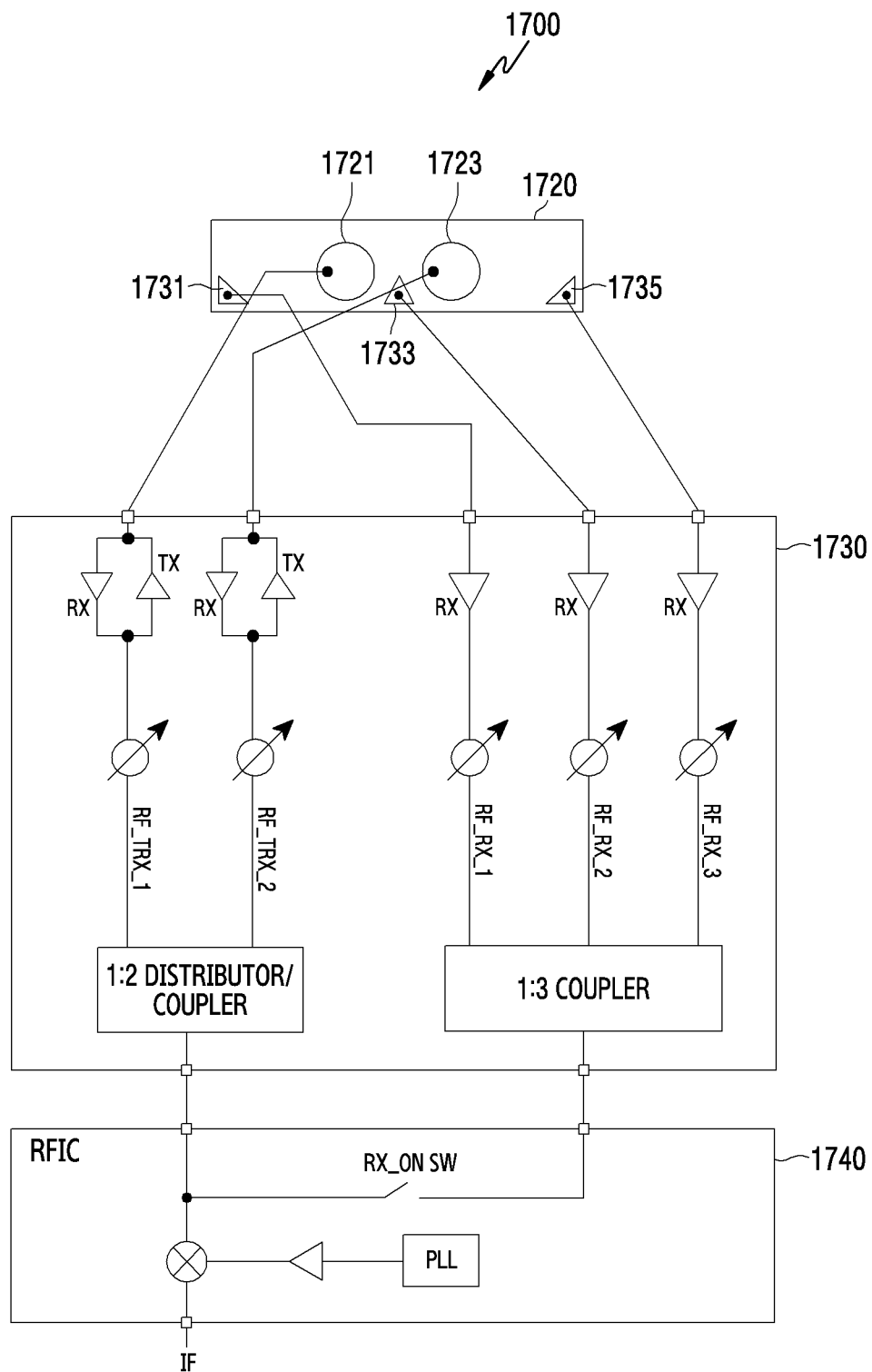
FIG. 17 is a view illustrating an arrangement shape of auxiliary antenna elements in an antenna module, according to an embodiment.
Figure 18:
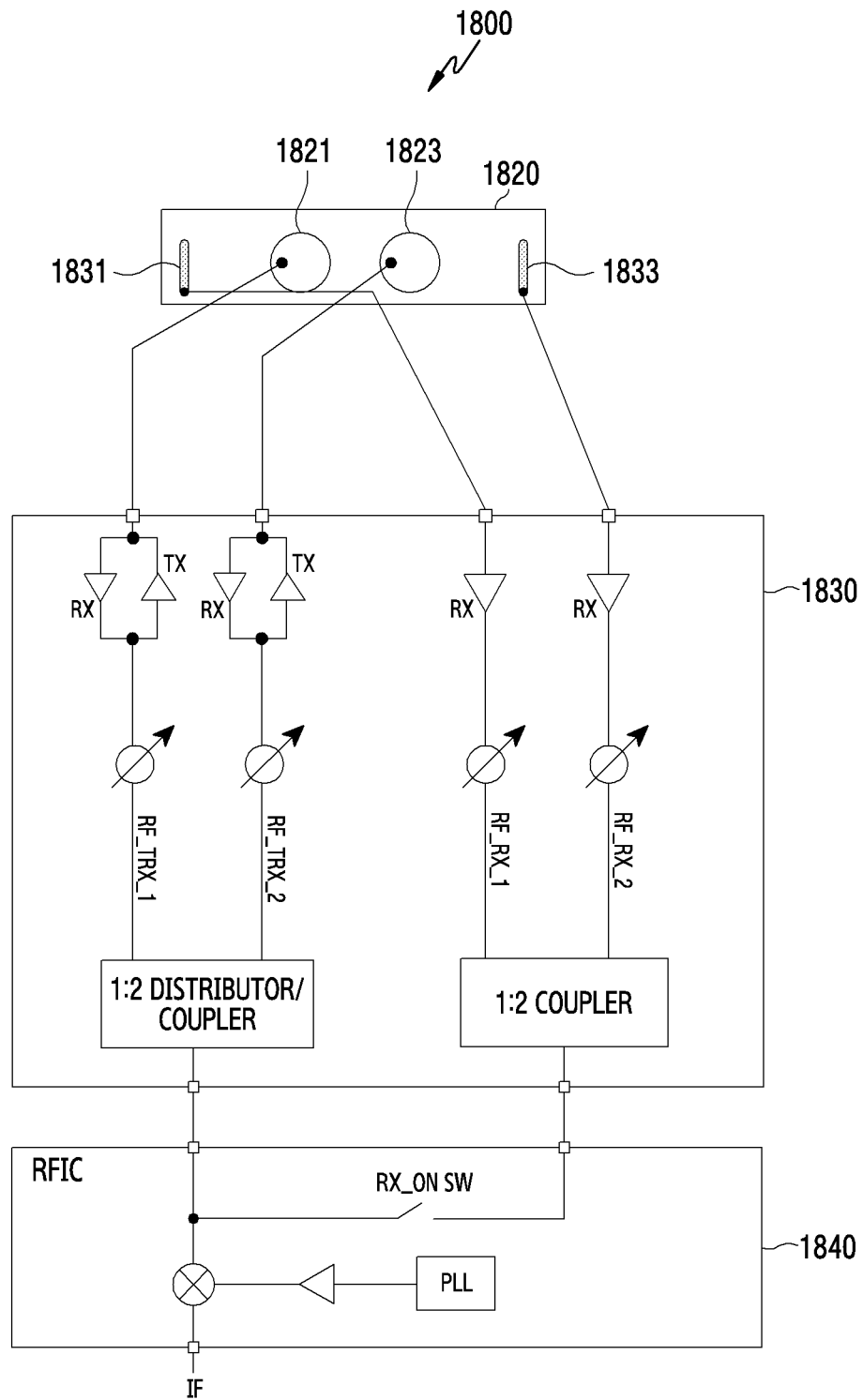
FIG. 18 is a view illustrating an arrangement shape of auxiliary antenna elements in an antenna module, according to an embodiment.
Figure 19:
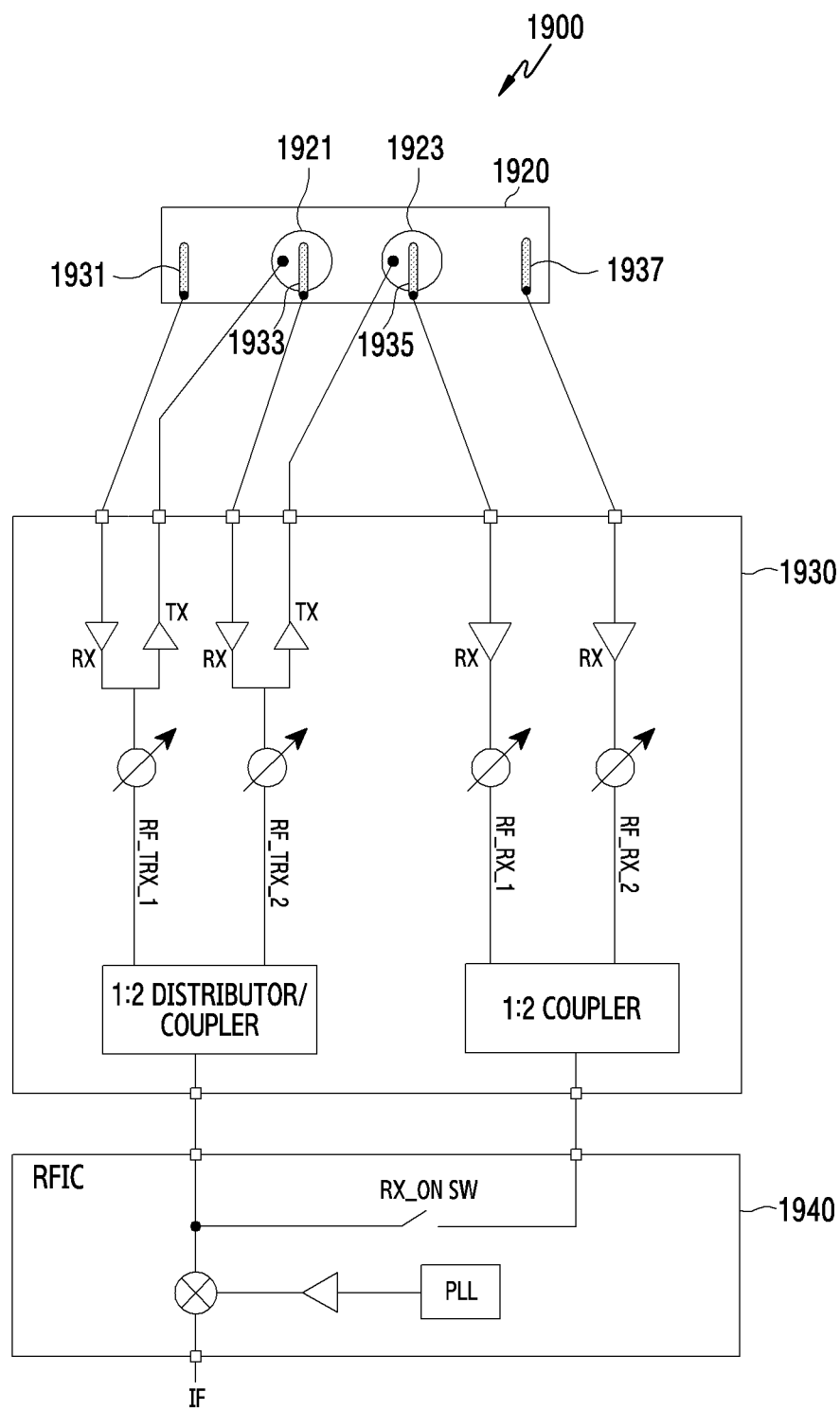
FIG. 19 is a view illustrating an arrangement shape of auxiliary antenna elements in an antenna module, according to an embodiment.

FIG. 17 is a view 1700 illustrating an example arrangement of auxiliary antenna elements in an antenna module, according to an embodiment. FIG. 18 is a view 1800 illustrating an example arrangement of auxiliary antenna elements in an antenna module, according to an embodiment. FIG. 19 is a view 1900 illustrating an example arrangement of auxiliary antenna elements in an antenna module, according to an embodiment.

Referring to FIG. 17, in a PCB 1720 included in an antenna module 1700, two (2) antenna elements 1721 and 1723 connected to transmission-reception circuits and forming 1×2 array antennas, or three auxiliary antenna elements 1731, 1733, and 1735 are positioned to be connected with reception circuits. The antenna module 1700 may transmit signals through the two (2) antenna elements 1721 and 1723 forming the 1×2 array antennas during transmission, and may receive signals through the two antenna elements 1721 and 1723 forming the 1×2 array antennas and at least some of the three auxiliary antenna elements 1731, 1733, and 1735 connected with the reception circuits during reception.

The two (2) antenna elements 1721 and 1723 corresponding to the 1×2 array antennas are positioned on the center of the PCB 1720. The three auxiliary antenna elements 1731, 1733, and 1735 are positioned in the PCB 1720 not to overlap the two (2) reference antenna elements 1721 and 1723. The three auxiliary antenna elements 1731, 1733, and 1735 are positioned on two corners on lower ends in the rectangular PCB 1720, and on a lower end of a space between the two (2) reference antenna elements 1721 and 1723.

Referring to FIG. 18, in a PCB 1820 included in an antenna module 1800, two (2) antenna elements 1821 and 1823 connected to transmission-reception circuits and forming 1×2 array antennas, or two (2) auxiliary antenna elements 1831 and 1833 connected with reception circuits may be positioned. The antenna module 1800 may transmit signals through the two antenna elements 1821 and 1823 during transmission, and may receive signals through the two antenna elements 1821 and 1823 and at least some of the two (2) auxiliary antenna elements 1831 and 1833 connected with the reception circuits during reception.

The two (2) auxiliary antenna elements 1831 and 1833 may be positioned on the left and right side surfaces of the two antenna elements 1821 and 1823 in the rectangular PCB 1820. The first auxiliary antenna element 1831 may be vertically positioned on the left side of the rectangular PCB 1820, and the second auxiliary antenna element 1833 may be vertically positioned on the right side of the rectangular PCB 1820.

Referring to FIG. 19, two (2) antenna elements 1921 and 1923 connected to transmission paths of transmission-reception circuits and forming a 1×2 antenna array, two (2) auxiliary antenna elements 1931 and 1933 connected with reception paths of the transmission-reception circuits, or two (2) auxiliary antenna elements 1935 and 1937 connected with reception circuits are positioned in a PCB 1920 included in an antenna module 1900. The antenna module 1900 may transmit signals through the two (2) antenna elements 1921 and 1923 during transmission, and may receive signals through the two (2) antenna elements 1921 and 1923 and at least some of the four (4) auxiliary antenna elements 1931, 1933, 1935, and 1937 during reception. The four (4) auxiliary antenna elements 1931, 1933, 1935, and 1937 may form one antenna array.

The two (2) antenna elements 1921 and 1923 are positioned on the center of the PCB 1920, and two (2) auxiliary antenna elements 1933 and 1935 out of the four (4) auxiliary antenna elements 1931, 1933, 1935, and 1937 are positioned in the PCB 1920 to overlap the two (2) antenna elements 1921 and 1923 at least in part. The other two (2) auxiliary antenna elements 1931 and 1937 out of the four (4) auxiliary antenna elements 1931, 1933, 1935, and 1937 are positioned on the left side and the right side of the rectangular PCB 1920 in the vertical direction.

FIGS. 16, 17, 18, and 19 described above illustrate various embodiments of using auxiliary antenna elements for receiving signals, but are not limited thereto. Various shapes and structures may be used. In addition, there is no limit to the number of antenna elements and/or the number of auxiliary antenna elements in various embodiments.

The structure may be effective in a dual band antenna module supporting two frequency bands.

Figure 20:
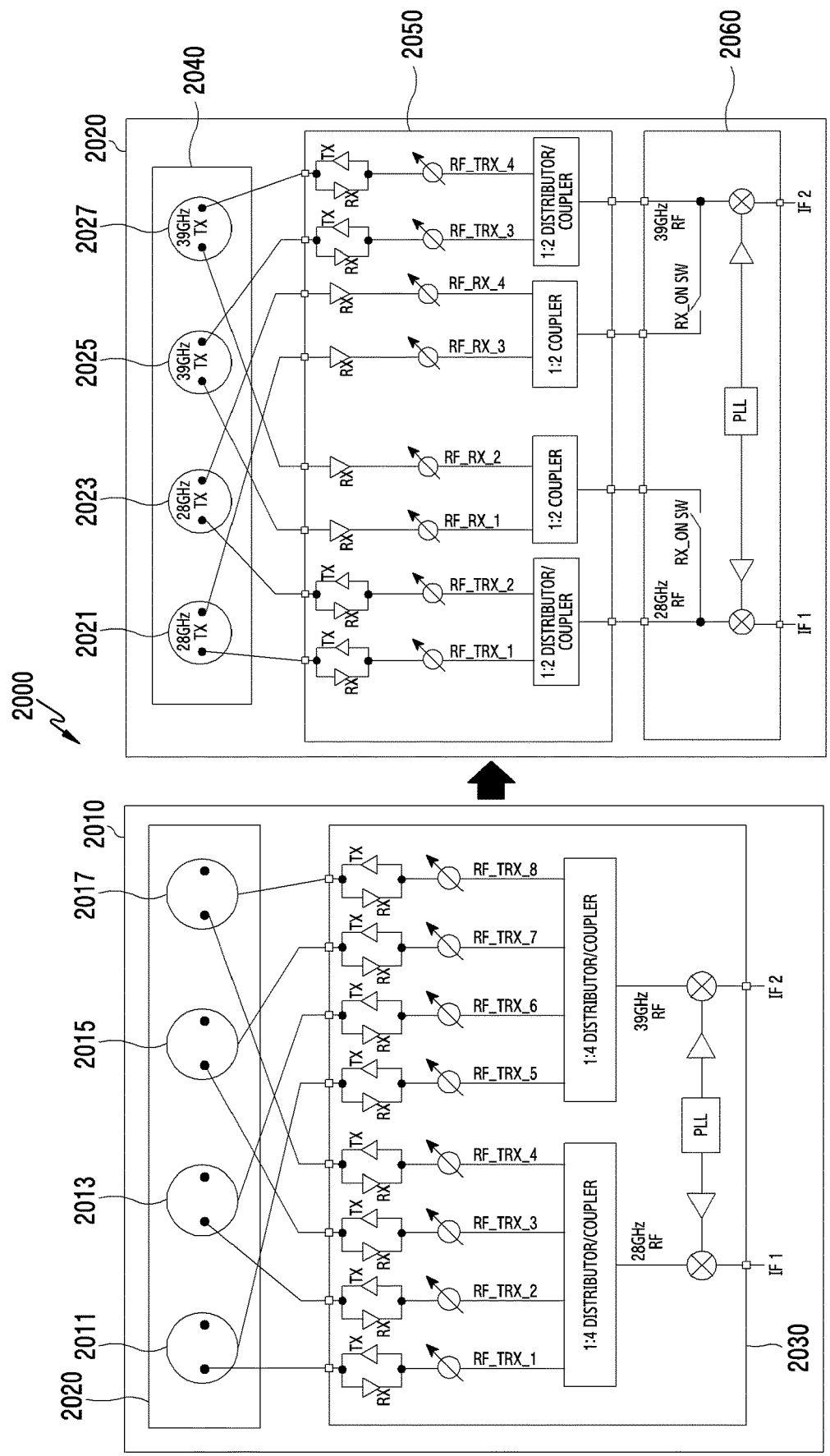
FIG. 20 is a view illustrating a configuration of a dual band antenna, according to an embodiment.

FIG. 20 is a view 2000 illustrating a dual band antenna configuration, according to an embodiment.

Referring to FIG. 20, an antenna module 2010 includes eight (8) PAs in total, including four (4) PAs with respect to each frequency band, to support a dual band of two frequency bands (for example, 28 GHz and 39 GHz) in a 1×4 array antenna structure. The antenna module 2010 may include eight (8) PAs in total and eight (8) low noise amplifiers in total, including four (4) PAs and four (4) low noise amplifiers for a first frequency band (for example, 25-31 GHz), and four (4) PAs and four (4) low noise amplifiers for a second frequency band (for example, 35-45 GHz). It may be difficult to mount the eight (8) PAs in the antenna module having a size for mounting four (4) array antenna elements 2011, 2013, 2015, and 2017.

An antenna module 2020 may use two (for example, antenna elements 2021 and 2023) of four antenna elements 2021, 2023, 2025, and 2027 as 1×2 array antennas for transmitting a first frequency band signal, and may use the other two antenna elements (for example, the antenna elements 2025 and 2027) as 1×2 array antennas for transmitting a second frequency band signal, and may include four PAs in total by using only two PAs with respect to each frequency band, and may increase an output power of each PA by a predetermined value (for example, 5-7 dB, about 6 dB), thereby supporting the dual band without substantially degrading EIRP performance.

The antenna module 2020 may connect the antenna elements 2021 and 2023 used for transmitting the first frequency band signal to a reception circuit of the second frequency band, and may connect the antenna elements 2025 and 2027 used for transmitting the second frequency band signal to a reception circuit for receiving the first frequency band signal, and may maintain four antenna elements when receiving signals, such that EIS performance can be maintained substantially the same as in an existing method. When different kinds of antenna structures according to the disclosure are used, four low noise amplifiers may be additionally added, but, since an area occupied by the low noise amplifiers is relatively small, the size of the antenna module may not be required to increase.

Figure 21:
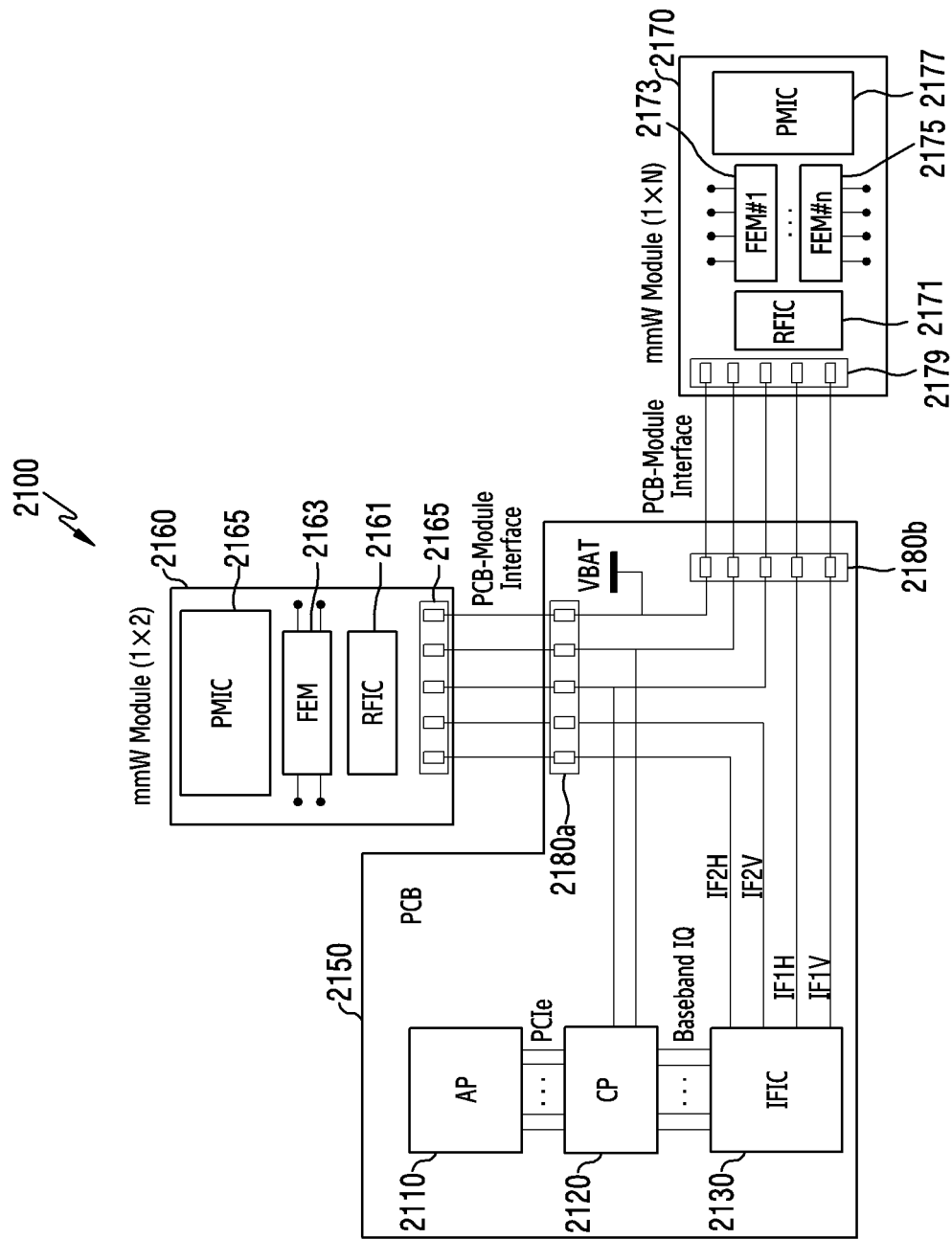
FIG. 21 is a view illustrating a circuit structure using an antenna module in which a radio frequency integrated circuit (RFIC) and a front-end module (FEM) are separated from each other, according to an embodiment.

FIG. 21 is a view illustrating a circuit structure using an antenna module in which an RFIC and an FEM are separated from each other, according to an embodiment.

Referring to FIG. 21, an electronic device 2100 includes an AP 2110, a communication processor 2120, an IFIC 2130, a first antenna module 2160, or a second antenna module 2170. The electronic device 2100 may include only one of the first antenna module 2160 or the second antenna module 2170.

The AP 2110, the communication processor 2120, the IFIC 2130 are positioned in a first PCB 2150. The first antenna module 2160 may include a second PCB, and the second antenna module 2170 may include a third PCB. The first antenna module 2160 and the second antenna module 2170 may share one PCB. The first PCB 2150 may be connected to another PCB through a PCB module interface.

An RFIC 2161 and an FEM 2163 may be separated from each other and may be positioned in the second PCB. The RFIC 2161 may be formed by a CMOS process. The FEM 2163 may be formed by a compound process. The first antenna module 2160 may include 1×2 array antennas (a plurality of antenna elements). The first antenna module 2160 may further include an interface 2165 for connecting a signal with the first PCB 2150. The interface 2165 may include, for example, an FPCB connector, a flat ribbon cable (FRC) connector, or an interposer.

A second RFIC 2171 and a plurality of FEMs (a first FEM 2173, . . . , and an n-th FEM 2175) may be separated from each other, and may be positioned in the third PCB. The RFIC 2171 may be formed by a CMOS process. The first FEM 2173 or the n-th FEM 2175 may be formed by a compound process. The second antenna module 2170 may include N number of antenna elements. The second antenna module 2170 may form a plurality of array antennas by using the N number of antenna elements. When the second antenna module 2170 forms two array antennas by using at least some of the N number of antenna elements, one antenna array may be electrically connected with the first FEM 2173, and the other array antenna may be electrically connected with the n-th FEM 2175. The second antenna module 2170 may further include an interface 2179 for connecting a signal with the first PCB 2150. The interface 2179 may include an FPCB connector, an FRC connector, or an interposer. The second antenna module 2170 may further include an additional FEM, in addition to the first FEM 2173 or the n-th FEM 2175. The FEMs 2163, 2173, or 2175 used in the antenna modules 2160, 2170 may have substantially the same structure.

The first FEM 2173 may form a transmission path and a first reception path, and may support both transmission and reception of wireless signals through the transmission path and the first reception path. The n-th FEM 2175 may form a second reception path, and may support reception of wireless signals through the second reception path.

According to an embodiment, an electronic device may include a processor positioned in a first PCB; a communication circuit; and an antenna module, the antenna module includes a second PCB; a first antenna and a second antenna which are positioned in the second PCB; a transmission-reception circuit positioned in the second PCB, the transmission-reception circuit including a PA for amplifying a signal to be transmitted through the first antenna, and a first low noise amplifier for amplifying a signal received through the first antenna, the PA forming a portion of a transmission path electrically connected with the communication circuit and the first antenna, the first low noise amplifier forming a portion of a first reception path electrically connected with the communication circuit and the first antenna, the transmission path or the first reception path in the transmission-reception circuit being selectively provided by the communication circuit; and a reception circuit positioned in the second PCB, the reception circuit not including a PA for amplifying a signal to be transmitted through the second antenna, and including a second low noise amplifier for amplifying a signal received through the second antenna, the second low noise amplifier forming a portion of a second reception path electrically connected with the communication circuit and the second antenna.

The electronic device may further include another transmission-reception circuit positioned in the second PCB; another reception circuit positioned in the second PCB; a first coupler electrically with the transmission-reception circuit and the other transmission-reception circuit; and a second coupler electrically connected with the reception circuit and the other reception circuit.

The electronic device may further include a first front end chip in which the transmission-reception circuit, the other transmission-reception circuit, and the first coupler are positioned; and a second front end chip in which the reception circuit, the other reception circuit, and the second coupler are positioned.

The electronic device may further include a front end chip in which the transmission-reception circuit, the other transmission-reception circuit, and the first coupler are positioned; and an RFIC in which the reception circuit, the other reception circuit, and the second coupler are positioned.

The electronic device may further include a first front end chip in which the transmission-reception circuit and the other transmission-reception circuit are positioned; a second front end chip in which the reception circuit and the other reception circuit are positioned; and an RFIC in which the first coupler and the second coupler are positioned.

The electronic device may further include an RFIC in which the transmission-reception circuit, the other transmission-reception circuit, the first coupler, the reception circuit, the other reception circuit, and the second coupler are positioned.

The electronic device may further include a third antenna and a fourth antenna which are positioned in the second PCB, the third antenna is electrically connected with the other transmission-reception circuit, the fourth antenna is electrically connected with the other reception circuit.

The first antenna and the third antenna are configured to operate as a first antenna array with respect to a wireless signal received by the communication circuit, and wherein the second antenna and the fourth antenna are configured to operate as a second antenna array with respect to the wireless signal.

The processor forms at least a portion of a communication processor, and the communication processor is configured to form a first beam by using the transmission-reception circuit, the other transmission-reception circuit, and the first antenna array; and form a second beam by using the reception circuit, the other reception circuit, and the second antenna array.

The communication processor is configured to perform an operation of forming the first beam such that the first beam faces a first surface of the portable communication device; and perform an operation of forming the second beam such that the second beam faces a second surface different from the first surface.

The first antenna is positioned to face a first surface of the portable communication device, the second antenna is positioned to face a second surface different from the first surface, and the transmission-reception circuit is positioned to face a third surface which is opposite to the first surface.

The reception circuit is positioned to face a fourth surface which is opposite to the second surface.

The second PCB includes a first rigid circuit board portion, a second rigid circuit board portion, and an FPCB connected between the first rigid circuit board portion and the second rigid circuit board portion, the first antenna and the transmission-reception circuit are positioned in the first rigid circuit board portion, and the second antenna and the reception circuit are positioned in the second rigid circuit board portion.

The first antenna and the second antenna are configured to operate as an antenna array with respect to a wireless signal received by the communication circuit.

The transmission-reception circuit includes a first semiconductor formed with a first material, and the reception circuit includes a second semiconductor formed with a second material different from the first material.

According to an embodiment, a portable communication device may include a processor in which a first PCB is positioned; an antenna module including a second PCB which has a first array antenna and a second array antenna positioned on a first surface thereof, and has a transmission-reception circuit and a reception circuit positioned on a second surface thereof, which is different from the first surface; and a communication circuit configured to electrically connect the processor and the antenna module, the transmission-reception circuit positioned on a first path which electrically connects a plurality of first antenna elements forming the first array antenna. The communication circuit includes PAs configured to amplify signals to be transmitted through the plurality of first antenna elements; and first low noise amplifiers configured to amplify signals received through the plurality of first antenna elements, the reception path positioned on a second path which electrically connects a plurality of second antenna elements forming the second array antenna and the communication circuit, includes a second low noise amplifier configured to amplify signals received through the plurality of second antenna elements, the PAs and the first low noise amplifiers form a plurality of pairs, and the plurality of pairs are matched with the plurality of first antenna elements, and the second low noise amplifiers are matched with the plurality of second antenna elements.

The second PCB includes a first rigid circuit board portion, a second rigid circuit board portion, and a flexible circuit board portion connected between the first rigid circuit board portion and the second rigid circuit board portion, the first array antenna is positioned on one surface of the first rigid circuit board portion, and the transmission-reception circuit is positioned on the other surface of the first rigid circuit board portion, the second array antenna is positioned on one surface of the second rigid circuit board portion, and the reception circuit is positioned on the other surface of the second rigid circuit board portion. The first array antenna operates to form one beam of a transmission beam or a first reception beam through a beamforming operation, the second array antenna operates to form a second reception beam through a beamforming operation, and the first array antenna and the second array antenna operate to form the first reception beam and the second reception beam in different directions at the same time.

The antenna module further includes a coupler configured to couple reception signals amplified and outputted by the first low noise amplifiers, and reception signals amplified and outputted by the second low noise amplifiers, and to output as one reception signal; and a distributor configured to distribute signals to be transmitted through the plurality of first antenna elements to the PAs, and to output the signal, the coupler and the distributor are positioned in the second PCB included in the antenna module.

The antenna module further includes a distributor and coupler configured to distribute signals to be transmitted through the plurality of first antenna elements to the PAs, and to couple reception signals amplified and outputted by the first low noise amplifiers to a first reception signal; and a first coupler configured to couple reception signals amplified and outputted by the second low noise amplifiers to a second reception signal; and a second coupler configured to couple the first reception signal and the second reception signal, and to output a third reception signal.

According to an embodiment, an antenna module may include a PCB; a first antenna and a second antenna positioned in the PCB; a transmission-reception circuit positioned in the PCB, the transmission-reception circuit comprising a PA for amplifying a signal to be transmitted through the first antenna, and a first low noise amplifier for amplifying a signal received through the first antenna, the PA forming a portion of a transmission path electrically connected with a communication circuit and the first antenna, the first low noise amplifier forming a portion of a first reception path electrically connected with the communication circuit and the first antenna, the transmission path or the first reception path in the transmission-reception circuit being selectively provided by the communication circuit. The antenna module also may include a reception circuit positioned in the PCB, the reception circuit not including a PA for amplifying a signal to be transmitted through the second antenna, and including a second low noise amplifier for amplifying a signal received through the second antenna, the second low noise amplifier forming a portion of a second reception path electrically connected with the communication circuit and the second antenna.

According to various embodiments, the electronic device can increase a mounting space by reducing a size of an antenna module, and also can enhance heat dissipation performance by reducing power consumption.

While the present disclosure has been particularly shown and described with reference to certain embodiments thereof, it will be understood by those of ordinary skill in the art that various changes in form and details may be made therein without departing from the spirit and scope of the disclosure as defined by the appended claims and their equivalents.

What is claimed is:
1. A portable communication device comprising:
    a processor positioned in a first printed circuit board;
    a communication circuit; and
    an antenna module comprising:
        a second printed circuit board,
        a first antenna and a second antenna positioned in the second printed circuit board,
        a first transmission-reception circuit positioned in the second printed circuit board, the first transmission-reception circuit comprising a power amplifier for amplifying a first signal to be transmitted through the first antenna, and a first low noise amplifier for amplifying a second signal received through the first antenna, the power amplifier forming a portion of a transmission path electrically connected with the communication circuit and the first antenna, the first low noise amplifier forming a portion of a first reception path electrically connected with the communication circuit and the first antenna, and
        a first reception circuit positioned in the second printed circuit board, wherein the first reception circuit does not comprise a power amplifier for amplifying a signal to be transmitted through the second antenna, and comprises a second low noise amplifier for amplifying a third signal received through the second antenna, the second low noise amplifier forming a portion of a second reception path electrically connected with the communication circuit and the second antenna,
    wherein the processor is configured to:
        activate the transmission path and inactivate the first reception path and the second reception path in a first operation state of transmitting the amplified first signal through the first antenna, and
        activate the first reception path and the second reception path and inactivate the transmission path in a second operation state of receiving the amplified second signal and the amplified third signal.

2. The portable communication device of claim 1, further comprising:
- a second transmission-reception circuit positioned in the second printed circuit board;
- a second reception circuit positioned in the second printed circuit board;
- a first coupler electrically connected with the first transmission-reception circuit and the second transmission-reception circuit; and
- a second coupler electrically connected with the first reception circuit and the second reception circuit.

3. The portable communication device of claim 2, further comprising:
- a first front end chip in which the first transmission-reception circuit, the second transmission-reception circuit, and the first coupler are positioned; and
- a second front end chip in which the first reception circuit, the second reception circuit, and the second coupler are positioned.

4. The portable communication device of claim 2, further comprising:
- a front end chip in which the first transmission-reception circuit, the second transmission-reception circuit, and the first coupler are positioned; and
- a radio frequency integrated circuit (RFIC) in which the first reception circuit, the second reception circuit, and the second coupler are positioned.

5. The portable communication device of claim 2, further comprising:
- a first front end chip in which the first transmission-reception circuit and the second transmission-reception circuit are positioned;
- a second front end chip in which the first reception circuit and the second reception circuit are positioned; and
- an RFIC in which the first coupler and the second coupler are positioned.

6. The portable communication device of claim 2, further comprising a radio frequency integrated circuit (RFIC) in which the first transmission-reception circuit, the second transmission-reception circuit, the first coupler, the first reception circuit, the second reception circuit, and the second coupler are positioned.

7. The portable communication device of claim 2, further comprising a third antenna and a fourth antenna which are positioned in the second printed circuit board,
- wherein the third antenna is electrically connected with the second transmission-reception circuit, and
- wherein the fourth antenna is electrically connected with the second reception circuit.

8. The portable communication device of claim 7, wherein the first antenna and the third antenna are configured to operate as a first antenna array with respect to a wireless signal received by the communication circuit, and
- wherein the second antenna and the fourth antenna are configured to operate as a second antenna array with respect to the wireless signal.

9. The portable communication device of claim 8, wherein the processor forms at least a portion of a communication processor, and
- wherein the communication processor is configured to:
- form a first beam by using the first transmission-reception circuit, the second transmission-reception circuit, and the first antenna array; and
- form a second beam by using the first reception circuit, the second reception circuit, and the second antenna array.

10. The portable communication device of claim 9, wherein the communication processor is further configured to:
- perform an operation of forming the first beam such that the first beam faces a first surface of the portable communication device; and
- perform an operation of forming the second beam such that the second beam faces a second surface different from the first surface.

11. The portable communication device of claim 1, wherein the first antenna is positioned to face a first surface of the portable communication device,
- wherein the second antenna is positioned to face a second surface different from the first surface, and
- wherein the first transmission-reception circuit is positioned to face a third surface which is opposite to the first surface.

12. The portable communication device of claim 11, wherein the first reception circuit is positioned to face a fourth surface which is opposite to the second surface.

13. The portable communication device of claim 1, wherein the second printed circuit board comprises a first rigid circuit board portion, a second rigid circuit board portion, and a flexible circuit board portion connected between the first rigid circuit board portion and the second rigid circuit board portion,
- wherein the first antenna and the first transmission-reception circuit are positioned in the first rigid circuit board portion, and
- wherein the second antenna and the first reception circuit are positioned in the second rigid circuit board portion.

14. The portable communication device of claim 1, wherein the transmission path includes a first switch electrically connected to the processor, and the first reception path includes a second switch electrically connected to the processor,
- wherein the second reception path includes a third switch electrically connected to the processor, and
- wherein the processor is configured to:
- turn on the first switch to activate the transmission path, and turn off the second switch and the third switch to inactivate the first reception path and the second reception path in the first operation state, and
- turn on the second switch and the third switch to activate the first reception path and the second reception path, and turn off the first switch to inactivate the transmission path in the second operation state.

15. The portable communication device of claim 1, wherein the first transmission-reception circuit comprises a first semiconductor formed with a first material, and
- wherein the first reception circuit comprises a second semiconductor formed with a second material different from the first material.

16. A portable communication device comprising:
- a processor positioned in a first printed circuit board;
- an antenna module comprising a second printed circuit board which has a first array antenna and a second array antenna positioned on a first surface thereof, and a transmission-reception circuit and a reception circuit positioned on a second surface thereof, which is different from the first surface;
- a communication circuit configured to electrically connect the processor and the antenna module,
- wherein the transmission-reception circuit is positioned on a first path which electrically connects a plurality of first antenna elements forming the first array antenna, wherein the communication circuit comprises power amplifiers configured to amplify signals to be transmitted through the plurality of first antenna elements, and first low noise amplifiers configured to amplify signals received through the plurality of first antenna elements, wherein the reception circuit is positioned on a second path which electrically connects a plurality of second antenna elements forming the second array antenna, wherein the communication circuit further comprises second low noise amplifiers configured to amplify signals received through the plurality of second antenna elements, and wherein the power amplifiers and the first low noise amplifiers form a plurality of pairs, and the plurality of pairs are matched with the plurality of first antenna elements, and the second low noise amplifiers are matched with the plurality of second antenna elements; and a coupler configured to couple first reception signals amplified and outputted by the first low noise amplifiers, couple second reception signals amplified and outputted by the second low noise amplifiers, and output the first reception signals and the second reception signals as a single reception signal.

17. The portable communication device of claim 16, wherein the second printed circuit board comprises a first rigid circuit board portion, a second rigid circuit board portion, and a flexible circuit board portion connected between the first rigid circuit board portion and the second rigid circuit board portion, wherein the first array antenna is positioned on a first surface of the first rigid circuit board portion, and the transmission-reception circuit is positioned on a second surface of the first rigid circuit board portion, wherein the second array antenna is positioned on a first surface of the second rigid circuit board portion, and the reception circuit is positioned on a second surface of the second rigid circuit board portion, wherein the first array antenna operates to form a transmission beam or a first reception beam through a beamforming operation, wherein the second array antenna operates to form a second reception beam through a beamforming operation, and wherein the first array antenna and the second array antenna operate to form the first reception beam and the second reception beam in different directions at the same time.

18. The portable communication device of claim 16, wherein the antenna module further comprises:

a distributor configured to distribute signals to be transmitted through the plurality of first antenna elements to the power amplifiers, and to output the single reception signal, wherein the coupler and the distributor are positioned in the second printed circuit board included in the antenna module.

19. The portable communication device of claim 16, wherein the antenna module further comprises:

a distributor configured to distribute signals to be transmitted through the plurality of first antenna elements to the power amplifiers, wherein the coupler comprises:

a first coupler configured to couple reception signals amplified and outputted by the first low noise amplifiers as a first reception signal;

a second coupler configured to couple reception signals amplified and outputted by the second low noise amplifiers as a second reception signal; and a third coupler configured to couple the first reception signal and the second reception signal, and to output a third reception signal.

20. An antenna module comprising:

a printed circuit board;

a first antenna and a second antenna positioned in the printed circuit board;

a transmission-reception circuit positioned in the printed circuit board, the transmission-reception circuit comprising a power amplifier for amplifying a signal to be transmitted through the first antenna, and a first low noise amplifier for amplifying a signal received through the first antenna, the power amplifier forming a portion of a transmission path electrically connected with a communication circuit and the first antenna, the first low noise amplifier forming a portion of a first reception path electrically connected with the communication circuit and the first antenna, wherein the transmission path or the first reception path in the transmission-reception circuit is selectively provided by the communication circuit;

a reception circuit positioned in the printed circuit board, wherein the reception circuit does not comprise a power amplifier for amplifying a signal to be transmitted through the second antenna, and comprises a second low noise amplifier for amplifying a signal received through the second antenna, the second low noise amplifier forming a portion of a second reception path electrically connected with the communication circuit and the second antenna; and a coupler configured to couple first reception signals amplified and outputted by the first low noise amplifiers, couple second reception signals amplified and outputted by the second low noise amplifiers, and output the first reception signals and the second reception signals as a single reception signal.

* * * * *